US012700843B2

(12) United States Patent
Akhtar et al.

(10) Patent No.: US 12,700,843 B2
(45) Date of Patent: Aug. 4, 2026

(54) BALUN PHASE AND AMPLITUDE IMBALANCE CORRECTION

(71) Applicant: TEXAS INSTRUMENTS INCORPORATED, Dallas, TX (US)

(72) Inventors: Siraj Akhtar, Richardson, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 658 days.

(21) Appl. No.: 17/702,715

(22) Filed: Mar. 23, 2022

(65) Prior Publication Data

US 2023/0124600 A1     Apr. 20, 2023

Related U.S. Application Data

(60) Provisional application No. 63/257,481, filed on Oct. 19, 2021.

(51) Int. Cl.

| | |
|---|---|
| *H03H 7/42* | (2006.01) |
| *H01F 27/29* | (2006.01) |
| *H01P 5/10* | (2006.01) |
| *H03H 7/09* | (2006.01) |
| *H03H 7/18* | (2006.01) |
| *H05K 1/02* | (2006.01) |
| *H10W 44/20* | (2026.01) |
| *H03H 1/00* | (2006.01) |

(52) U.S. Cl.
CPC .............. *H03H 7/42* (2013.01); *H01F 27/29* (2013.01); *H01P 5/10* (2013.01); *H03H 7/09* (2013.01); *H03H 7/18* (2013.01); *H03H 7/185*

(2013.01); *H05K 1/0216* (2013.01); *H10W 44/20* (2026.01); *H03H 2001/0085* (2013.01)

(58) Field of Classification Search
CPC .... H03H 2001/0085; H03H 7/09; H03H 7/42; H03H 7/18; H03H 7/185
USPC .......................................... 333/175, 177, 185
See application file for complete search history.

(56) References Cited

U.S. PATENT DOCUMENTS

| | | | |
|---|---|---|---|
| 6,683,510 B1 * | 1/2004 | Padilla ...................... | H01P 5/10 |
| | | | 333/25 |
| 2012/0119845 A1 * | 5/2012 | Lu ........................... | H01F 21/12 |
| | | | 333/26 |

* cited by examiner

*Primary Examiner* — Rakesh B Patel
(74) *Attorney, Agent, or Firm* — Zhenhai Fu; Frank D. Cimino

(57) ABSTRACT

In one example, an apparatus comprises: a first metal layer including a first segment and a second segment, in which the first segment is electrically coupled to a single-ended signal terminal, the second segment has a disconnected end; a second metal layer including a third segment and a fourth segment, in which the third segment is magnetically coupled to the first segment, the fourth segment is magnetically coupled to the second segment, a first end of the third segment and a first end of the fourth segment are electrically coupled at a center tap, and a second end of the third segment and a second end of the fourth segment are electrically coupled to respective first and second signal terminals of a pair of differential signal terminals; and a phase adjustment device proximate the center tap and electrically coupled to a second voltage reference terminal.

28 Claims, 37 Drawing Sheets

BALUN PHASE AND AMPLITUDE IMBALANCE CORRECTION

CROSS-REFERENCE TO RELATED APPLICATION

This application claims priority to U.S. Provisional Patent Application No. 63/257,481 filed Oct. 19, 2021, which is hereby incorporated herein by reference.

BACKGROUND

A balun performs conversion between a single-ended signal and a pair of differential signals. Differential signals can have the same amplitude and a phase difference of 180 degrees between them. Differential signals can be helpful for common mode rejection and improving noise immunity. Due to various reasons, a balun can introduce amplitude imbalance and/or phase imbalance between the differential signals. The balun may also have a limited bandwidth. The amplitude imbalance and phase imbalance between the differential signals, as well as the limited bandwidth of balun, can affect the performance of the circuits that receive the single-ended or differential signals from the balun.

SUMMARY

An apparatus comprises a first metal layer, a second metal layer, a via, and a phase adjustment device. The first metal layer includes a first segment and a second segment, in which the first segment is electrically coupled to a single-ended signal terminal, the second segment has a disconnected end. The second metal layer includes a third segment and a fourth segment, in which the third segment is magnetically coupled to the first segment, the fourth segment is magnetically coupled to the second segment, a first end of the third segment and a first end of the fourth segment are electrically coupled at the center tap, and a second end of the third segment and a second end of the fourth segment are electrically coupled to respective first and second signal terminals of a pair of differential signal terminals. The via is at the center tap and electrically coupled between a first voltage reference terminal and the center tap. The phase adjustment device is proximate the center tap and extends along a first subsegment of the third segment or a second subsegment of the fourth segment, the phase adjustment device electrically coupled to a second voltage reference terminal.

An apparatus comprises a first metal layer, a second metal layer, a via, a first metal wire, a second metal wire, a first metal shield layer, and a second metal shield layer. The first metal layer includes a first segment and a second segment, the first segment electrically coupled to a single-ended signal terminal, the second segment having a disconnected end. The second metal layer including a third segment and a fourth segment, in which the first segment is magnetically coupled to the third segment, the second segment is magnetically coupled to the fourth segment, a first end of the third segment and a first end of the fourth segment are electrically coupled at a center tap. The via is at the center tap and electrically couple the first ends of the third and fourth segments to a first voltage reference terminal. The first metal wire is electrically coupled between a second end of the third segment and a first signal terminal of a pair of differential signal terminals. The second metal wire is electrically coupled between a second end of the fourth segment and a second signal terminal of the pair of differential signal terminals. The first metal shield layer is over the first metal wire, in which the first metal shield layer includes first metal teeth extending therefrom and having respective first widths, and the first metal shield layer is electrically coupled to the first voltage reference terminal or a second voltage reference terminal. The second metal shield layer is over the second metal wire, in which the second metal shield layer includes second metal teeth extending therefrom and having respective second widths, the second widths are smaller than the first widths, the second metal teeth are connected to respective ones of the first metal teeth to form bridges over the first and second metal wires, and the second metal shield layer is electrically coupled to the first voltage reference terminal or the second voltage reference terminal.

An apparatus comprises a first metal layer, a second metal layer, a third metal layer, and a via. The first metal layer includes a first segment and a second segment, the first segment electrically coupled to a single-ended signal terminal, the second segment having a disconnected end. The second metal layer includes a third segment and a fourth segment, in which the first segment is magnetically coupled to the third segment, the second segment is magnetically coupled to the fourth segment, a first end of the third segment and a first end of the fourth segment are electrically coupled at a center tap, and a second end of the third segment and a second end of the fourth segment are coupled to respective first and second signal terminals of a pair of differential signal terminals. The via is at the center tap and electrically couple the first ends of the third and fourth segments to a first voltage reference terminal. The third metal layer is below or over the first and second metal layers, in which the third metal layer is coupled to the first voltage reference terminal or a second voltage reference terminal, and the third metal layer includes: first metal strips that overlap partially with the third segment, the first metal strips having respective first widths; and second metal strips that overlap partially with the fourth segment, the second metal strips having respective second widths different from the first widths.

An apparatus comprises a first metal layer, a second metal layer, a third metal layer, and a via. The first metal layer includes a first segment and a second segment, the first segment electrically coupled to a single-ended signal terminal, the second segment having a disconnected end. The second metal layer includes a third segment and a fourth segment, in which the first segment is magnetically coupled to the third segment, the second segment is magnetically coupled to the fourth segment, a first end of the third segment and a first end of the fourth segment are coupled at a center tap, and a second end of the third segment and a second end of the fourth segment are electrically coupled to respective first and second signal terminals of a pair of differential signal terminals. The via is at the center tap and electrically coupled between a first voltage reference terminal and the center tap. The third metal layer is over or below the first and second metal layers, in which the third metal layer is electrically coupled to the first voltage reference terminal or a second voltage reference terminal, and the third metal layer includes: a first metal strip that overlaps: the via; the first end and a second end of the third segment; and the first end and a second end of the fourth segment; second metal strips extending from a first side of the first metal strip; and third metal strips extending from a second side of the first metal strip, the second side opposite the first side.

DETAILED DESCRIPTION

Figure 1A:
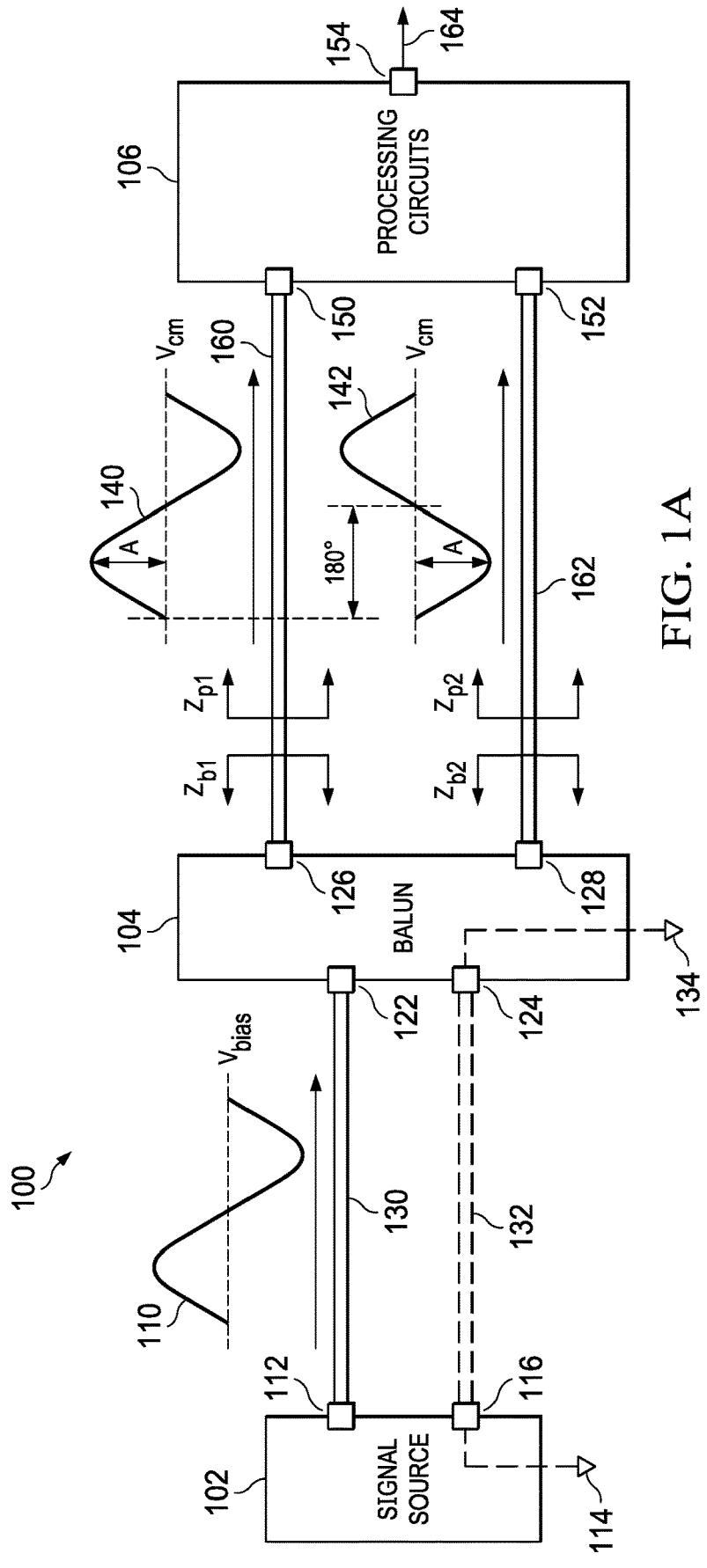
FIG. 1A and FIG. 1B are schematics of an example system that can include a balun.
Figure 1B:
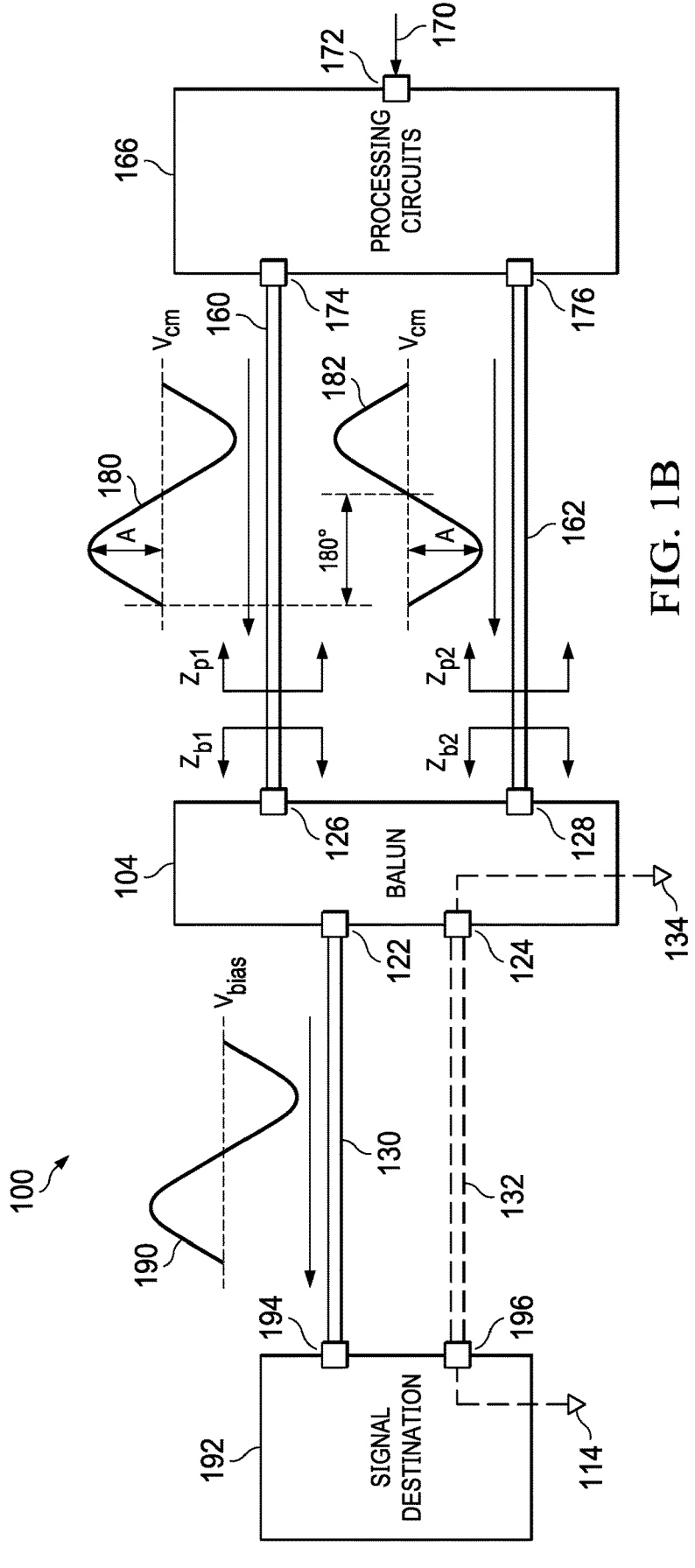

FIG. 1A and FIG. 1B are schematics of a system 100 that can include a balun. As shown in FIG. 1A, system 100 can include a signal source circuit 102, a balun 104, and a signal processing circuit 106. Examples of signal source circuit 102 can include a sensor and an antenna (not shown in FIG. 1) to generate an input signal 110, which can be in the form of varying voltage centered around a bias point $V_{bias}$. Signal source circuit 102 can provide input signal 110 via a signal output 112. Signal source circuit 102 can also be electrically coupled to a voltage reference 114, which can be a low impedance voltage reference such as a voltage source or a capacitor. Signal source circuit 102 can provide a connection to the low impedance voltage reference via a reference terminal 116. Voltage reference 114 can have a low impedance at the frequency of input signal 110 and can be an alternating current (AC) reference. Voltage reference 114 can provide various direct current (DC) voltages, such as a zero volt ground voltage. Input signal 110 can be a single-ended signal with respect to voltage reference 114.

Also, balun 104 can include a single-ended signal terminal 122, a reference terminal 124, and differential signal terminals 126 and 128. Each of signal terminals 122, 126, and 128 can be a bi-directional terminal and can receive an input signal or provide an output signal. Signal terminal 122 of balun 104 can be electrically coupled to signal output 112 of signal source circuit 102 via a wire 130, and reference terminal 124 can be electrically coupled to reference output 116 via a wire 132. Balun 104 can receive the single-ended signal, such as input signal 110, via signal input 122. In some examples, balun 104 can be coupled to voltage reference 114 via reference terminal 124 and wire 132. In some examples, balun 104 can also be directly coupled to a voltage reference 134, which can be a low impedance voltage reference such as a voltage source or a capacitor. Balun 104 can also provide a connection to voltage reference 134 via reference terminal 124. In some examples, voltage references 114 and 134 can be isolated from each other (e.g., due to voltage references 114 and 134 providing different DC voltages) and are not electrically coupled via wire 132. From the single-ended input signal 110, balun 104 can generate electrical output signals 140 and 142 as output signals, and provide output signals 140 and 142 via, respectively, signal outputs 126 and 128.

Electrical output signals 140 and 142 can include a pair of differential signals. To have perfect amplitude balance between the differential signals, each of output signals 140 and 142 can include a voltage signal having the same amplitude centered around the same common mode voltage $V_{cm}$. The common mode voltage $V_{cm}$ can be set by the voltage of a low impedance voltage reference (e.g., one of voltage references 114 or 134), such as 0V for a ground reference, or other static voltages (e.g., 1.8V). Moreover, to have perfect phase balance between the differential signals, output signals 140 and 142 can have a 180-degree phase difference between them. Amplitude mismatch between output signals 140 and 142 can lead to amplitude imbalance between the signals. Moreover, a phase difference of more than or less than 180 degrees between output signals 140 and 142 can lead to a phase imbalance between the signals. As to be described below, balun 104 can introduce amplitude imbalance and/or phase imbalance between output signals 140 and 142. Techniques to be described below can reduce the amplitude imbalance and phase imbalance between output signals 140 and 142.

Further, processing circuit 106 can include differential signal inputs 150 and 152 and an output 154. Signal input 150 can be electrically coupled to signal output 126 via a wire 160 to receive output signal 140, and signal input 152 can be electrically coupled to signal output 128 via a wire 162 to receive output signal 142. Wires 160 and 162 can be a differential pair of wires with matched length and impedance, so that the phase and amplitude relationship between differential output signals 140 and 142 at signal inputs 150 and 152 can be the same as at signal outputs 126/128. Processing circuit 106 can receive differential signals 140 and 142 from balun 104 via, respectively, signal inputs 150 and 152, process the differential signals, and provide a processing result 164 via output 154.

Processing circuit 106 can perform various processing operations on differential output signals 140 and 142 to generate processing result 164. The processing operations can be based on detecting/measuring voltage differences between differential output signals 140 and 142. For example, processing circuit 106 can include an amplifier having a pair of differential inputs to receive the respective signals 140 and 142. The amplifier can generate a voltage or a current signal based on the voltage difference between signals 140 and 142. As another example, processing circuit 106 can include an analog-to-digital converter (ADC) that can sample the voltage differences and quantize the samples, and provide digital codes representing the quantization results as processing result 164. As another example, processing circuit 106 can compare the voltage differences against a threshold to generate a sequence of binary codes representing the comparison decisions, and process the binary codes to generate processing result 164.

FIG. 1B illustrates another example of system 100 in which balun 104 converts differential inputs to a single-ended output. Referring to FIG. 1B, system 100 can include processing circuit 166 and a signal destination circuit 192. Processing circuit 166 can have an input 172 and outputs 174 and 176. Processing circuit 166 can receive a digital input 170 and generate a pair of differential analog signals 180 and 182 based on digital input 170. Processing circuit 166 can provide analog signal 180 to signal terminal 126 of balun 104 via wire 160, and provide analog signal 182 to signal terminal 128 of balun 104. Balun 104 can convert differential analog signals 180 and 182 to a single-ended analog signal 190 which centers around $V_{bias}$, and provide single-ended analog signal 190 at signal terminal 122. Signal destination circuit 192 can include an input 194 coupled with signal terminal 122 via wire 130, and optionally a reference terminal 196 coupled to reference terminal 124 via wire 132. Processing circuit 166 can performing various processing operations to generate differential signals 180. Examples of processing circuit 166 can include a digital-to-analog converter (DAC) and a driver amplifier having a pair of differential outputs. Examples signal destination circuit 192 can include a display driver circuit, or a transmitter circuit. that can generate output signals based on single-ended analog signal 190.

Differential signaling can provide various advantages over single-ended signaling, such as improved noise immunity and common mode rejection. Specifically, referring to FIG. 1A, as processing circuit 106 process voltage differences between differential output signals 140 and 142, the same noise signals can be coupled into wires 160 and 162 and appear in both differential output signals 140 and 142. Those noise signals can cancel (or at least attenuate) each other in the voltage differences between differential output signals 140 and 142. Also, referring to FIG. 1B, the same noise signals coupled into wires 160 and 162 and appear in signals 180 and 182 can also cancelled or at least attenuated in the single-ended signal 190 provided by balun 104. Accordingly, the noise immunity of system 100 can be improved.

Moreover, referring to FIG. 1A, as processing circuit 106 processes the voltage differences between differential output signals 140 and 142, the common mode voltage $V_{CM}$ of each of output signals 140 and 142 is also cancelled out in the voltage differences. Also, the common mode voltage $V_{CM}$ of each of output signals 140 and 142 can also be independent from the reference voltage of single-ended input signal 110. Further, referring to FIG. 1B, the bias voltage $V_{bias}$ of output signal 190 can be independent from the common mode voltage $V_{CM}$ of each of input signals 180 and 182. Accordingly, as the operations of processing circuit 166 can be largely independent from $V_{CM}$ of output signals 140 and 142 and the reference voltage of single-ended input signal 110, and the operations of signal destination circuit 192 can be largely independent from $V_{CM}$ of input signals 180 and 182, the common mode rejection of system 100 in FIG. 1A and FIG. 1B can be improved.

Figure 2A:
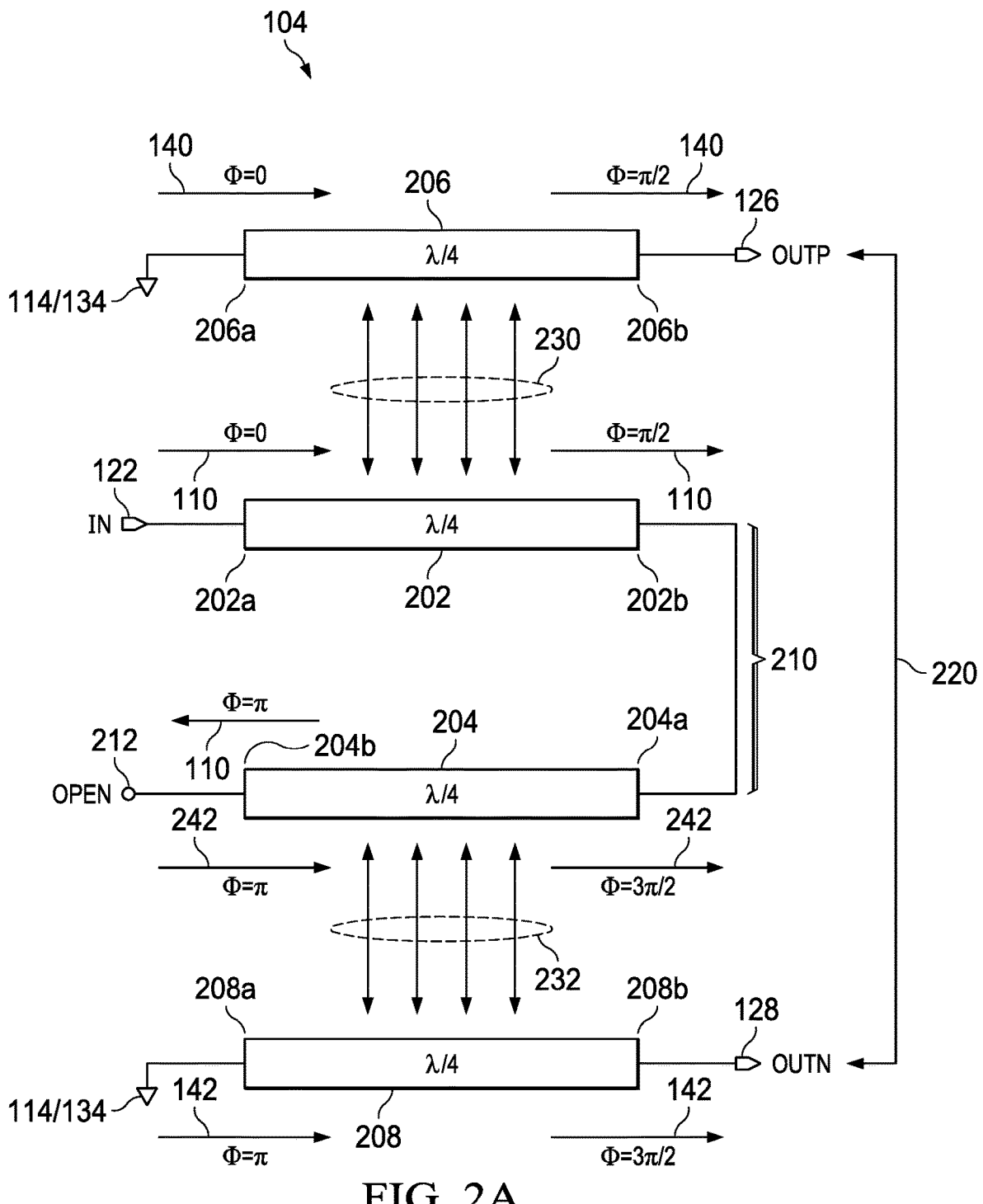
FIG. 2A and FIG. 2B are schematics of an example balun and its operations.
Figure 2B:
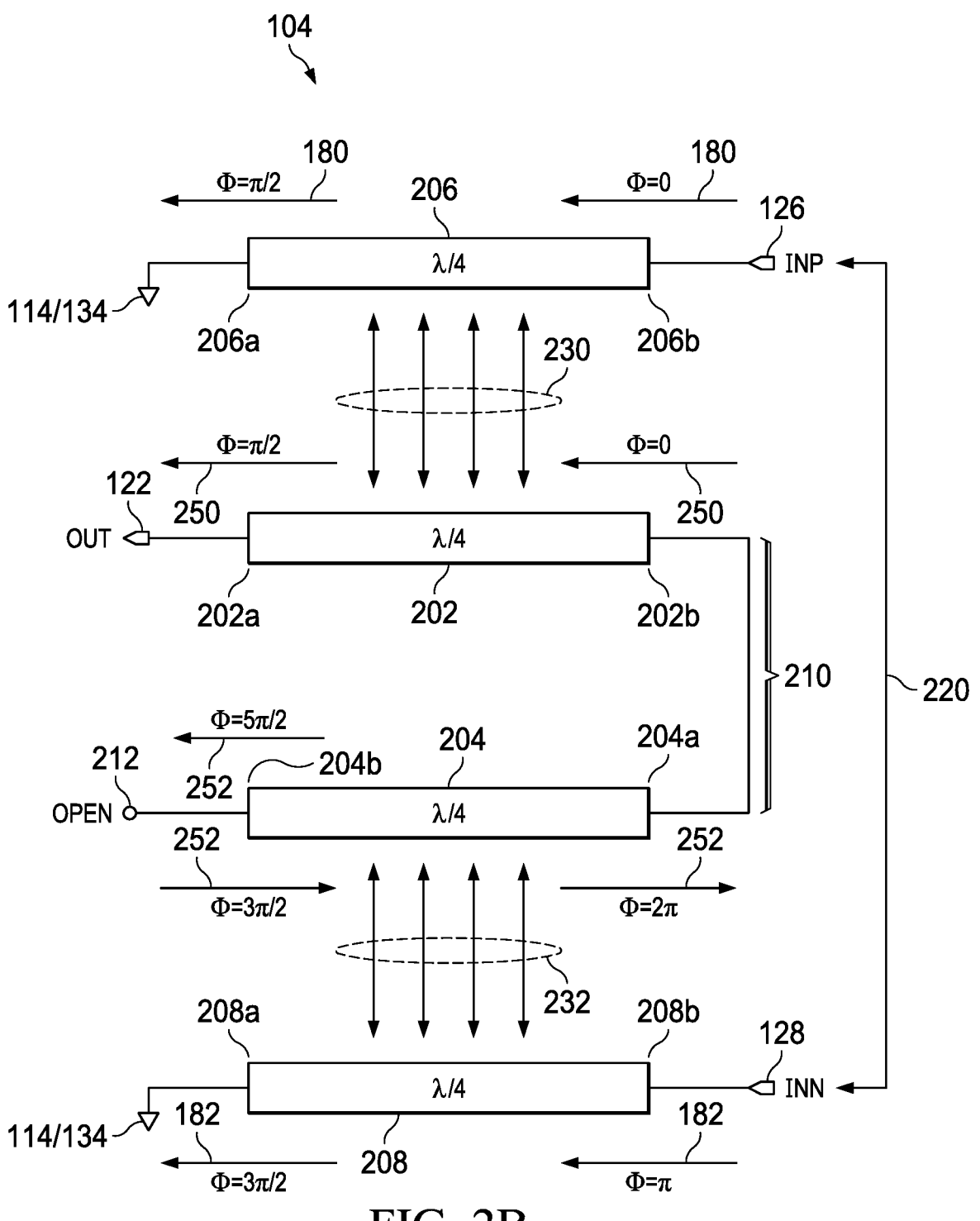

FIG. 2A and FIG. 2B are schematics of an example balun 104. FIG. 2A illustrates an example of balun 104 configured to convert a single-ended signal (e.g., signal 110) to a pair of differential signals (e.g., signals 140 and 142). Referring to FIG. 2A, balun 104 can include a plurality of metal segments, including segments 202, 204, 206, and 208. Each metal segment can be a quarter wavelength ($\lambda/4$) transmission line, with each segment having a length equal to a one quarter (¼) of a wavelength of a signal, such as electrical signal 110. Segments 202 and 204 can be electrically coupled together to be part of a first metal layer 210, which can be an input layer in FIG. 2A, with a first end 202a of segment 202 electrically coupled to signal terminal 122 (labelled "in" in FIG. 2A) to receive electrical signal 110, a second end 202b of segment 202 coupled with a first end 204a of segment 204, and a second end 204b of segment 204 is a disconnected end and to provide an open 212.

Also, segments 206 and 208 can be part of a second metal layer 220, which can be an output layer in FIG. 2A. A first end 206a of segment 206 is electrically coupled to reference terminal 124, which can provide an electrical connection to a low impedance voltage reference (e.g., voltage references 114/134), and a second end 206b of segment 206 is electrically coupled to signal terminal 126 configured as a first output (labelled "outp" in FIG. 2A). Moreover, an end 208a of segment 208 is electrically coupled to reference terminal 124, and an end 208b of segment 208 is electrically coupled to signal terminal 128 configured as a second output (labelled "outn" in FIG. 2A). As described above, voltage references 114/134 can provide a low impedance AC reference and a DC voltage, such as a zero volt (0V) ground voltage, or a non-zero common mode voltage (e.g., $V_{CM}$).

Balun 104 can generate differential signals (e.g., differential output signals 140 and 142) from a single-ended signal (e.g., electrical signal 110) based on magnetic coupling between segments 202 and 206 and between segments 204 and 208, as well as the propagation delay of the single-ended signal through segments 202 and 204. Specifically, signal 110 travels from signal input 122/end 202a through segments 202 and 204 and reaches end 204b. Signal 110 is then reflected at open 212 to become reflected signal 242, which propagates back from end 204b to signal input 122/end 202a. Signal 110 and 242 can form a standing wave pattern. As signal 110 propagates through segment 202, a magnetic field 230 can be generated, which induces output signal 140 on segment 206. Also, as reflected signal 242 propagates through segment 204, a magnetic field 232 can be generated, which induces output signal 142 on segment 208.

Further, each of segments 206 and 208 can have a length equal to a one quarter (¼) of a wavelength of a signal, and it takes a signal a quarter cycle to propagate through a quarter wavelength transmission line. For example, signal 110 and the induced output signal 140 can each accrue a quarter cycle phase delay ($\pi/2$ or 90 degrees out of a 360-degree cycle) after propagating through the respective segments 202 and 206. Therefore, output signal 140 can have a phase of $\pi/2$. Moreover, signal 110 can each accrue a half cycle phase delay ($\pi$ of 180 degrees out of a 360-degree cycle) when reaching end 204b/open 212, after propagating through segments 202 and 204. Reflected signal 242 and the induced output signal 142 can each accrue an additional quarter cycle phase delay after propagating through the respective segments 204 and 208, and output signal 142 can have a phase of $3\pi/2$. This can result in a phase difference $\pi$ between output signals 140 and 142, which can result in a pair of differential signals.

As an illustrative example, in FIG. 2A, at signal input 122, the phase $\Phi$ of signal 110 can be zero. Signal 110 can have a wavelength $\lambda$, and each of segments 202, 204, 206, and 208 can have a length of a quarter of $\lambda$ ($\lambda/4$). Through magnetic coupling by magnetic field 230, signal 110 can induce output signal 140 at end 206a of segment 206 that is electrically coupled to voltage references 114/134, which can define the common mode voltage $V_{CM}$ as well as the start of propagation of output signal 140 on segment 206. At end 206a the phase $\Phi$ of output signal 140 is also zero. After traversing through the quarter wavelength segment 206, output signal 140 can be delayed by a quarter cycle, and the phase $\Phi$ of output signal 140 can become $\pi/2$ at end 206b of segment 206 and signal output 126.

Signal 110 also traverses through first metal layer 210. When signal 110 reaches end 204b, signal 110 has traveled through a total distance of half wavelength through two quarter wavelength segments 202 and 204, and can be delayed by a half cycle. The phase of signal 110 can become π at end 204b. Signal 110 can be reflected at open 212 and becomes reflected signal 242. Due to reflection at an open, reflected signal 242 can have the same phase as incident signal 110, and the phase $\Phi$ of signal 242 can also be at π (same as signal 110) at open 212. Through magnetic coupling, signal 242 can induce output signal 142 at end 208a of segment 208 that is electrically coupled to voltage references 114/134, which can define the common mode voltage $V_{CM}$ as well as the start of propagation of output signal 142 on segment 208. The phase $\Phi$ of output signal 142 can also be π (same as signal 242) at end 208a. After traversing through the quarter wavelength segment 208, output signal 142 can be further delayed by a quarter cycle (π/2), and the phase $\Phi$ of output signal 142 can become 3π/2 (270 degrees) at end 208b/signal output 128. Accordingly, output signals 140 and 142, having a respective phase $\Phi$ of π/2 and 3π/2, can have a phase difference of π or 180 degrees between them.

FIG. 2B illustrates another example of balun 104 configured to convert a pair of differential signals (e.g., signals 180 and 182) to a single-ended signal (e.g., signal 190). Referring to FIG. 2B, segments 206 and 208 can be part of second metal layer 220 which can be an input layer. End 206b of segment 206 can be coupled to signal terminal 126 (labelled "inp" in FIG. 2B) to receive signal 180, and end 208b of segment 208 can be coupled to signal terminal 128 (labelled "inn" in FIG. 2B) to receive signal 182. Signal 180 can have a phase $\Phi$ of zero at end 206b, and signal 182 can have a phase $\Phi$ of π at end 208b. Also, segments 202 and 204 can be part of first metal layer 210 which can be an output layer. End 202a of segment 202 can be coupled to signal terminal 122 (labelled "out" in FIG. 2B) to provide single-ended signal 190, end 204b of segment 204 can be a disconnected end and provide open 212, and end 202b of segment 202 and end 204a of segment 204 can be electrically coupled together.

Balun 104 can generate single-ended signal 190 from differential signals 180 and 182 based on magnetic coupling between segments 202 and 206 and between segments 204 and 208, as well as the propagation delay of the differential signals through the respective segments 206 and 208. Specifically, as signal 180 starts propagating from end 206b of segment 206 with a phase $\Phi$ of zero, through magnetic coupling 230 between segments 202 and 206, a partial output signal 250 having the same phase $\Phi$ of zero can be induced by at end 202b of segment 202. Partial output signal 250 can propagate through segment 202 and reach signal terminal 122. As segment 202 is a quarter wavelength transmission line, partial output signal 250 can have a phase $\Phi$ of π/2 at signal terminal 122.

Also, as signal 182 starts propagating from end 208b of segment 208 with a phase $\Phi$ of π, through magnetic coupling 232 between segments 208 and 204, a partial output signal 252 having the same phase $\Phi$ of π can be induced by signal 182 at end 204b of segment 204. Partial output signal 252 can propagate through segment 204, which has a length equal to a quarter of the wavelength of signal 182, and get reflected at open 212 with a phase of 3π/2. After reflection, reflected partial output signal 252 can propagate through segments 204 and 202 and accrue an additional phase shift of π. When reaching signal terminal 122 at end 202a of segment 202, reflected partial output signal 252 can have a total phase of 5π/2, or a complete cycle delay (2π) plus a phase of π/2. Accordingly, partial output signals 250 and 252 can both have a phase shift of π/2 compared with signal 180 and can be combined to provide single-ended signal 190 at signal terminal 122. The amplitude of single-ended signal 190 can be double of the amplitude of each of signals 180 and 182.

Also, the amplitude of the output signal(s) of balun 104 can be based on the impedances of the signal terminals of balun 104 and the terminals of the processing circuit that receive the output signal(s) from balun 104 or provide the input signal to balun 104. For example, referring to FIG. 1A and FIG. 1B, the impedances of signal terminals 126 and 128 of balun 104 are, respectively, $Z_{b1}$ and $Z_{b2}$. The combined impedances of wires 160 and 162 and the interfacing terminals of the processing circuit (e.g., 150/152 in FIG. 1A, 174/176 in FIG. 1B) are, respectively, $Z_{p1}$ and $Z_{p2}$. The amplitudes of output signal 140 in FIG. 1A and input signal 180 in FIG. 1B can be based on $Z_{b1}$ and $Z_{p1}$, and the amplitudes of output signal 142 in FIG. 1A and input signal 182 in FIG. 1B can be based on $Z_{b2}$ and $Z_{p2}$. The amplitudes of output signals 140/142 and input signals 180/142 can be at the maximum when the impedance of the signal terminal of balun 104 match with the combined impedance of the interfacing wire and terminal of the processing circuit. In FIG. 1A through FIG. 2B, with the length of segments 202 and 204 equal to a quarter of the wavelength of the input/output signals, the impedance at signal terminals 126/128 can each be equal to $Z_b$ according to the following Equation:

$$Z_b = \frac{(Z_0)^2}{Z_L} \qquad \text{(Equation 1)}$$

In Equation 1, $Z_0$ can be the characteristic impedance of each of segments 202 and 204. $Z_L$ can be the impedance of a low impedance voltage reference (e.g., voltage references 114/134) at the frequency of the input/output signal, and the quarter wavelength transmission line of segment 202/204 transforms the impedance $Z_L$ to the output impedance $Z_b$. The characteristic impedance $Z_0$ of a segment can be based on the unit-length resistance R, unit-length inductance L, unit-length conductance G, and unit-length capacitance C of the segment, as follows:

$$Z_0 = \sqrt{\frac{R + j\omega_S L}{G + j\omega_S C}} \qquad \text{(Equation 2)}$$

In Equation 2, $\omega_s$ is the angular frequency of the signal and is equal to $2\pi f_s$ where $f_s$ is the signal frequency (e.g., the frequency of signals 110, 140, and 142), and j is the imaginary unit. Accordingly, characteristic impedance $Z_0$ and signal terminal impedance $Z_b$ are frequency dependent. The characteristic impedance $Z_0$ and signal terminal impedance $Z_b$ can be minimized at a resonant frequency $f_R$ (with angular resonant frequency $\omega_R$ equal to $2\pi f_R$).

As an illustrative example, $Z_L$ equals to 10Ω, $Z_0$ equals 22.3Ω, and $Z_b$ at each of signal terminals 126 and 128 can become 50Ω according to Equation 1. In FIG. 1A, the amplitudes of the output signals 140 and 142 can be maximized if both the combined impedance of wire 160 and terminal 150 and the combined impedance of wire 162 and terminal 152 equal to 50Ω. Also, in FIG. 1B, the amplitudes of input signals 180 and 182, and the amplitude of output signal 190, can also be maximized if both the combined impedance of wire 160 and terminal 174 and the combined impedance of wire 162 and terminal 176 equal to 50Ω.

Figure 3:
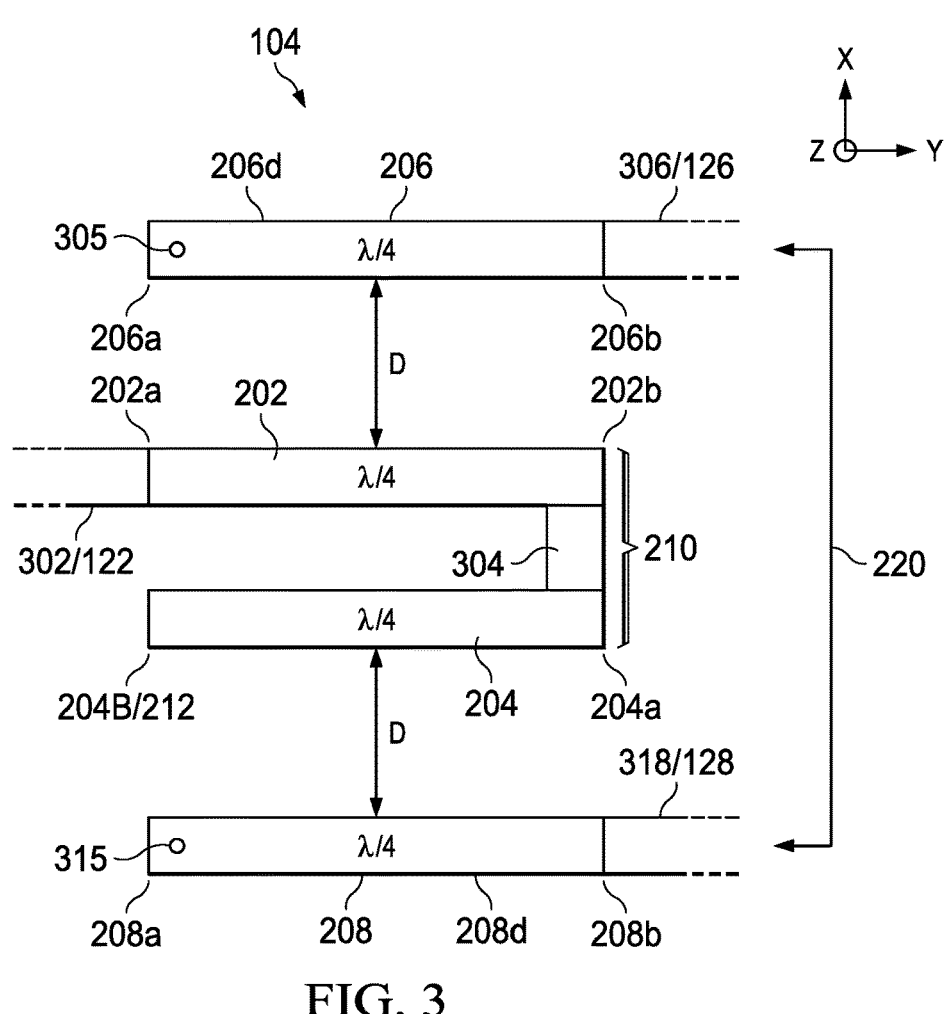
FIG. 3, FIG. 4A, and FIG. 4B are schematics of example baluns.

FIG. 3 is a schematic that illustrates a top view of an example balun 104. As shown in FIG. 3, first metal layer 210 (including segments 202 and 204) and second metal layer 220 (including segments 206 and 208) can be positioned sideways. For example, in FIG. 3, first metal layer 210 and second metal layer 220 can be adjacent to each other on an x-y plane along the x-axis in FIG. 3, where first metal layer 210 and second metal layer 220 can be in the same metal layer. Segments 202 and 204 of first metal layer 210 can be arranged as two parallel lines. End 202a of segment 202 can be electrically coupled to a metal segment 302 as signal terminal 122 that extends from the left side of FIG. 3, a metal segment 304 can be electrically coupled between end 202b of segment 202 and end 204a of segment 204, and end 204b of segment 204 can form open 212.

Also, segments 202 and 206 can be arranged as two parallel lines separated by a distance D, and segments 204 and 208 can also be arranged as two parallel lines separated by distance D. In some examples, end 206a of segment 206 can be electrically coupled to a via 305, which can provide an electrical connection to a reference layer in a different metal layer. In some examples, end 206a can also be electrically coupled to a reference layer in the same metal layer as segments 202 and 206. The reference layer can be coupled to a voltage reference, a ground, or can be part of a capacitor that provides an AC reference. End 206b of segment 206 can be electrically coupled to a metal segment 306 as signal terminal 126. Further, in some examples, end 208a of segment 208 can be electrically coupled to a via 315, which can provide an electrical connection to the same reference layer electrically coupled to end 206a of segment 206. End 208a can also be electrically coupled to a reference layer in the same metal layer as segments 202 and 206. End 208b of segment 208 can be electrically coupled to a metal segment 318 as signal terminal 128. Both signal outputs 126 and 128 can extend towards the right side of FIG. 3 and can be matched in length and impedance.

In FIG. 3, first metal layer 210 and second metal layer 220 are shown as straight lines. To reduce the footprint of first metal layer 210 and second metal layer 220 while maintaining the lengths of segments 202-208 at the quarter wavelength, each of segments 202-208 can be in the form of a serpentine/meander. Moreover, first metal layer 210 and second metal layer 220 can be in different metal layers forming a stack (e.g., along the z-axis in FIG. 3).

Figure 4B:
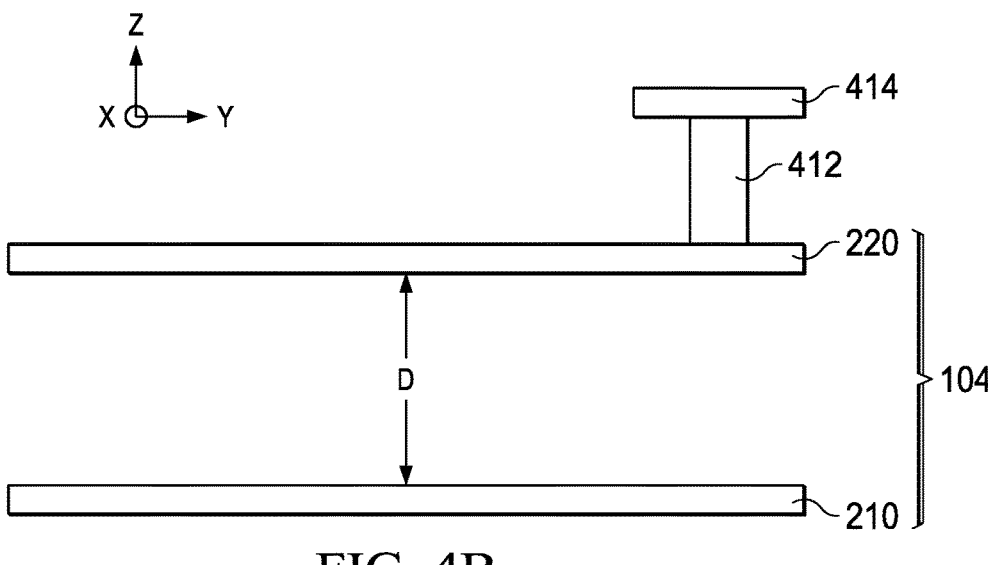
Figure 4A:
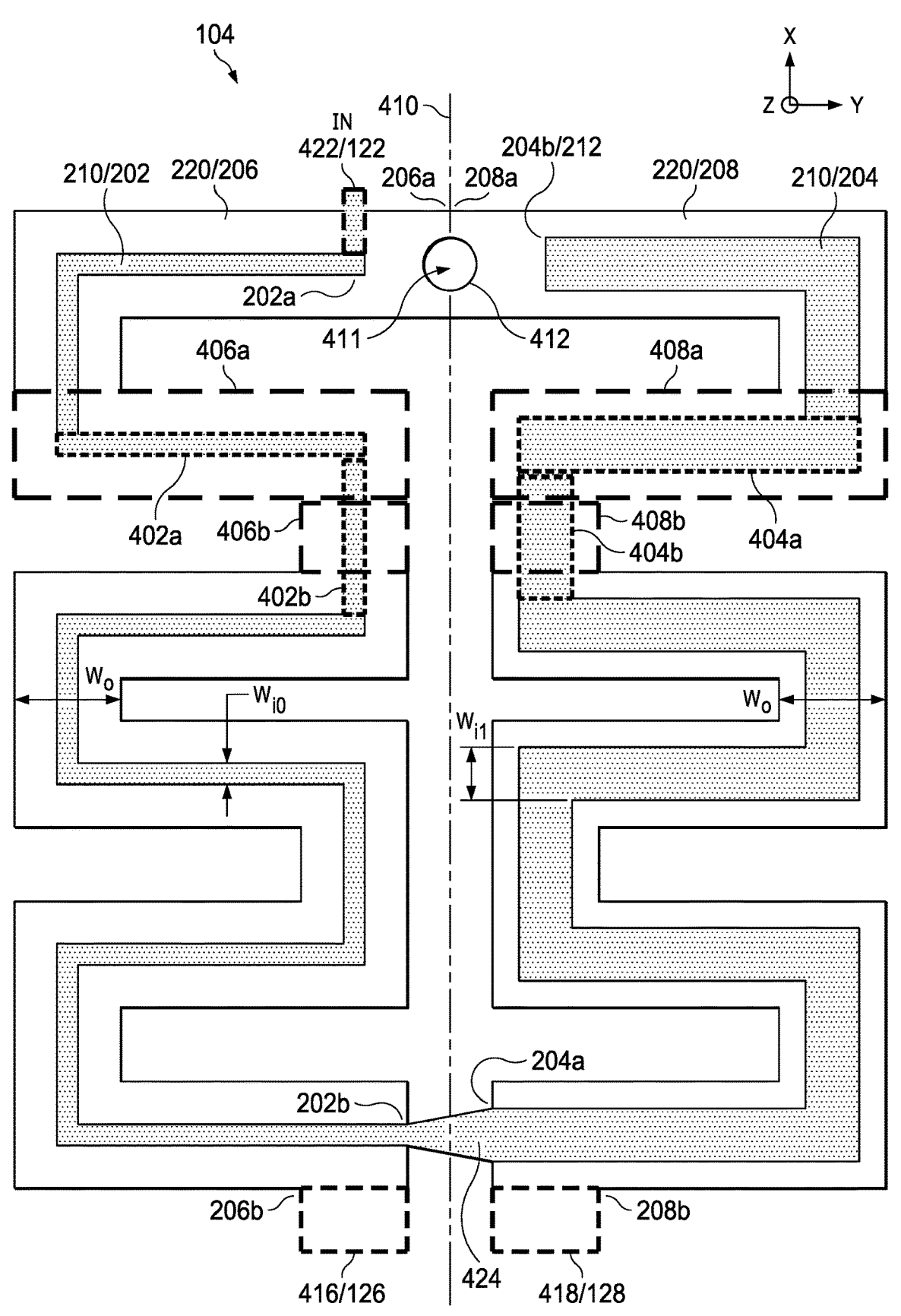

FIG. 4A and FIG. 4B are schematics that illustrate an example of balun 104 having meander first metal layer 210 and second metal layer 220 that form a stack. FIG. 4A shows a top view of balun 104, and FIG. 4B shows a side view of balun 104. As shown in FIG. 4A, first metal layer 210 can include meander segments 202 and 204, and second metal layer 220 can include meander segments 206 and 208. Each of meander segments 202, 204, 206, and 208 includes latitudinal sub-segments that extend along a first direction (e.g., the x-axis) and longitudinal sub-segments that extend along a second direction perpendicular to the first direction (e.g., the y-axis). For example, for first metal layer 210, segment 202 includes a latitudinal subsegment 402a and a longitudinal subsegment 402b, and segment 204 includes a latitudinal subsegment 404a and a longitudinal subsegment 404b. Also, for second metal layer 220, segment 206 includes a latitudinal subsegment 406a and a longitudinal subsegment 406b, and segment 208 includes a latitudinal subsegment 408a and a longitudinal subsegment 408b.

Segments 206 and 208 can be part of second metal layer 220 and each can be electrically coupled to a low impedance voltage reference, where segments 206 and 208 can be symmetrical over an axis 410. Specifically, end 206a of segment 206 can be coupled directly to end 208a of segment 208 at a center tap 411 on axis 410. Balun 104 can include a via 412 at center tap 411 that couples each of end 206a and end 208a to a reference layer 414, which can provide an electrical connection to a low impedance voltage reference such as a voltage source and a capacitor which can also provide the common mode voltage $V_{CM}$. For example, reference layer 414 can provide an electrical connection to voltage references 114/134. In some examples, balun 104 includes multiple vias 412 to improve a connection between second metal layer 220 and reference layer 414. Center tap 411, via the connection to the low impedance voltage reference, can also define a starting point of propagation of output signal 140 on segment 206 and of output signal 142 on segment 208.

Also, segments 416 and 418 can be extensions of second metal layer 220. End 206b of segment 206 of second metal layer 220 can be electrically coupled to segment 416 to provide access to signal terminal 126, and end 208b of segment 208 can be electrically coupled to segment 418 to provide access to signal terminal 128. Segments 206 and 208 can be symmetrical over axis 410 with corresponding latitudinal subsegments (e.g., 406a and 408a) and corresponding longitudinal subsegments (e.g., 402b and 404b), and segments 206 and 208 can have the same length (λ/4) and same width (labelled "$w_o$") between the respective end points 206a-b and 208a-b. With such arrangements, segments 206 and 208 can introduce the same delay to respective output signals 140 and 142 with reference to via 412, and signal terminals 126 and 128 can have the same impedance $Z_{b1}/Z_{b2}$ transformed from the impedance of reference layer 414 (and of the low impedance voltage reference), all of which can improve the amplitude balance and phase balance between output signals 140 and 142.

In some examples, segments 202 and 204 of first metal layer 210 can be stacked (e.g., along the z-axis in FIG. 4A and FIG. 4B) on or below, respectively, segments 206 and 208 of second metal layer 220. Referring to FIG. 4B, in some examples, second metal layer 220 can be sandwiched between reference layer 414 and first metal layer 210. First metal layer 210 and second metal layer 220 can be separated by a uniform distance D along the z-axis, and the magnetic coupling can also be along the z-axis. Referring again to FIG. 4A, end 202a and end 202b of segment 202 can face, respectively, end 204b and end 204a of segment 204 over axis 410. End 202a can be electrically coupled to a metal segment 422 that provides signal terminal 122, end 202b can be electrically coupled to end 204a via a metal segment 424 that extends across axis 410, and end 204b can be open 212. Metal segment 422 can be in the same metal layer as first metal layer 210 or in a different metal layer. In some examples, segments 202 and 204 can have different widths, where segment 202 has a width $w_1$ and segment 204 has a width $w_2$ larger than $w_1$, and segments 206 and 208 each can have a width $w_3$ larger than both $w_1$ and $w_2$. The non-uniform width can reduce the capacitance between first metal layer 210 and second metal layer 220 and improve the bandwidth of balun 104. In some examples, segments 202 and 204 can also have a uniform width.

An integrated circuit may include multiple baluns to convert multiple single-ended input signals to multiple pairs of differential signals. The baluns may be arranged sideways and adjacent to each other. Moreover, baluns may also be positioned adjacent to other metal layers that carry signals. To reduce coupling of external signals into a balun, which can degrade the noise immunity, the balun can be surrounded by a shield structure comprising multiple metal shield layers and vias. In some examples, the shield structure can be in the form of a Faraday cage. The shield structure can be electrically coupled to a low impedance voltage reference (e.g., a voltage source, or a capacitor) via a reference layer such as reference layer 414 to reduce/eliminate coupling of external signals into balun 104.

Figure 5A:
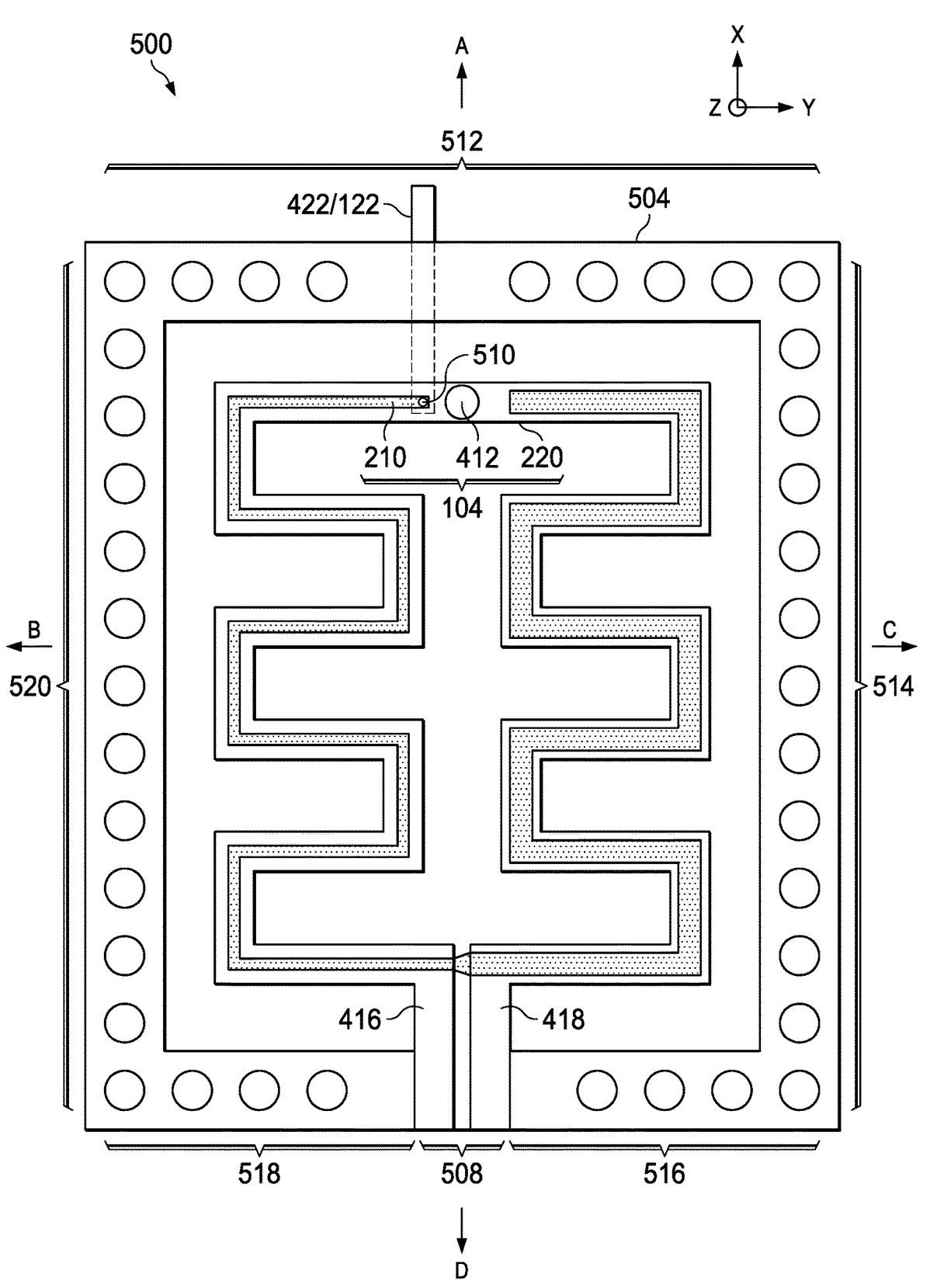
FIG. 5A and FIG. 5B are schematics of example balun modules including a balun and a shield structure.
Figure 5B:
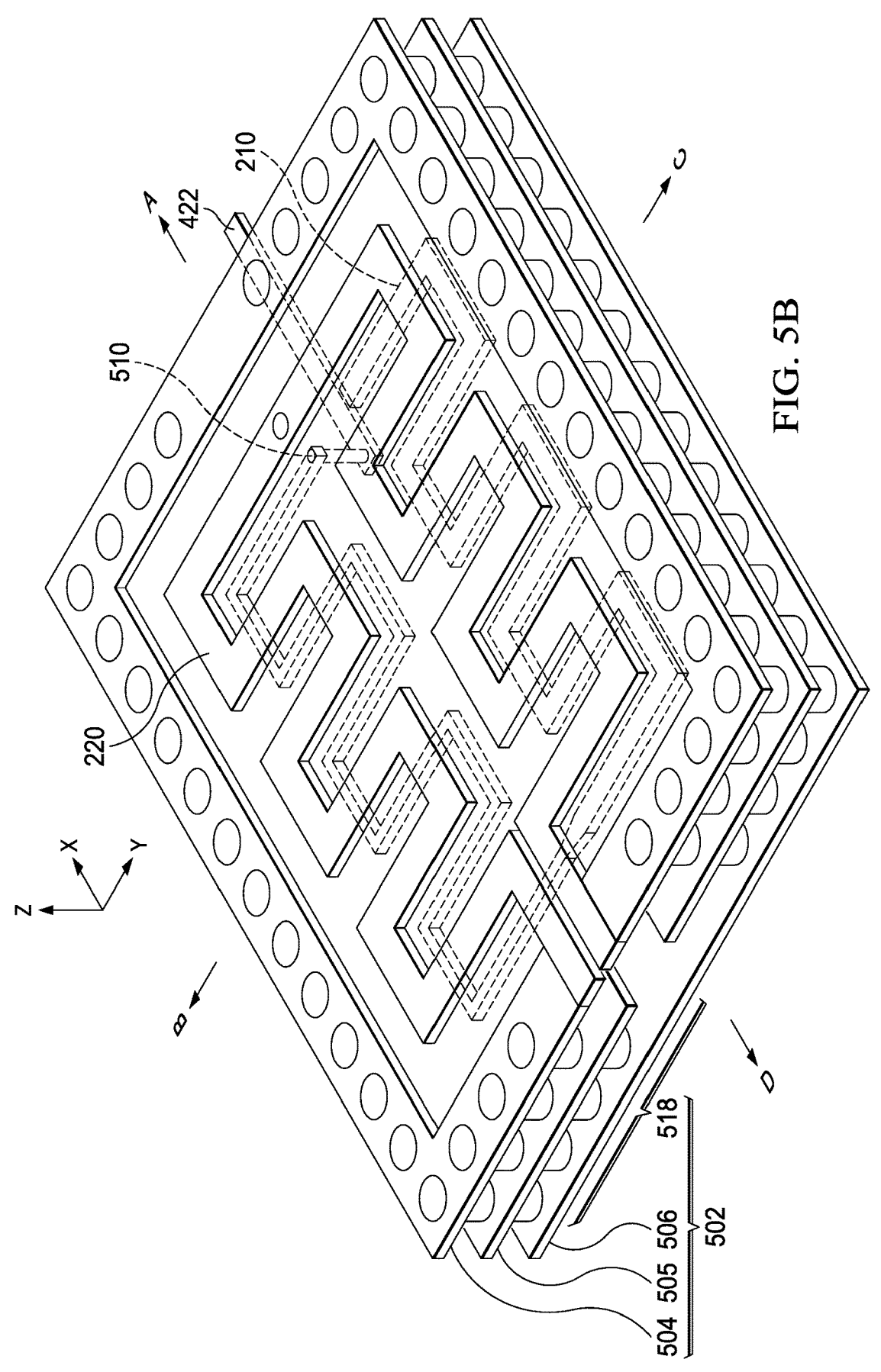

FIG. 5A and FIG. 5B are schematics of an example of a balun module 500 including a shield structure 502 and balun 104. FIG. 5A illustrates a top view of shield structure 502, and FIG. 5B illustrates a perspective view of shield structure 502. Shield structure 502 can include multiple metal shield layers forming a stack (e.g., along the z-axis in FIG. 5A and FIG. 5B), such as metal shield layers 504, 505, and 506. Metal shield layer 504 can be in the same metal layer as second metal layer 220 and surrounds second metal layer 220. Metal shield layer 505 can be of the same metal layer as first metal layer 210 and surrounds first metal layer 210. Metal shield layer 506 can include a wide metal layer to provide a low impedance connection to a low impedance voltage reference (such as a voltage source and a capacitor) via a reference terminal, such as reference terminal 124. In some examples, shield structure 502 can include additional shield layers not shown in FIG. 5A and FIG. 5B, such as a shield layer in the same metal layer as reference layer 414. Metal shield layer 504 and 505 may each include an opening 508 to provide access to segment 416 (for signal terminal 126) and segment 418 (for signal terminal 128) through shield structure 502. In addition, first metal layer 210 can be electrically coupled to metal segment 422 over metal shield structure 502 by a via 510, where metal segment 422 forms signal terminal 122 to provide access to first metal layer 210 through shield structure 502.

Also, shield structure 502 can include groups of through vias that provide electrical connections among metal shield layers 504, 505, and 506, including through via groups 512, 514, 516, 518, and 520. Each through via group can provide a vertical extension (e.g., along the z-axis) of metal shield layers 504, 505, and 506, and the via groups can form a vertical cage structure that surrounds balun 104 and reduces coupling of external signals from each side of balun 104. For example, referring to FIG. 5A and FIG. 5B, through via group 512 can reduce coupling of external signals from a direction A, through via group 520 can reduce coupling of external signals from a direction B, through via group 514 can reduce coupling of external signals from a direction C, and through via groups 516 and 518 can reduce coupling of external signals from a direction D.

Figure 6A:
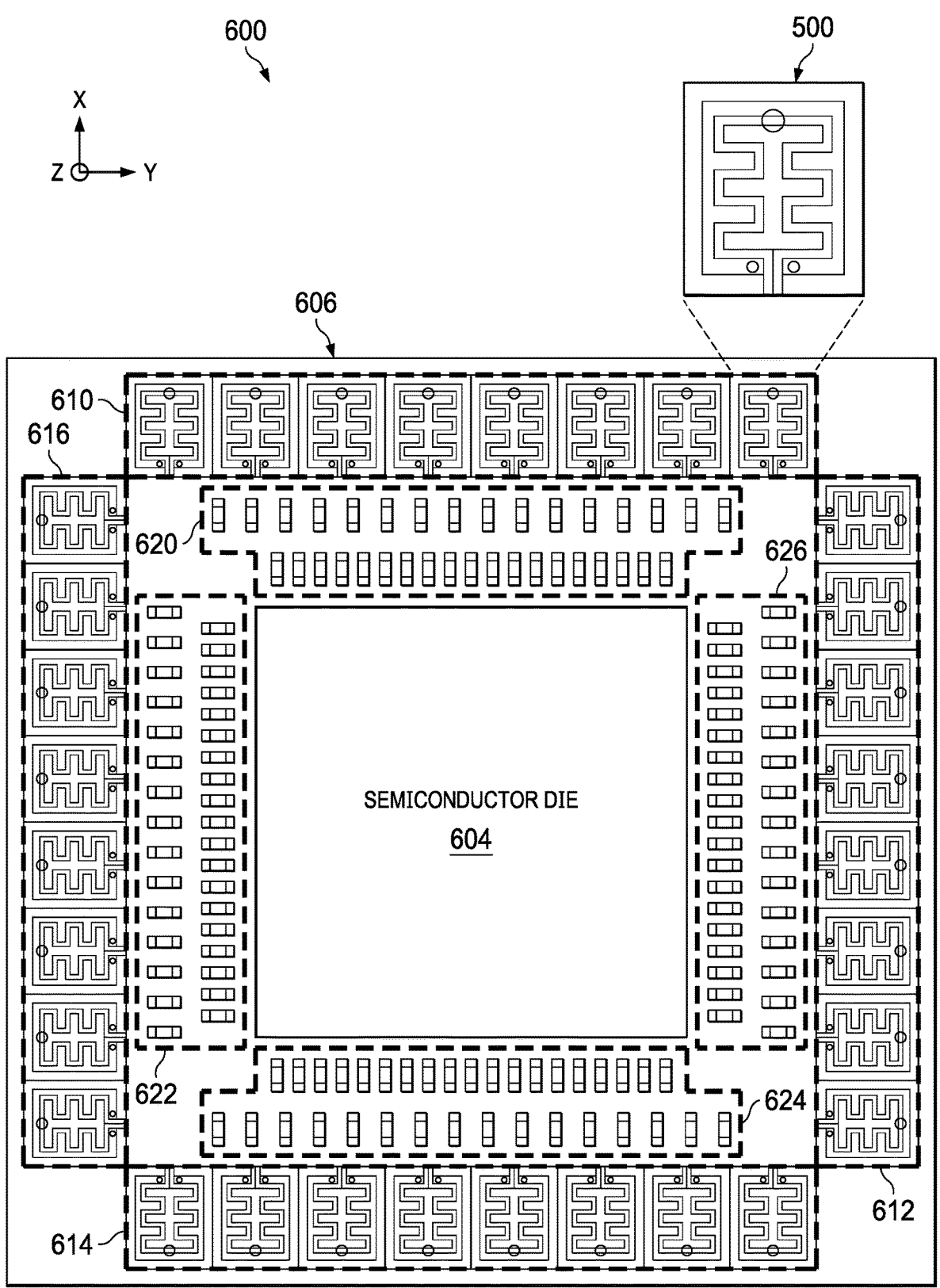
FIG. 6A and FIG. 6B are schematics of an integrated circuit system including the example balun modules of FIG. 5A and FIG. 5B.
Figure 6B:
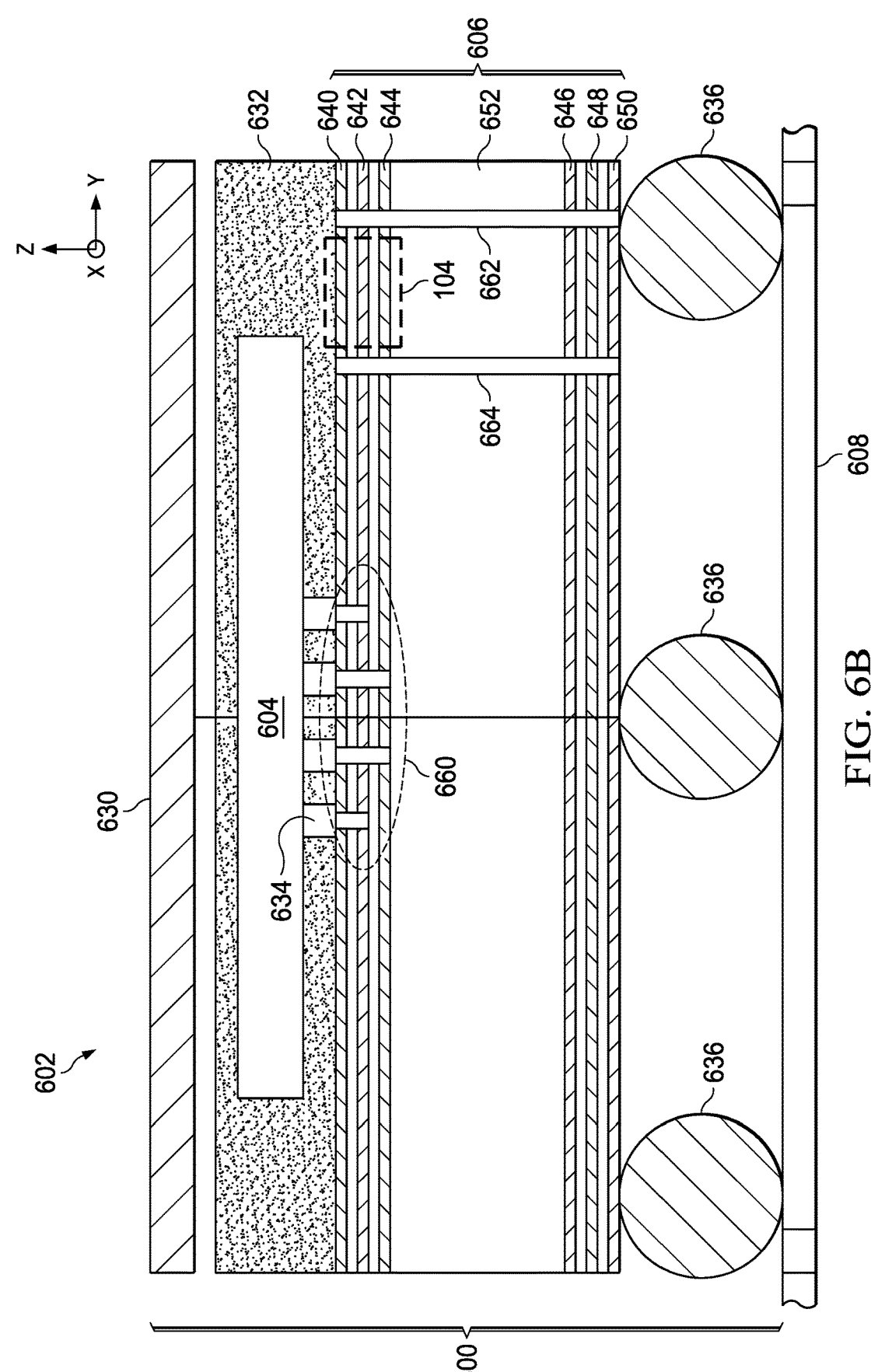

Balun module 500 can be part of metal layers on a semiconductor die of an integrated circuit, part of a package of the integrated circuit, or part of a multi-layer printed circuit board (PCB). FIG. 6A and FIG. 6B illustrate examples of an integrated circuit 600 including balun 104 and shield structure. FIG. 6A shows a partial top view of integrated circuit 600, and FIG. 6B shows a side view of a system 602 including integrated circuit 600. As shown in the partial top view, integrated circuit 600 can include a semiconductor die 604 on a package substrate 606, which can provide electrical connection between semiconductor die 604 and a PCB, such as PCB 608 in FIG. 6B. Semiconductor die 604 can include various circuits, such as signal source circuit 102 and processing circuit 106 of FIG. 1A, and processing circuit 166 and signal destination circuit 192 of FIG. 1B. Package substrate 606 can include strips of balun modules, such as strips 610, 612, 614, and 616 on each respective side of semiconductor die 604 to convert single-ended signals received from PCB 608 to differential signals, and provide the differential signals to the processing circuit of semiconductor die 604. Also, package substrate 606 can include other circuit components, such as groups of capacitors 620, 622, 624, and 626, to perform additional processing (e.g., filtering) of the signals received from PCB 608, and to provide the processed signals to semiconductor die 604.

FIG. 6B illustrates components of system 602 that includes integrated circuit 600. System 602 can include a metal lid 630, which can be part of integrated circuit 600, positioned over semiconductor die 604 (e.g., along the z-axis). Semiconductor die 604 can be embedded within an underfill layer 632. Metal lid 630 and underfill layer 632 together can facilitate dissipation of heat generated by semiconductor die 604 during operations. Also, package substrate 606 is positioned between semiconductor die 604 and PCB 608. Package substrate 606 can be electrically coupled to semiconductor die 604 via bumps 634 and to PCB 608 via solder balls 636. Package substrate 606 can include multiple metal layers, such as metal layers 640, 642, 644, 646, 648, and 650, forming a stack along the z-axis and embedded within a core substrate 652. In some examples, each of metal layers 640-650 can be made of copper or a copper alloy, with each layer having a thickness between 15-30 micrometers (um). Metal layers 640, 642, and 644 can form a first group of metal layers, and metal layers 646, 648, and 640 can form a second group of metal layers. Adjacent metal layers within the group can be separated by a distance of 15-30 um. The first group of metals and the second groups of metals can be on opposite sides of core substrate 652, which can include a dielectric material and have a thickness of 400 um between the opposite sides. In some examples, package substrate 606 can be a core-less substrate, where core substrate 652 can have the same (or substantially the same) thickness as the dielectrics between the metal layers.

Balun 104 can be in some of metal layers 640, 642, 644, 646, 648, and 650. For example, reference layer 414, which provides an electrical connection to a low impedance voltage reference, can be in metal layer 640, second metal layer 220 can be in metal layer 642, and first metal layer 210 can be in metal layer 644. In addition, package substrate 606 can include through vias to provide electrical connection among the some or all of the metal layers. For example, blind vias 660 can be coupled between bumps 634 and one of metal layers 640-650, and between one of metal layers 640-650 and solder balls 636. Package substrate 606 can also include blind vias 660 that provide electrical connection between two metal layers, such as via 412 to provide connection between reference layer 414 and second metal layer 220, and via 510 between first metal layer 210 and metal segment 422, which can be part of metal layers 646-650 and coupled with solder balls 636 to receive signals from or transmit signals to PCB 608. Blind vias 660 can also be electrically coupled to segments 416 and 418 of balun 104 to receive signals from or transmit signals to semiconductor die 604. Some of the through vias, such as through vias 662 and 664, can be electrically coupled to a voltage reference (not shown in FIG. 6) on PCB 608 via solder balls 636. Through vias 662 and 664 can include through vias 512, 514, 516, 518, and 520 of FIG. 5A and FIG. 5B as part of shield structure 502.

Figure 7:
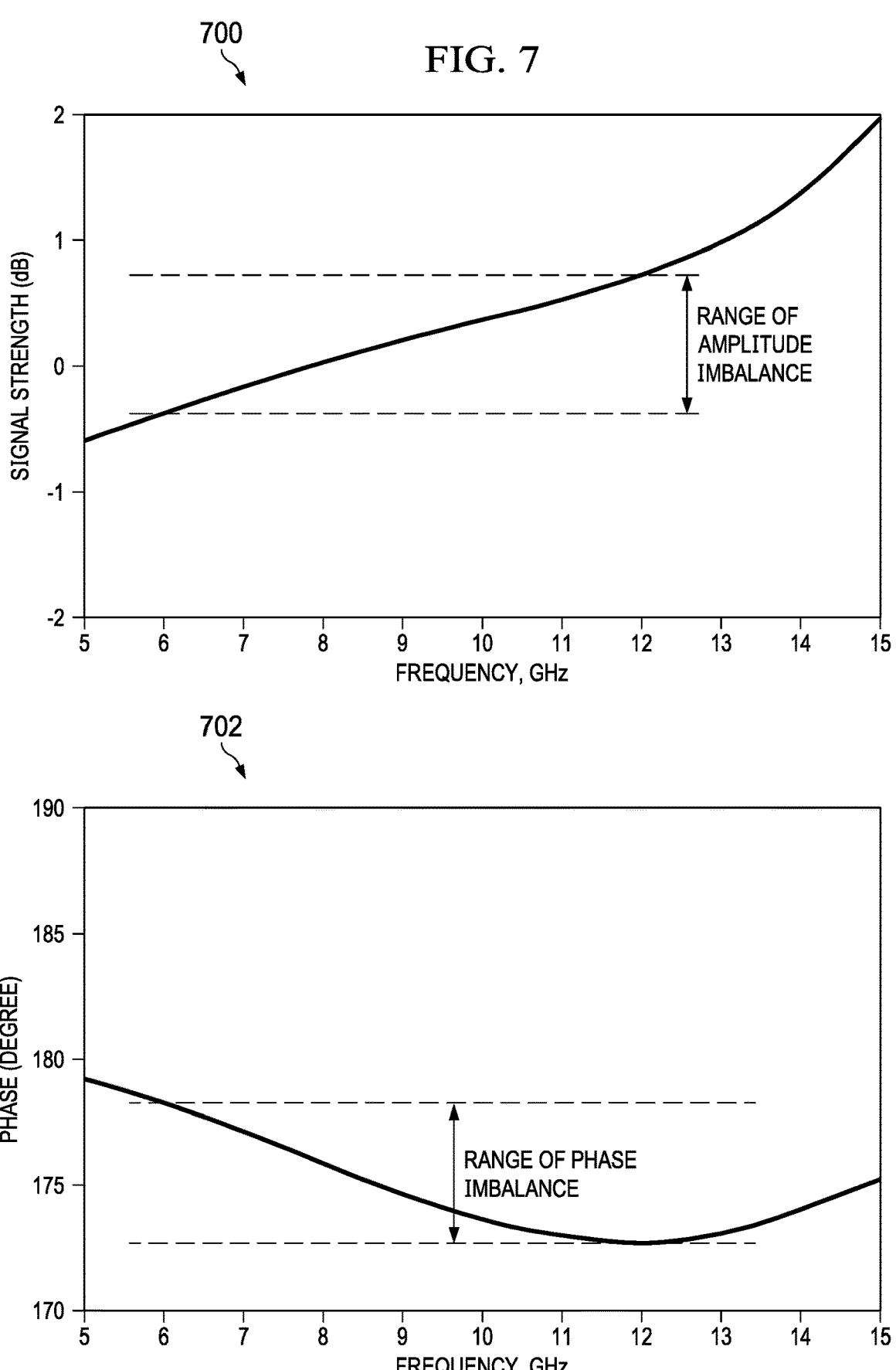
FIG. 7 are graphs of example phase imbalance and amplitude imbalance of a balun.

The conversion between single-end signal and differential signals by balun 104 of system 602 can be affected by various non-idealities, such as phase imbalance and amplitude imbalance being frequency-dependent. FIG. 7 includes graphs 700 and 702 that illustrate, respectively, examples of phase imbalance and amplitude imbalance between the differential signals (140/142, 180/182) at signal terminals 126 and 128 with respect to signal frequency. Referring to graph 700, within a frequency range of 6 to 13 GHz, the amplitude imbalance between the differential signals can vary from −0.5 dB (at 6 GHz) to +0.75 dB (at 13 GHz). Also, referring to graph 702, the phase difference between the differential signals 140 and 142 can vary from 178 degrees (at 6 GHz) to 172 degrees (at 12 GHz), giving a phase imbalance (relative to 180 degrees) of between 2-6 degrees.

Various factors can contribute to phase imbalance and amplitude imbalance, such as the wavelength of input signal, the physical arrangements of input and output layers of the balun, and resonance induced by other components of the system that incorporates the balun. Specifically, the phases of differential signals 140 and 142 shown in FIG. 2A, and the phases of differential signals 180 and 182 shown in FIG. 2B, are based on each of segments 202, 204, 206, and 208 being a quarter wavelength transmission line for the signals. But if the length of each segment does not match a quarter of the wavelength of the signals, the differential signals at the signal terminals 126 and 128 no longer have a phase difference of $\pi$. Also, partial output signals 250 and 252 do not have the same phase at signal terminal 122 in FIG. 2B. The length of each of segments 202, 204, 206, and 208 may not match a quarter of the wavelength of signal 110 for various reasons, such as the signal having a range of operational frequencies (and wavelengths), errors introduced due to limited fabrication precision, etc.

Figure 8A:
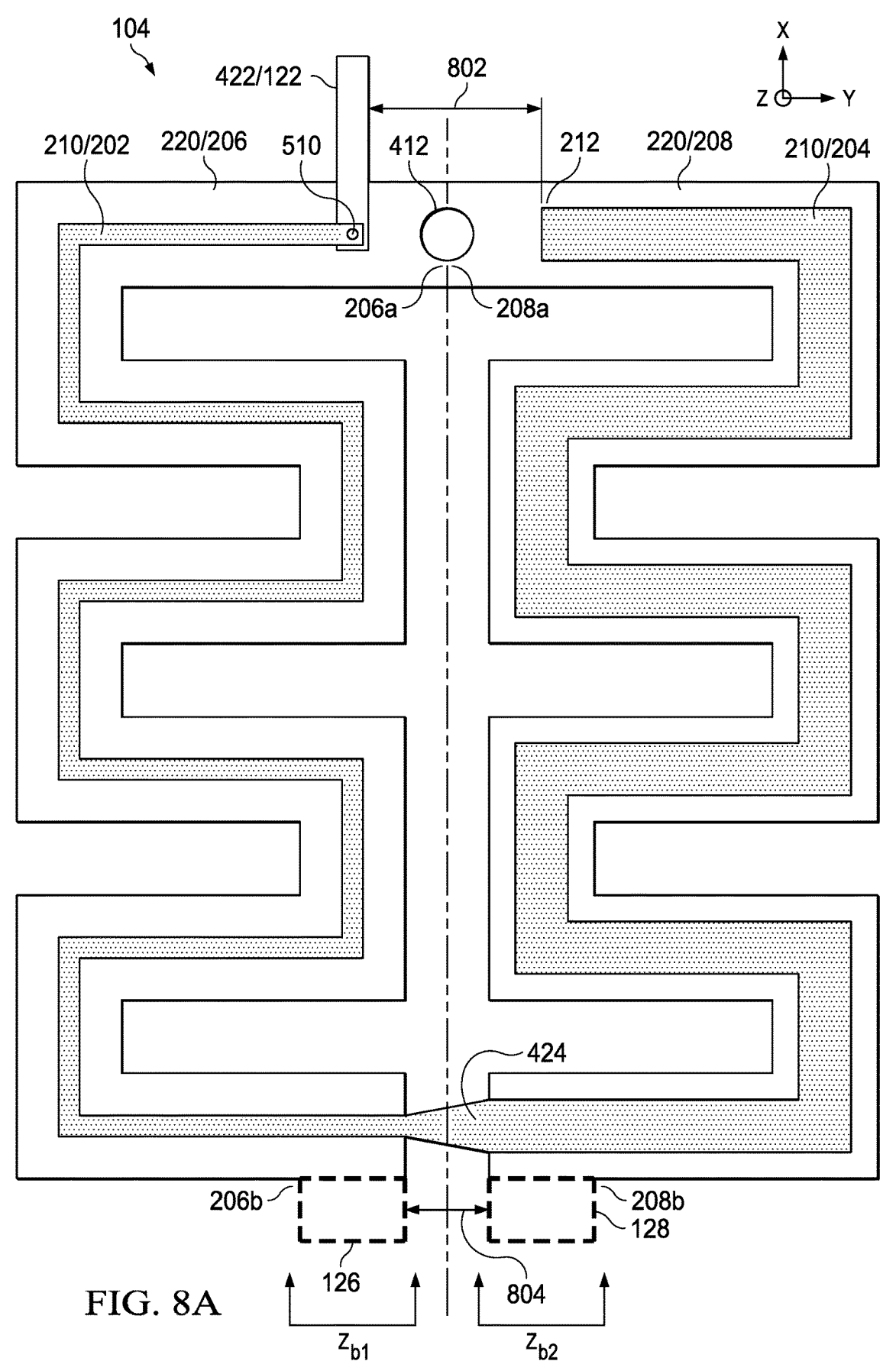
FIG. 8A, FIG. 8B, and FIG. 8C are schematics of a balun that introduces phase imbalance and amplitude balance to the differential signals.

In addition, the physical arrangements of first metal layer 210 and second metal layer 220 can also introduce mismatches in the signal propagation paths along first metal layer 210 and second metal layer 220, which can contribute to amplitude imbalance and phase imbalance between the differential signals. FIG. 8A is a schematic of an example physical arrangement of balun 104 that can lead to mismatches between first metal layer 210 and second metal layer 220 of balun 104. For example, to reduce coupling between signal terminal 122 and open 212, balun 104 can include a gap 802 between signal terminal 122 and open 212. Balun 104 can also include a gap 804 between signal terminals 126 and 128 to prevent electrical shorting between the signal terminals, and to match connections to other circuits (e.g., wires 160 and 162 of FIG. 1A and FIG. 1B). Further, balun 104 can include a segment 424 that electrically couples between segments 202 and 204 of first metal layer 210 over gap 804.

Because of gaps 802 and 804, mismatch can exist in the signal propagation paths along first metal layer 210 and second metal layer 220, which can lead to additional phase shifts and change the phase relationship between the differential signals in segments 206 and 208. Specifically, each of segments 206 and 208 of second metal layer 220 can be configured to provide a quarter wavelength transmission line between via 412 and respective signal terminals 126 and 128. But because of gap 802, the length of each of segments 202 and 204 can become shorter than a quarter wavelength transmission line for the signals. Also, the signal can accrue additional phase shift as it propagates along segment 424 over gap 804. All these can introduce additional phase shifts and increase the phase mismatch between the differential signals.

Figure 8B:
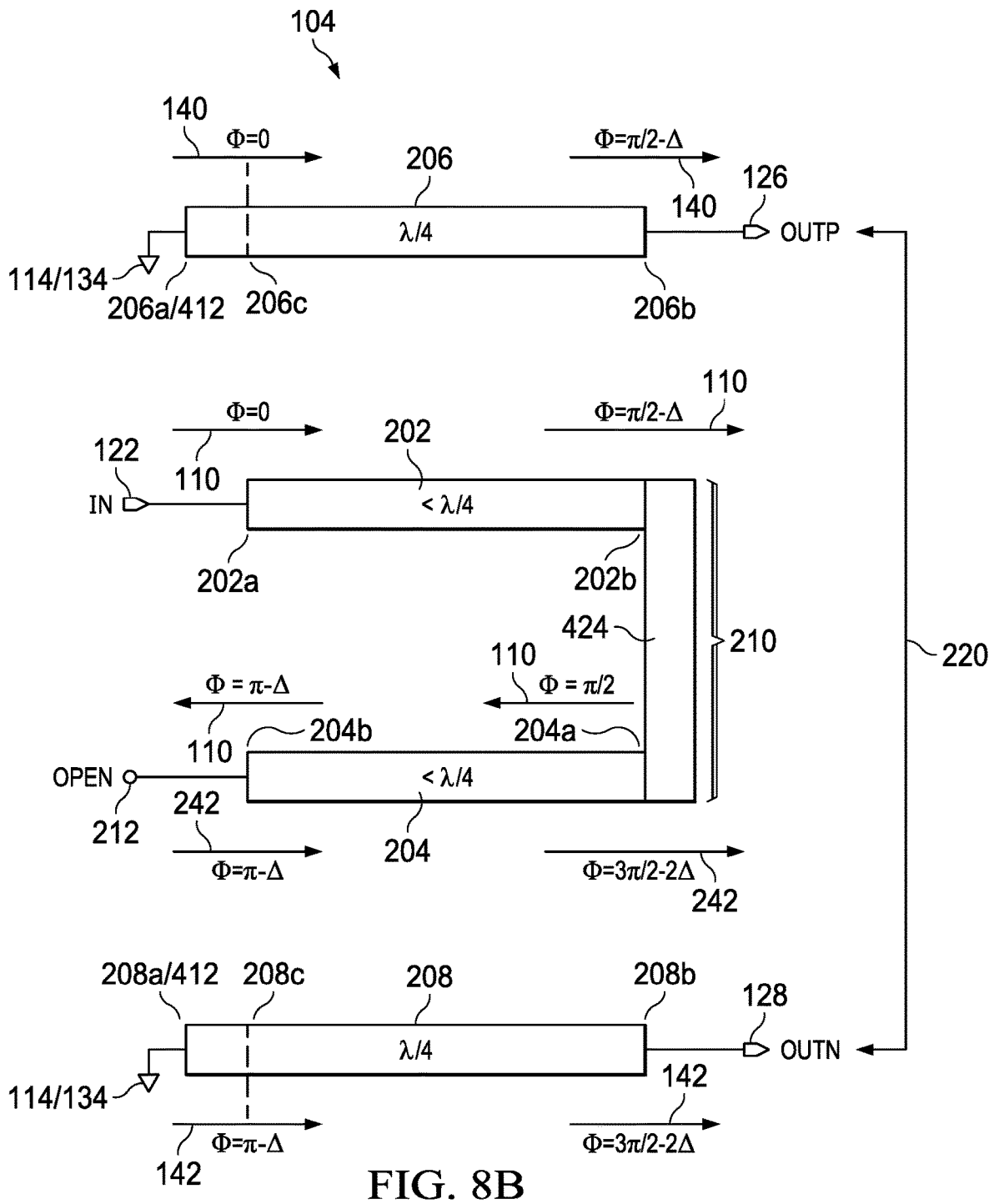
Figure 8C:
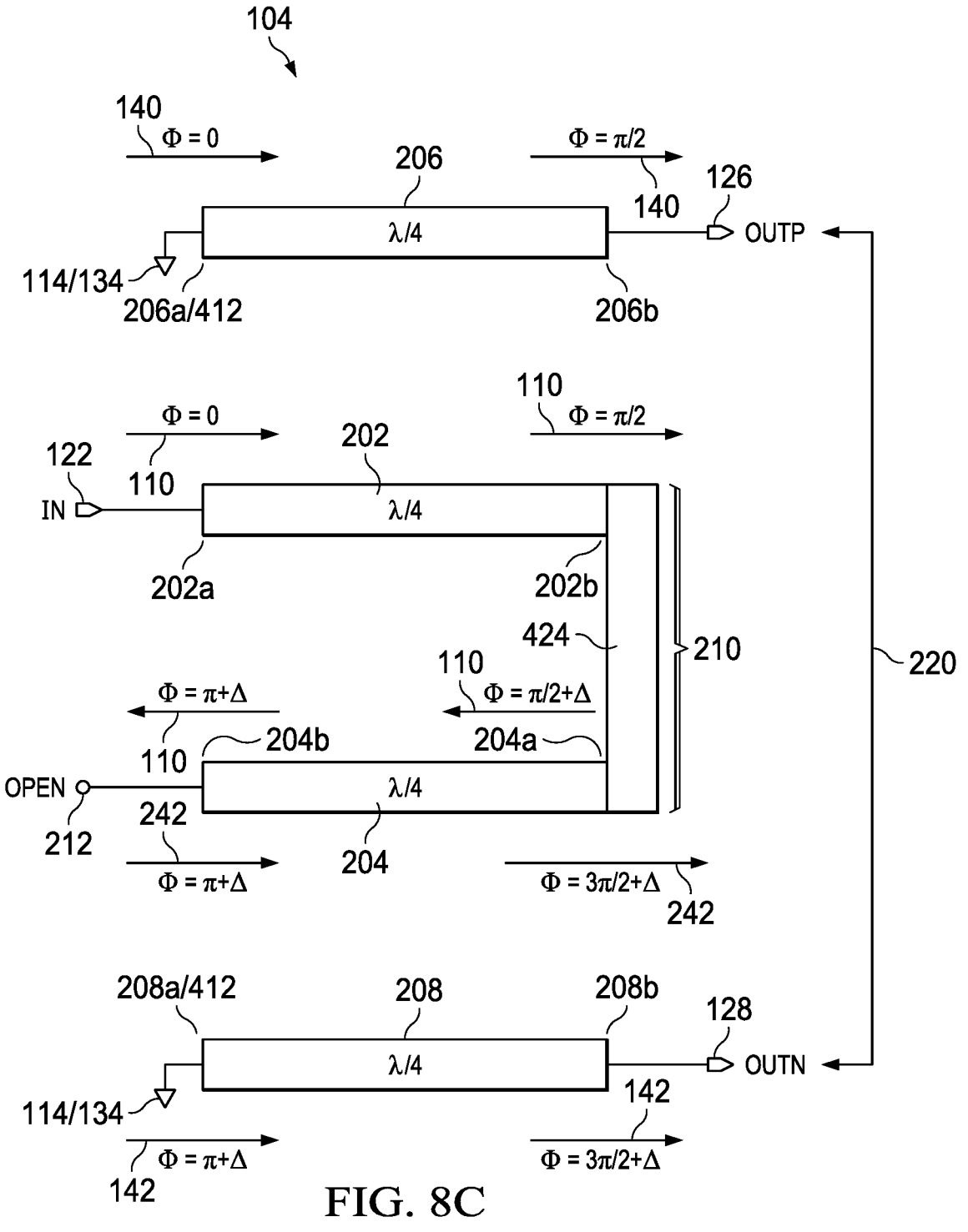

FIG. 8B and FIG. 8C are schematics that illustrate examples of phase mismatch caused by gaps 802 and 804. In FIG. 8B and FIG. 8C, balun 104 can perform a conversion of single-ended signal 110 to differential signals 140 and 142. FIG. 8B illustrates an example where the signal propagation path along first metal layer 210 is shorter than along second metal layer 220. This can be due to gap 802 being larger than gap 804, and segment 424 cannot make up for the reduced lengths of segments 202 and 204. As shown in FIG. 8B, because of gap 802, segment 202 becomes shorter than segment 206, and end 202a of segment 202 does not align with end 206a of segment 206. Instead, end 202a of segment 202 aligns with a point 206c of segment 206. When signal 110 having a zero phase shift ($\Phi$=0) enters segment 202 at end 202a, signal 140 having zero phase is induced at point 206c (instead of end 206a) of segment 206. As signal 110 propagates over a shorter distance than a quarter wavelength from end 202a to end 202b, signal 110 experiences a reduced phase shift of $\pi/2-\Delta$ (rather than $\pi/2$) at end 202b, where $\Delta$ represents a phase error introduced by the shortened segment 202. Output signal 140 also propagates over a shortened distance to reach end 206b and signal output 126. Accordingly, output signal 140 also has a reduced phase shift of $\pi/2-\Delta$ at signal output 126.

After reaching end 202b, signal 110 can propagate across segment 424 over gap 804 to reach end 204a of segment 204. Segment 424 can introduce a phase shift of $\Delta$ (or a different degree) to signal 110. Signal 110 can accrue an additional phase shift of $\Delta$ and can have a phase of $\pi/2$ at end 204a. Segment 204 can also be shorter than a quarter wavelength due to gap 802, and end 204b does not align with end 208a of segment 208. Instead, end 204b aligns with point 208c of segment 208. Signal 110 can accrue an additional phase shift of $\pi/2-\Delta$ after propagating through the shortened distance across segment 204, and can have a phase of $\pi-\Delta$ at end 204b.

Signal 110 can be reflected at open 212 to become reflected signal 242, which also has a phase of $\pi-\Delta$ at end 204b. Signal 242 can induce output signal 142 at point 208c of segment 208 (instead of end 208a), and output signal 142 can have the same phase of $\pi-\Delta$ at point 208c. As signal 242 propagates over a shorter distance than a quarter wavelength from end 204b back to end 204a, signal 242 accrues an additional phase shift of $\pi/2-\Delta$ (rather than $\pi/2$), and can have a phase shift of $3\pi/2-2\Delta$ at end 204a. Output signal 142 can also propagate over the shortened distance to reach end 208b and signal output 128, accrue an additional phase shift of $\pi/2-\Delta$, and have a phase shift of $3\pi/2-2\Delta$ at signal output 128. Accordingly, the phase difference between output signals 140 and 142 (difference between $\pi/2-\Delta$ and $3\pi/2-2\Delta$) becomes $\pi-\Delta$ rather than $\pi$, and a phase imbalance of $\Delta$ is introduced. The phase imbalance can be further exacerbated if the length of each of segments 202, 204, 206, and 208 does not match exactly a quarter of the wavelength of signal 110 due to, for example, limited fabrication precision of balun 104, change in the signal frequency, etc.

In a case where balun 104 of FIG. 8B receives differential signals 180 and 182 and outputs single-ended signal 190, a phase mismatch of $\Delta$ can also be introduced between partial output signals 250 and 252 at signal terminal 122. In the example of FIG. 8B, and in comparison with FIG. 2B, due to segment 202 being shorter than segment 206, partial output signal 250 can have a phase $\Phi$ of $\pi/2-\Delta$ instead of $\pi/2$ at signal terminal 122. Also, due to segment 204 being shorter than segment 208, at open 212/end 204b of segment 204, partial output signal 252 can have a phase $\Phi$ of $3\pi/2-\Delta$ instead of $3\pi/2$ as the signal propagates through the shorter segments 202 and 204 and segment 424. At signal terminal 122, partial output signal 252 can accrue an additional phase shift of $\pi-\Delta$, and can have a phase $\Phi$ of $5\pi/2-2\Delta$. Accordingly, a phase mismatch of Δ is introduced between partial output signals 250 and 252, and distortion may occur in the single-ended signal 190 from the combination of partial output signals 250 and 252.

FIG. 8C illustrates another example where the signal propagation distance in first metal layer 210 is longer than in second metal layer 220. This can be due to gap 802 being smaller than gap 804, and segment 424 introduces extra delay to input signal 110 that leads to phase imbalance. In the example of FIG. 8C, gap 802 can be so small that segment 202 can have the almost the same length (e.g., a quarter wavelength) as segment 206 where end 202a aligns with end 206a, and segment 204 can have almost the same length (e.g., a quarter wavelength) as segment 208 where end 204b aligns with end 208a. When signal 110 having a zero phase shift (Φ=0) enters segment 202 at end 202a, signal 140 having zero phase is induced at point end 206a. As signal 110 propagates over a quarter wavelength distance from end 202a to end 202b, signal 110 experiences a phase shift of π/2 at end 202b. Output signal 140 also propagates over a quarter wavelength distance to reach end 206b and signal output 126. Accordingly, output signal 140 also has a phase shift of π/2 at signal output 126.

After reaching end 202b, signal 110 can propagate across segment 424 over gap 804 to reach end 204a of segment 204. Segment 424 can introduce a phase shift of Δ (or a different degree) to signal 110. Signal 110 can accrue an additional phase shift of Δ and can have a phase of π/2+Δ at end 204a. Segment 204 can have a length equal to a quarter wavelength. Signal 110 can accrue an additional phase shift of π/2 after propagating through segment 204, and can have a phase of π+Δ at end 204b.

Signal 110 can be reflected at open 212 to become reflected signal 242, which also has a phase of π+Δ at end 204b. Signal 242 can induce output signal 142 at end 208a of segment 208, and output signal 142 can have the same phase of π+Δ at point 208a. As signal 242 propagates over a quarter wavelength distance from end 204b back to end 204a, signal 242 accrues an additional phase shift of π/2, and can have a phase shift of 3π/2+Δ at end 204a. Output signal 142 can also propagate over the quarter wavelength distance to reach end 208b and signal output 128, accrue an additional phase shift of π/2, and have a phase shift of 3π/2+Δ at signal output 128. Accordingly, the phase difference between output signals 140 and 142 (difference between π/2 and 3π/2+Δ) becomes π+Δ rather than π, and a phase imbalance of Δ is also introduced. As in FIG. 8B, the phase imbalance can be further exacerbated if the length of each of segments 202, 204, 206, and 208 does not match exactly a quarter of the wavelength of signal 110 due to changes in the signal frequency, which causes the degree of phase imbalance to depend on the signal frequency of input signal 110 and output signals 140 and 142.

In a case where balun 104 of FIG. 8C receives differential signals 180 and 182 and outputs single-ended signal 190, a phase mismatch of Δ can also be introduced between partial output signals 250 and 252 at signal terminal 122. In the example of FIG. 8C, and in comparison with FIG. 2B, partial output signal 250 can have a phase Φ of π/2 at signal terminal 122. Also, partial output signal 252 can accrue an additional phase shift of π+Δ rather than π when reaching signal terminal 122, as the signal propagates over segments 202 and 204 (each having a quarter wavelength of the signal) and segment 424, which introduces the additional phase shift of Δ. Accordingly, a phase mismatch of Δ is also introduced between partial output signals 250 and 252 in FIG. 8C, and distortion may occur in the single-ended signal 190 from the combination of partial output signals 250 and 252.

Also, the amplitude mismatch can be caused by mismatches in the impedances $Z_{b1}$ and $Z_{b2}$ at the respective signal terminals 126 and 128. As described above, the impedances $Z_{b1}$ and $Z_{b2}$ are each related to the length and width of the respective segments 206 and 208 between via 412 and the respective signal terminals 126 and 128, as well as the spacing between each of segments 206 and 208 and another metal layer (e.g., reference layer 414, or shield layer 506), all of which can set the characteristic impedances of segments 206 and 208. In a case where the length equals a quarter of the wavelength of signal 110, the impedances $Z_{b1}$ and $Z_{b2}$ can be based on Equation 1 above. But if segments 206 and 208 have different lengths between via 412 and the respective signal terminals 126 and 128, mismatches can exist between the impedances $Z_{b1}$ and $Z_{b2}$. Various reasons can lead to segments 206 and 208 having different lengths/widths. For example, Segments 206 and 208 can be asymmetrical over axis 410. The asymmetry can be introduced due to, for example, errors caused by finite fabrication precision. For example, via 412 may be placed away from axis 410. As another example, the physical dimensions of segments 206 and 208 may also be different. All these can introduce mismatches in the lengths of segments 206 and 208 between via 412 and the respective signal terminals 126/128, and increase the amplitude imbalance between signals on segments 206 and 208.

One way to reduce phase imbalance is by adjusting the relative physical dimensions of segment 206 and segment 208 to create asymmetry in second metal layer 220. The asymmetry can introduce additional phase shift between output signals 140 and 142 to compensate for the phase imbalance. For example, referring again to FIG. 4A and FIG. 4B, in a case where the signal propagation distance in first metal layer 210 is shorter than in second metal layer 220 due to gap 802 being larger than gap 804, the latitudinal subsegments of second metal layer 220 on the left of axis 410, including subsegments 402a and 406a, can be shrunk with respect to the respective subsegments on the right of axis 410, including subsegments 404a and 408a. This can increase gap 804 as well as the length of segment 424, which can increase the signal propagation distance in first metal layer 210 relative to second metal layer 220. Such arrangements, however, can further increase the amplitude imbalance, due to the increased mismatches in the lengths of segments 206/208 between via 412 and the respective signal terminals 126/128.

In addition to the physical arrangements of the balun, other components of the system that incorporates the balun can induce resonance in the electrical response of the balun. The resonance can lead to reduced impedance of second metal layer 220 at a resonant frequency, which can increase the phase imbalance and amplitude imbalance of output signals 140 and 142.

Figure 9A:
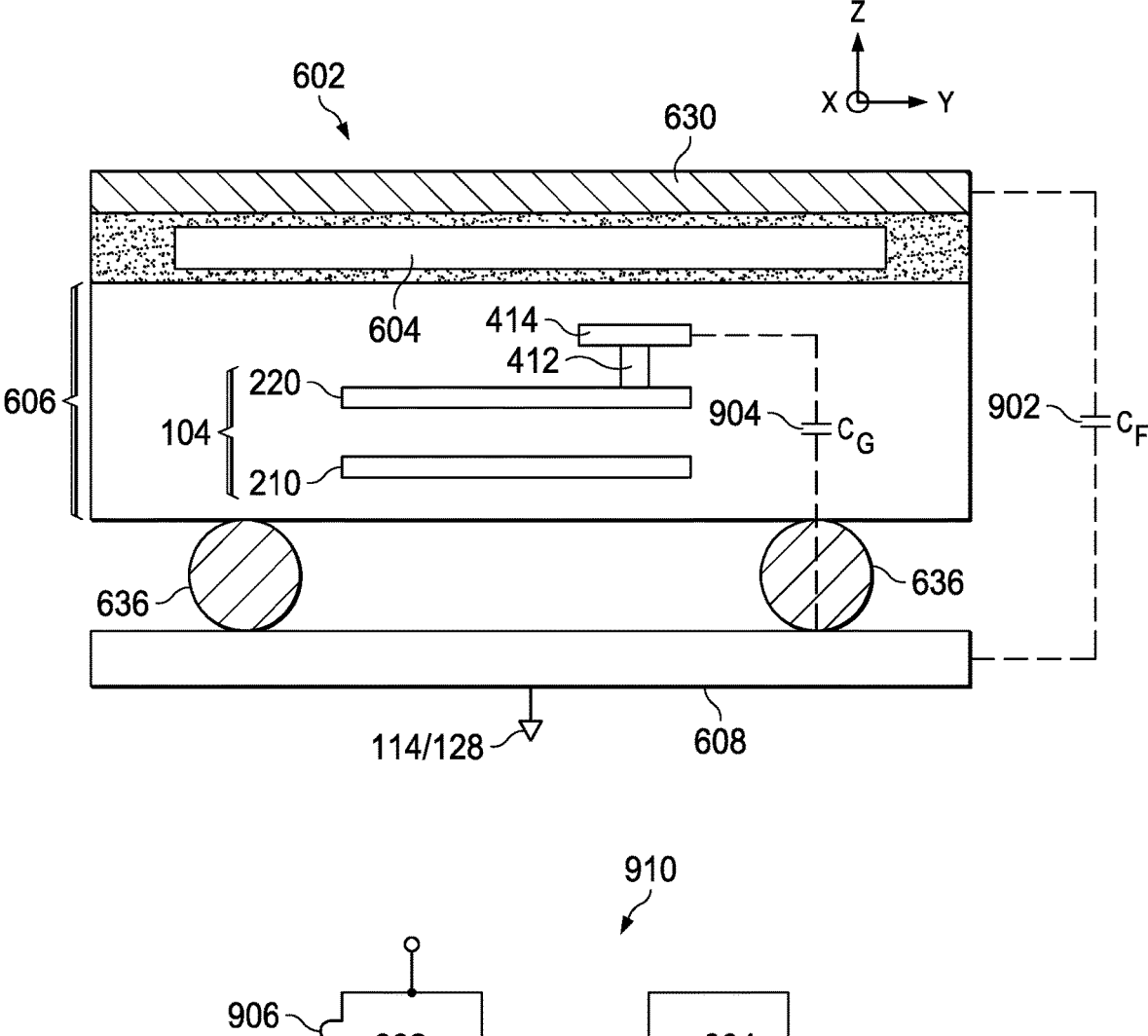
FIG. 9A and FIG. 9B are graphs that illustrate examples of resonance effect introduced by an integrated circuit system including a balun.
Figure 9B:
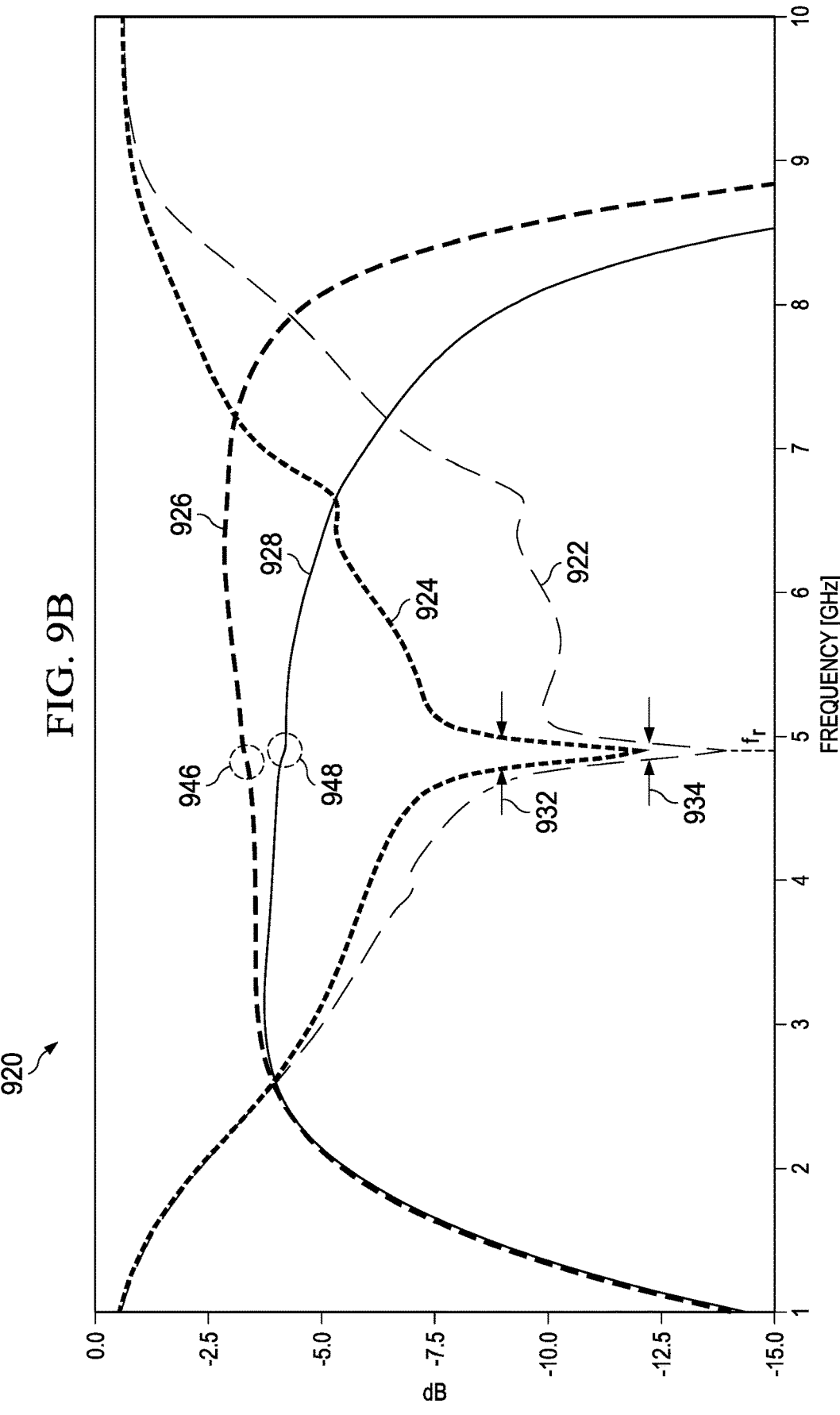

FIG. 9A and FIG. 9B illustrate example resonance effects introduced by system 602 of FIG. 6. As shown on the top of FIG. 9A, system 602 may include metal lid 630 positioned over semiconductor die 604 and package substrate 606 (which includes balun 104) for thermal heat spreading. If metal lid 630 is not electrically connected to PCB 608, which can provide a connection to voltage references 114/134, metal lid 630 and PCB 608 can form a capacitor 902 in parallel with balun 104, which one plate of the capacitor 902 floating, and the other plate of capacitor 902 electrically coupled to the ground via solder balls 636 and PCB 608.

Capacitor 902 can have a capacitance of $C_F$, which can depend on various factors including the area of balun 104 exposed to metal lid 630, the separation between metal lid 630 and PCB 608, the dielectric constant of core substrate 652, etc.

In addition, second metal layer 220 of balun 104 is electrically coupled to reference layer 414, which is also electrically coupled to voltage references 114/134 via PCB 608. Reference layer 414, together with PCB 608, can also form a capacitor 904 in parallel with balun 104, with both plates of capacitor 904 electrically coupled to the ground. Capacitor 904 can have a capacitance of $C_G$, which can depend on the area of reference layer 414. The capacitance $C_G$ can also reflect the amount of electrical connection between metal lid 630 and voltage references 114/134. Reference layer 414 shields part of balun 104 from metal lid 630 and reduces the exposure of balun 104 to metal lid 630, which decreases the capacitance $C_F$ of capacitor 902. Accordingly, if the area of reference layer 414 (and $C_G$ of capacitor 904) increases, the capacitance $C_F$ of capacitor 902 decreases, and vice versa.

The bottom of FIG. 9A illustrates a circuit model 910 of balun 104, which includes a resonance circuit including capacitors 902 and 904, and an inductor 906 that represents the inductance $L_B$ of balun 104. Capacitor 902 and inductor 906 can be coupled in parallel between a floating node representing metal lid 630 and ground references 114/134, and capacitor 904 having both plates electrically coupled to ground references 114/134. Balun 104 can have a resonant frequency $f_r$ that depends on inductance $L_B$ and capacitance $C_F$, according to the following Equation:

$$f_r = \frac{1}{2\pi\sqrt{L_B C_F}} \qquad \text{(Equation 3)}$$

Although capacitance $C_G$ is not part of Equation 3, if capacitance $C_G$ increases, capacitance $C_F$ can decrease, which can increase the resonant frequency $f_r$. Also, if capacitance $C_G$ decreases, capacitance $C_F$ can increase, which can decrease the resonant frequency $f_r$.

Also, as described above in Equation 2, the characteristic impedance $Z_0$ and impedances of signal terminals 126/128 of balun 104, $Z_{b1}$ and $Z_{b2}$ are frequency-dependent, and both impedances can be minimized (or at least reduced) at the resonant frequency $f_r$. FIG. 9B is a graph 920 that illustrates example variations of return losses and transmission responses of balun 104 with respect to signal frequency as part of system 602 in FIG. 9A, in a case where balun 104 converts a single-ended signal at signal terminal 122 to differential signals at signal terminals 126 and 128. In graph 920, plot 922 can represent the variation of return loss at signal terminal 126, and plot 924 can represent the variation of return loss at signal terminal 128. Also, plot 926 can represent the variation of amplitude of transmission response from signal terminal 122 to terminal 126, and plot 928 can represent the variation of amplitude of transmission response from signal terminal 122 to signal terminal 128. In a case of zero amplitude imbalance, plots 922 and 924 can completely overlap with each other, plots 926 and 928 can also completely overlap with each other, and the gap between plots 926 and 928 can represent the extent of amplitude imbalance. Also, in a case where the return loss is large negative, the impedances $Z_{b1}$ and $Z_{b2}$ can be closer to the reference impedance, and the amplitude of transmission response can increase. But changes of return losses with respect to the signal frequency can also lead to changes in the impedances $Z_{b1}$ and $Z_{b2}$ and the amplitude of transmission response with respect to the signal frequency, which can be undesirable.

In graph 920, mismatches can exist between plots 922 and 924 and between plots 922 and 924 starting from the signal frequency of 2.5 GHz. Also, plot 922 has a notch 932, and plot 924 has a notch 934. Both notches 932 and 934 center around 5 GHz, which can indicate that the resonant frequency $f_r$ is at around 5 GHz, and the return losses experience rapid changes and become more negative as the signal frequency approaches the resonant frequency. The rapid changes of the return losses are also reflected in plots 926 and 928, where the transmission responses from signal terminal 122 to each of signal terminals 126 and 128 experience respective amplitude jumps 946 and 948 at the resonant frequency. Such amplitude jumps can be undesirable as the transmission responses become even more frequency-dependent and further increase the amplitude imbalance between the differential signals. The phase imbalance may also increase more rapidly beyond the 5 GHz resonant frequency. Accordingly, it is desirable to move the resonant frequency out of the frequency range of input/output signals of the balun, to reduce the effects of resonance on amplitude imbalance and phase imbalance.

Figure 10:
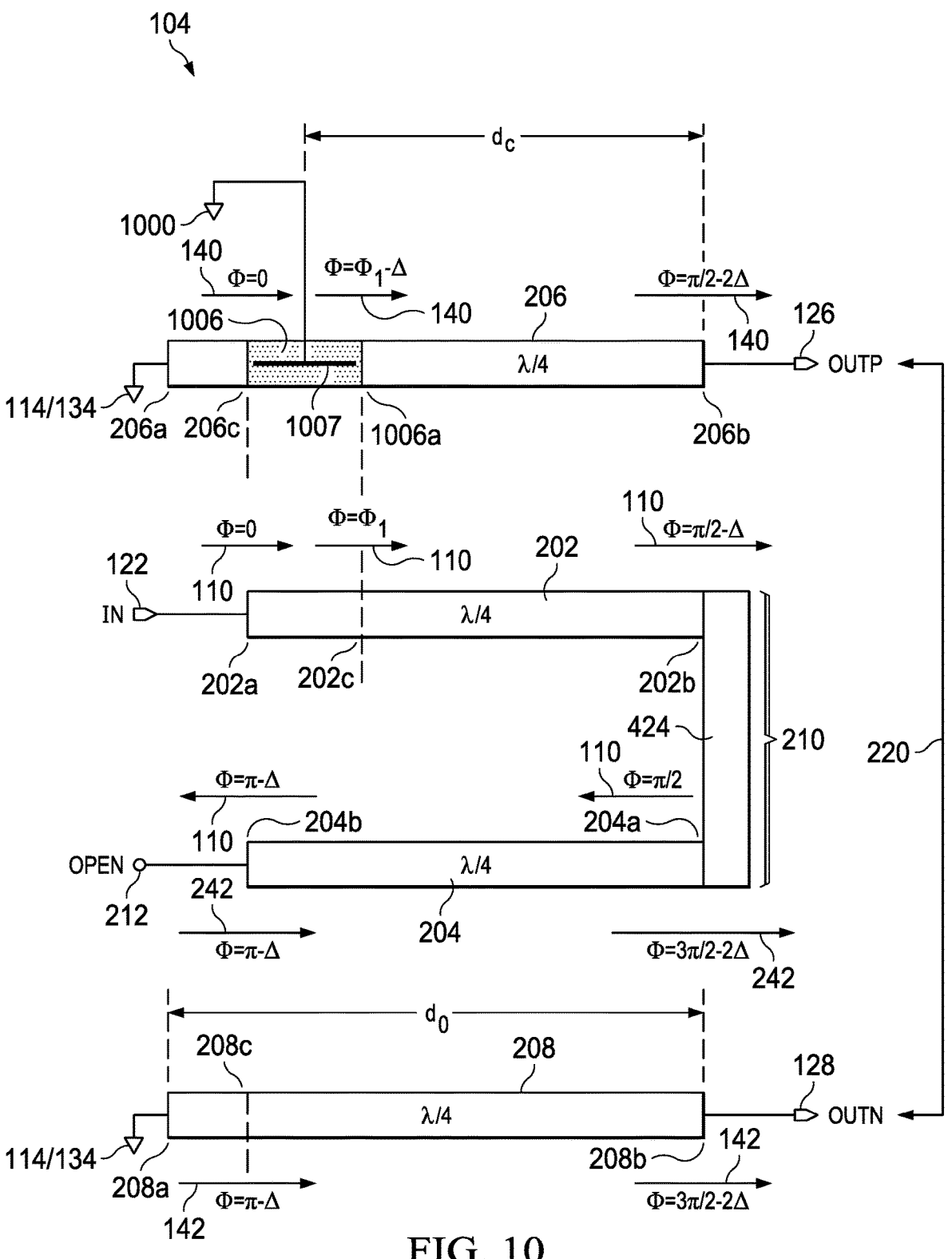
FIG. 10 and FIG. 11 are schematics that illustrate example techniques to reduce phase imbalance of a balun.
Figure 11:
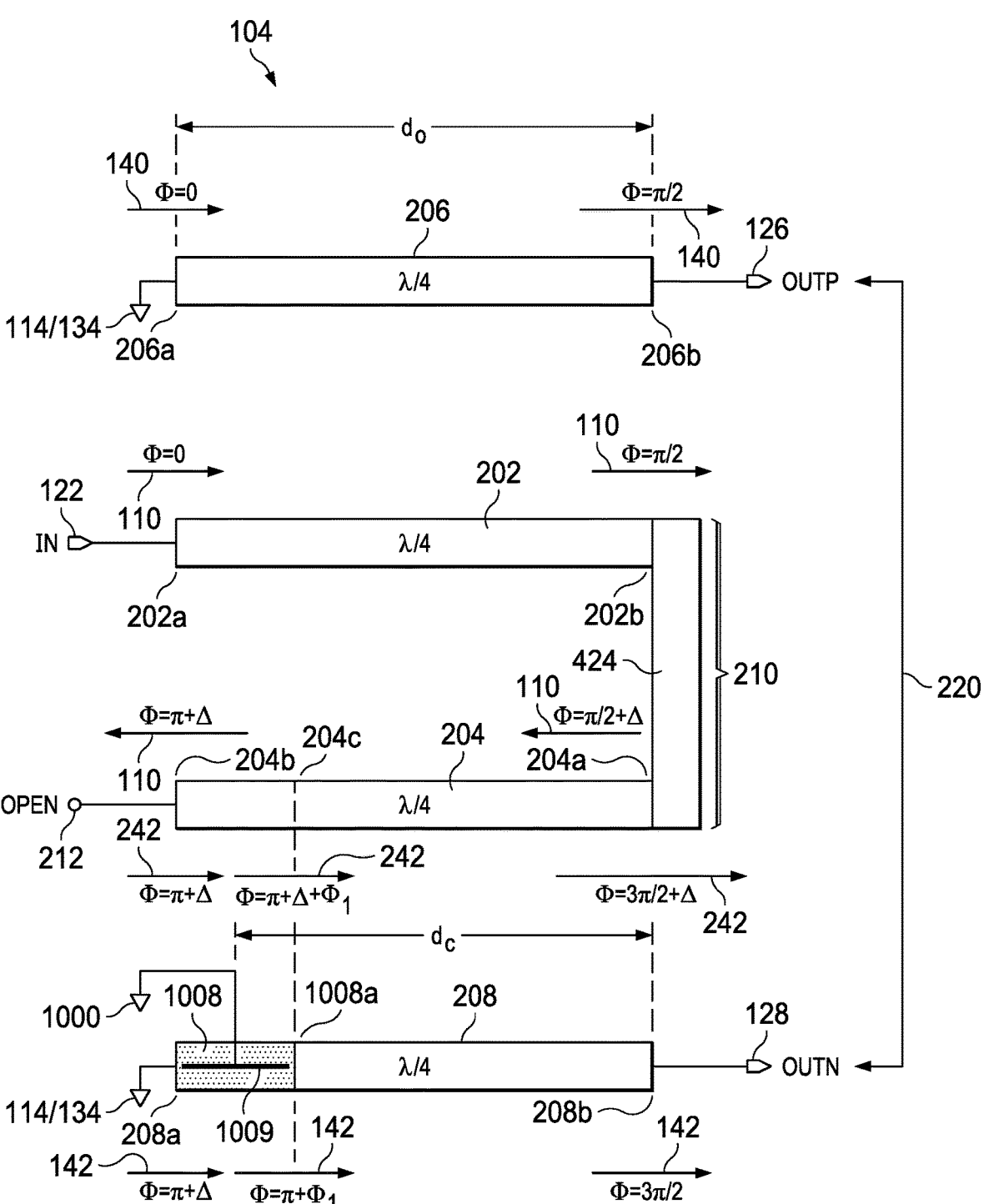

FIGS. 10 and 11 are schematics that illustrate example techniques to improve phase imbalance of balun 104. As shown in FIG. 10 and FIG. 11, balun 104 can include a phase adjustment device that electrically couples a subsegment of segments 206 or 208 to a voltage reference 1000. For example, in FIG. 10, balun 104 can include a phase adjustment device 1007 that electrically couple a subsegment 1006 of segment 206 to voltage reference 1000 via a reference terminal, where phase adjustment device 1007 can extend along a propagation direction of signal 140 in subsegment 1006. Also, in FIG. 11, balun 104 can include a phase adjustment device 1009 that electrically couples a subsegment 1008 of segment 208 to voltage reference 1000 via a reference terminal, where phase adjustment device 1009 can extend along a propagation direction of signal 142 in subsegment 1008. In some examples, voltage reference 1000 can include voltage references 114/134 that are electrically coupled to end 206a of segment 206 and end 208a of segment 208, and phase adjustment devices 1007 and 1009 can be electrically coupled to reference terminal 124. In some examples, voltage reference 1000 can be a different voltage, and phase adjustment devices 1007 and 1009 can be electrically coupled to a different reference terminal that provide access to voltage reference 1000. As to be described below, each of phase adjustment devices 1007 and 1009 can include, for example, a set of vias to a reference metal layer that is on or above second metal layer 220, such as reference layer 414, a metal strip coupled between a side of the subsegment and an external connection to voltage reference 1000, the external connection being external to second metal layer 220. Examples of the external connection can include metal shield layer 504 of shield structure 502, and vias to reference layer 414 (or other reference metal layers). In both FIG. 10 and FIG. 11, first metal layer 210 and second metal layer 220 can be arranged sideways on the x-y plane as shown in FIG. 3, or form a vertical stack as shown in FIG. 4A and FIG. 4B.

Each of subsegments 1006 and 1008, with the respective phase adjustment devices 1007 and 1009 electrically coupled to voltage reference 1000, can introduce an additional phase shift between signals on first metal layer 210 and on second metal layer 220. The phase shift can compensate for the phase difference introduced by, for example, gaps 802 and 804 of balun 104 in FIG. 8, and the phase imbalance can be reduced.

Subsegment 1006 and phase adjustment device 1007 of FIG. 10 can improve the example phase imbalance scenario described in FIG. 8B. Specifically, referring to FIG. 10, subsegment 1006 can be aligned with end 202*a* of segment 202 to slow down the propagation of signal 140 in segment 206, thereby introducing a phase shift between signals 110 and 140. When input signal 110 having a zero phase shift (Φ=0) enters segment 202 at end 202*a*, signal 140 having zero phase is induced at point 206*c* (instead of end 206*a*) of segment 206. Due to the electrical connection between subsegment 1006 and voltage reference 1000, the propagation of signal 140 in subsegment 1006 can become slower than the propagation of signal 110 in segment 202, which reduces the phase shift experienced by signal 140 and shifts the starting point of signal 140 away from point 206*c*. Accordingly, at a point 202*c* (of segment 202) that aligns with an end 1006*a* of subsegment 1006, signal 110 can have a phase shift of $\Phi_1$, whereas signal 140 at end 1006*a* can have a reduced phase shift less than $\Phi_1$. After propagating over a reduced distance in segment 206, signal 140 can have a phase shift of $\pi/2-2\Delta$ at signal terminal 126. Compared with FIG. 8B, the phase shift of signal 140 is reduced by Δ at signal terminal 126.

In addition, as in FIG. 8B, signal 110 propagates over a shorter distance than a quarter wavelength from end 202*a* to end 202*b* and experiences a reduced phase shift of $\pi/2-\Delta$ at end 202*b*. After reaching end 202*b*, signal 110 can propagate across segment 424 over gap 804 to reach end 204*a* of segment 204, accrue an additional phase shift of Δ, and signal 110 can have a phase of $\pi/2$ at end 204*a*. Signal 110 can accrue an additional phase shift of $\pi/2-\Delta$ after propagating through the shortened distance across segment 204, and can have a phase of $\pi-\Delta$ at end 204*b*. Signal 110 can be reflected at open 212 to become reflected signal 242, which also has a phase of $\pi-\Delta$ at end 204*b*. Signal 242 can induce output signal 142 at point 208*c* of segment 208 (instead of end 208*a*), and output signal 142 can have the same phase of $\pi-\Delta$ at point 208*c*. Output signal 142 can also propagate over the shortened distance to reach end 208*b* and signal terminal 128, accrue an additional phase shift of $\pi/2-\Delta$, and have a phase shift of $3\pi/2-2\Delta$ at signal terminal 128.

In FIG. 10, as subsegment 1002 introduces an additional phase shift of Δ between input signal 110 and output signal 140, output signal 140 can have an adjusted phase shift of $\pi/2-2\Delta$ at signal output 126, while the phase shift of output signal 142 at signal output 128 remains at $3\pi/2-2\Delta$. Accordingly, the phase difference between output signals 140 and 142 (difference between $\pi/2-2\Delta$ and $3\pi/2-2\Delta$) can be equal to (or close to) π, and the phase balance between output signals 140 and 142 can be improved.

The arrangements of FIG. 10 can also improve the phase imbalance in a case where balun 104 of FIG. 8B is configured to convert differential signals to single-ended signal. Specifically, referring again to FIG. 8B, due to segment 202 being shorter than segment 206, partial output signal 250 can have a phase Φ of $\pi/2-\Delta$ instead of $\pi/2$ at signal terminal 122. But with phase adjustment device 1007 slowing down partial output signal 250 by an additional A, partial output signal 250 can have a phase Φ of $\pi/2-2\Delta$ at signal terminal 122. Also, partial output signal 252 can have a phase Φ of $5\pi/2-2\Delta$. Accordingly, the phase mismatch Δ can be removed/reduced, and partial output signals 250 and 252 can have a full cycle phase difference, which can reduce the distortions in single-ended signal 190.

Moreover, subsegment 1008 and phase adjustment device 1009 of FIG. 11 can improve the example phase imbalance scenario described in FIG. 8C. Specifically, referring to FIG. 11, subsegment 1008 can be aligned with end 204*b* of segment 204 to slow down the propagation of signal 142 in segment 208, thereby introducing a phase shift between reflected signal 242 and 142. When input signal 110 having a zero phase shift (Φ=0) enters segment 202 at end 202*a*, signal 140 having zero phase is induced at end 206*a* of segment 206. Signal 140 can have a phase shift of $\pi/2$ at signal output 126 after propagating through a quarter wavelength distance in segment 206. Signal 110 also propagates through segments 202, 424, and 204 and reach end 204*b*, where signal 110 has a phase shift of $\pi+\Delta$, as described in FIG. 8C. Signal 110 can be reflected at open 212 to become reflected signal 242, which also has a phase of $\pi+\Delta$ at end 204*b*. Signal 242 can induce output signal 142 at end 208*a* of segment 208, and output signal 142 can have the same phase of $\pi+\Delta$ at point 208*a*.

As signal 142 propagates through subsegment 1008, due to the electrical connection between subsegment 1008 to voltage reference 1000, the propagation of signal 142 in subsegment 1008 can become slower than the propagation of signal 242 in segment 204, which reduces the phase shift experienced by signal 142 and shifts the starting point of signal 142 away from end 208*a*. Accordingly, at a point 204*c* (of segment 204) that aligns with an end 1008*a* of subsegment 1008, signal 142 can have a phase shift of $\pi+\Delta-\Phi_1$, whereas signal 142 at end 1008*a* can have a reduced phase shift less than $\pi+\Delta+\Phi_1$. To compensate for phase imbalance of Δ introduced by segment 424, the length of subsegment 1008 between end 208*a* and end 1008*a*, which can be defined by the length of phase adjustment device 1009, can also be configured to reduce the phase shift of signal 142 by Δ, and signal 142 can have a phase shift of $\pi+\Phi_1$ at end 1008*a*. After propagating over a quarter wavelength distance in segment 208, signal 142 can accrue an additional phase shift of $\pi/2$, and have a phase shift of $3\pi/2$ at signal output 126. Compared with FIG. 8C, the phase shift of signal 142 is reduced by Δ at signal output 128. Accordingly, the phase difference between output signals 140 and 142 (difference between $\pi/2$ and $3\pi/2$) can be equal to (or close to) π, and the phase balance between output signals 140 and 142 can also be improved.

The arrangements of FIG. 11 can also improve the phase imbalance in a case where balun 104 of FIG. 8C is configured to convert differential signals to single-ended signal. Specifically, referring again to FIG. 8C, partial output signal 250 can have a phase Φ of $\pi/2$ at signal terminal 122, whereas partial output signal 252 can accrue an additional phase shift of $\pi+\Delta$ rather than π when reaching signal terminal 122, and can have a phase Φ of $5\pi/2+\Delta$ at signal terminal 122. With phase adjustment device 1009, signal 182 can be slowed down and can have a phase shift of $\pi-\Delta$ at end 208*a*. Partial output signal 250 can also have a phase Φ of $\pi-\Delta$ at end 204*b*, and a phase Φ of $5\pi/2$ at signal terminal 122. Accordingly, the phase mismatch Δ can be removed/reduced, and partial output signals 250 and 252 can have a full cycle phase difference, which can reduce the distortions in single-ended signal 190.

As described above, one way to improve phase imbalance is by adjusting the relative physical dimensions of segment 206 and segment 208 to create asymmetry in second metal layer 220. Compared with such arrangements, the techniques described in FIG. 10 and FIG. 11 can provide various advantages. For example, adjusting the relative physical dimensions of segment 206 and segment 208 can increase mismatches in the lengths of segments 206/208 between via 412 and the respective signal outputs 126/128, which can increase mismatches in the impedances $Z_{b1}$ and $Z_{b2}$ at signal terminals 126/128 and introduce additional amplitude imbalance. In contrast, with the techniques described in FIG. 10 and FIG. 11, phase adjustment devices 1007 and 1009 can be placed close to, respectively, end 206a of segment 206 and end 208a of segment 208, both of which are coupled to via 412 and reference layer 414 to provide a low impedance voltage reference. Referring to FIG. 10, this can reduce the mismatch in the distance between the low impedance voltage reference and the signal terminal in a segment that has the phase adjustment device (labelled $d_c$ in FIG. 10 and FIG. 11) and the distance between via 412 and the signal output in the other segment that does not have the phase adjustment device (labelled $d_0$ in FIG. 10 and FIG. 11). Accordingly, the mismatch in the output impedances $Z_{b1}$ and $Z_{b2}$, and the additional amplitude imbalance introduced, can be reduced.

Also, the techniques of FIG. 10 and FIG. 11 can improve the flexibility in configuring balun 104 to reduce phase imbalance. Specifically, changes to the physical arrangements of segments 206 and 208, including the lengths of the segments, the size of gaps 802 and 804, etc., may be constrained by various factors, such as connectivity with other circuit components, design rules, etc. For example, in adjusting the relative physical dimensions of segment 206 and segment 208, the locations of signal outputs 126 and 128 may also be altered as well. But the locations of signal outputs 126 and 128 may be constrained by, for example, the location of other circuit components electrically coupled to signal outputs 126 and 128, such as wires 160 and 162 and processing circuit 106 of FIG. 1. Also, design rules may impose limit on various aspects of the physical arrangements of segments 206 and 208, such as locations of segments 206 and 208, separation distances between signal outputs 126 and 128, separation distances between different subsegments of segment 206 and segment 208, etc. Such constraints can limit the amount of changes to segments 206 and 208, which in turn can limit the achievable amount of phase imbalance reduction. As the degree of phase imbalance can depend on the signal frequency of input signal 110 and output signals 140 and 142, such limitations can also limit the range of signal frequency for which balun 104 can be configured to achieve a certain degree of phase imbalance.

In contrast, with the techniques of FIG. 10 and FIG. 11, the length of phase adjustment device can define the amount of phase shift introduced between output signals 140 and 142 as well as the amount of phase imbalance reduction. Phase imbalance reduction can be achieved without changing, for example, the locations of segments 206 and 208, separation distances between signal outputs 126 and 128, separation distances between different subsegments of segment 206 and segment 208, etc. Accordingly, the phase imbalance reduction can be independent from (or at least less affected by) the constraints imposed by connectivity with other circuit components and design rules. This also allows balun 104 to be configured to achieve a target degree of phase imbalance over a wide range of signal frequency and improve the performance of balun 104.

Figure 12A:
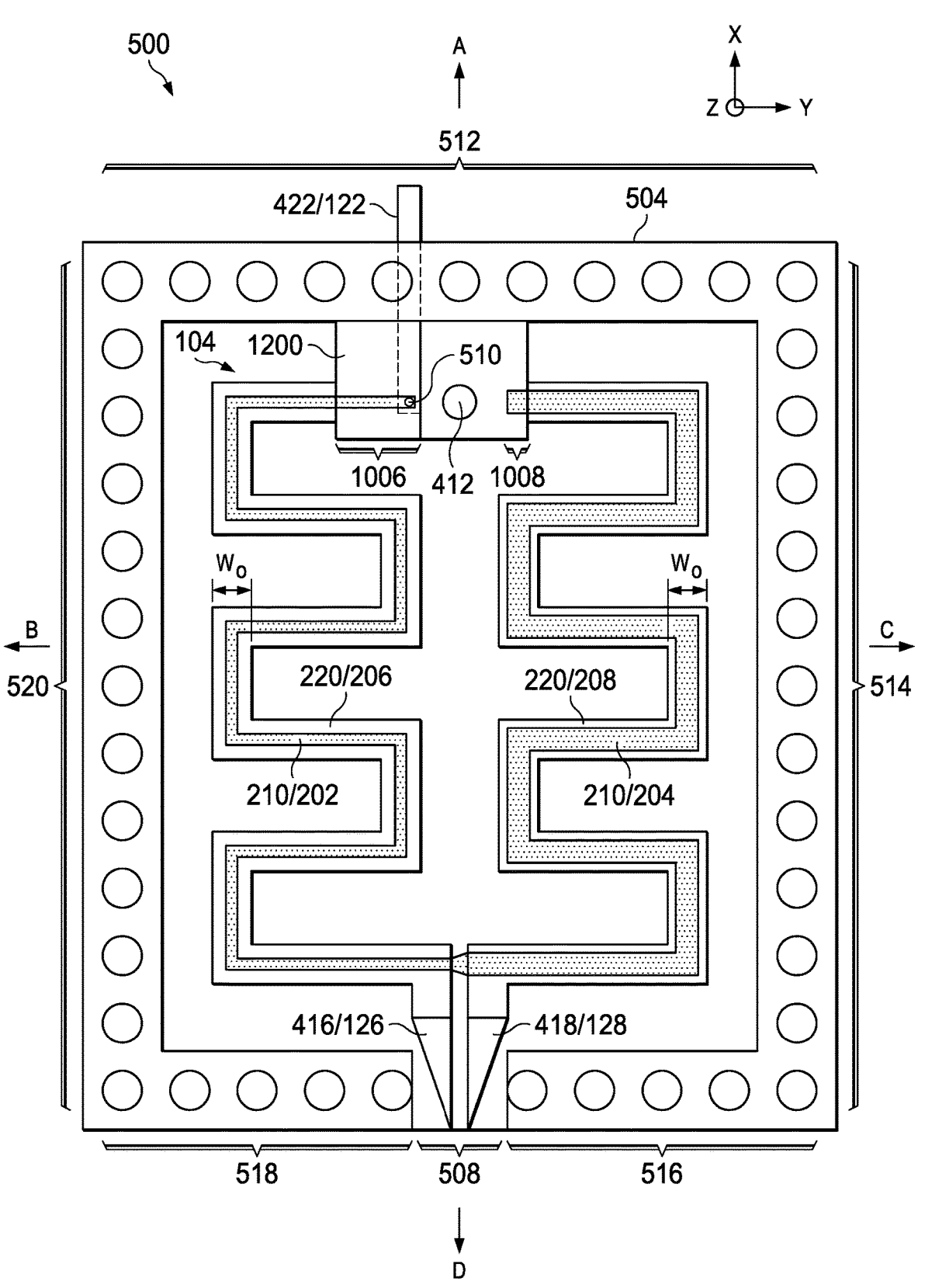
FIGS. 12A through 15B are schematics that illustrate examples of phase adjustment devices to reduce phase imbalance of a balun.
Figure 12B:
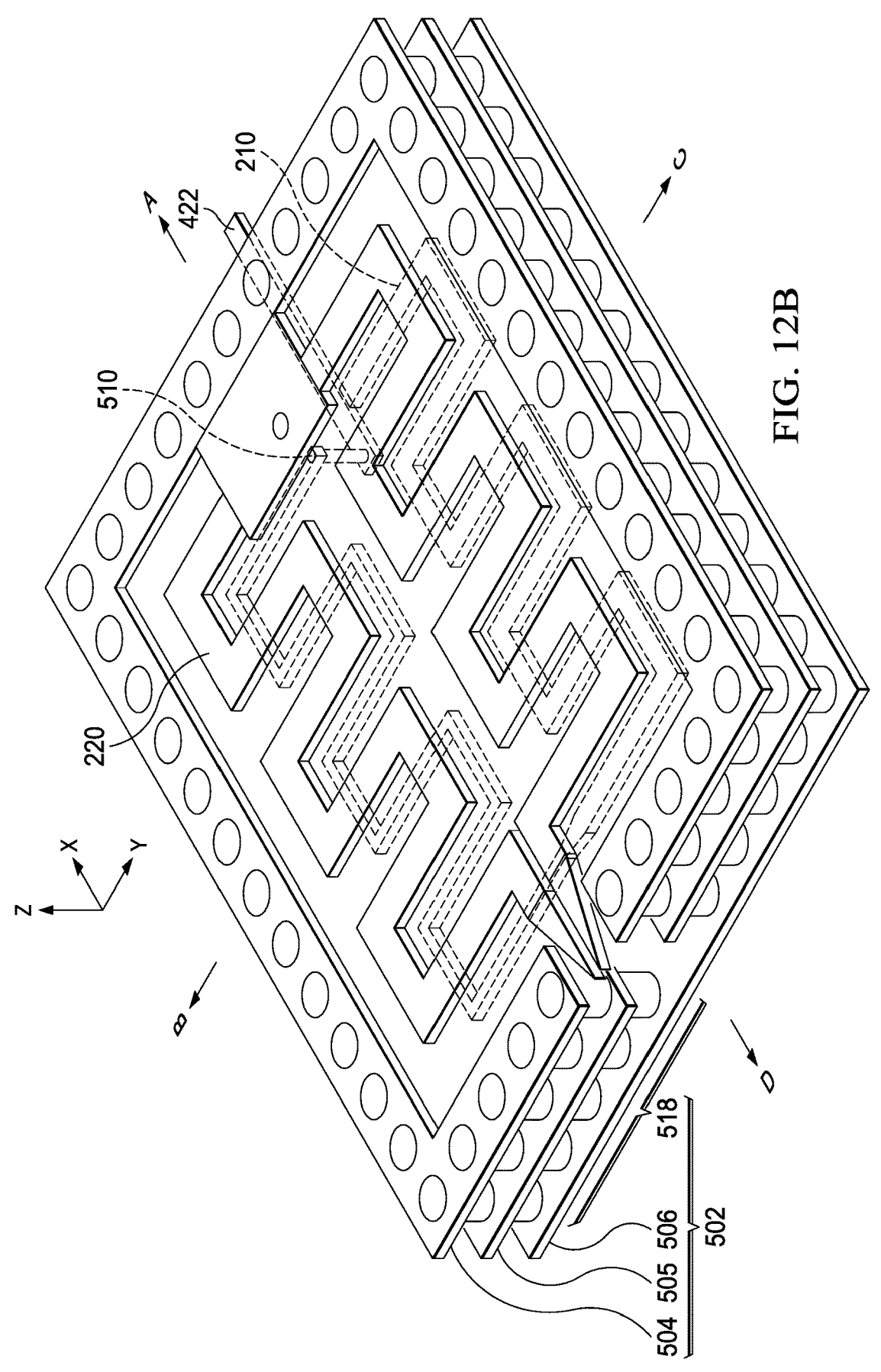

FIGS. 12A through 15B are schematics that illustrate examples of a phase adjustment device. FIG. 12A and FIG. 12B illustrate, respectively, a top view and a perspective view of an example balun module 500 having a phase adjustment device 1200. As shown in FIG. 12A and FIG. 12B, phase adjustment device 1200 can be electrically coupled between second metal layer 220 and metal shield layer 504 of shield structure 502 to electrically couple subsegment 1006 to voltage reference 1000. Phase adjustment device 1200 can include a metal strip in the same metal layer as second metal layer 220, and merge with subsegment 1006 (of segment 206) over metal segment 422 (which forms signal terminal 122) and via 510. In some examples, the metal strip of phase adjustment device 1200 can be in a different metal layer from second metal layer 220 and can be electrically coupled to second metal layer 220 by a set of blind vias.

Figure 13:
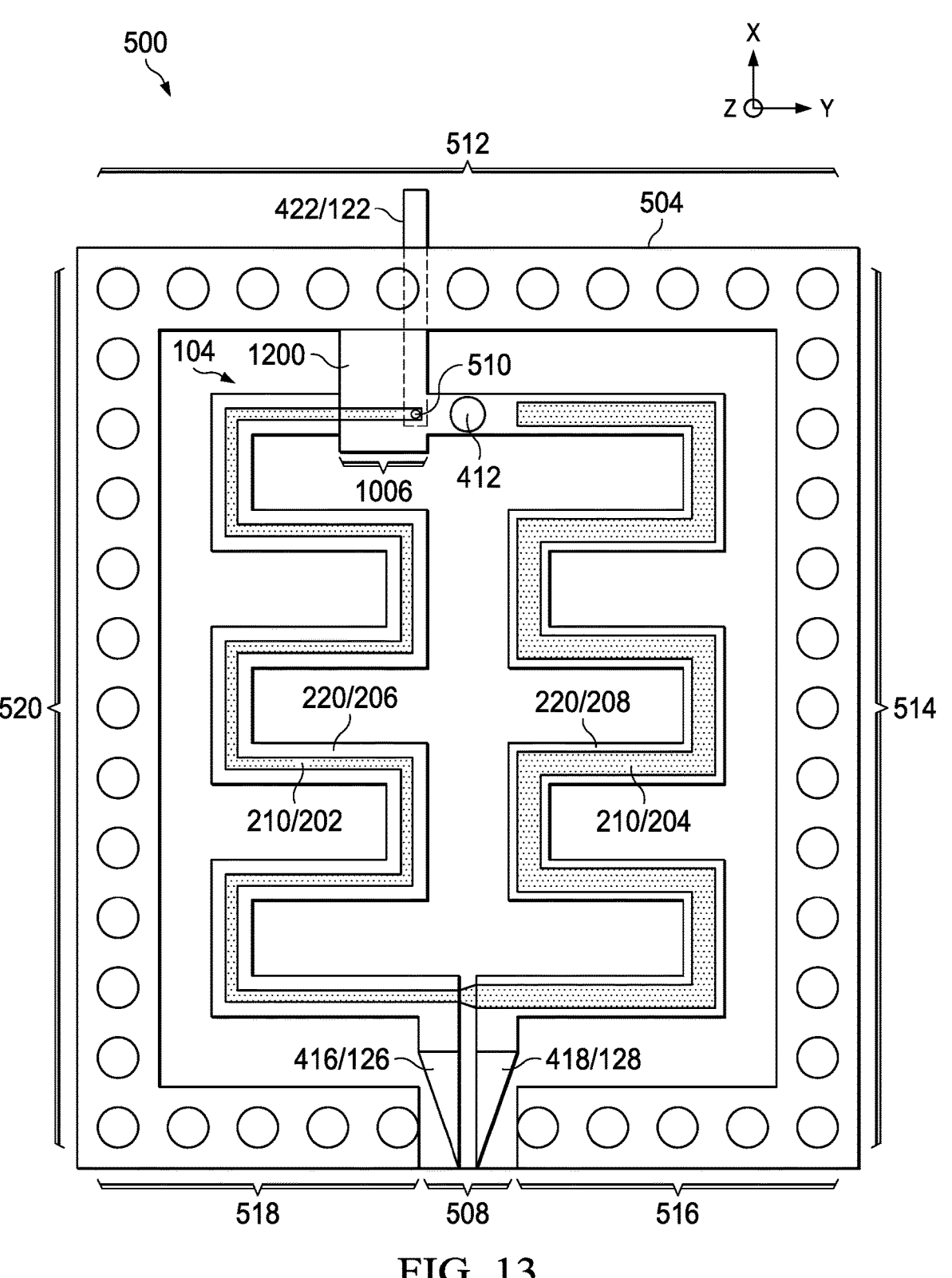

Phase adjustment device 1200 can proximate center tap 411 (represented by via 412 in FIGS. 12A through 15B). In the examples of FIG. 12A and FIG. 12B, phase adjustment device 1200 can extend over via 412 and merge with part of segment 208 to form subsegment 1008. In such examples, phase adjustment device 1200 can include a first strip on a side of subsegment 1006, a second strip on a side of via 412, and a third strip on a side of subsegment 1008. Such arrangements can provide an additional connection to a low impedance voltage reference at via 412, which can further reduce the impedance of via 412. Also, in the example of FIG. 13, phase adjustment device 1200 electrically couples between subsegment 1006 of segment 206 and metal shield layer 504. Phase adjustment device 1200 can be adjacent to center tap 411 and via 412 but does not extend over them. In the examples of FIG. 12A, FIG. 12B, and FIG. 13, phase adjustment device 1200 can also extend over a width of subsegment 1006 and/or subsegment 1008 (e.g., along the x direction in FIG. 12A, FIG. 12B, and FIG. 13) to widen the respective subsegments.

Figure 14A:
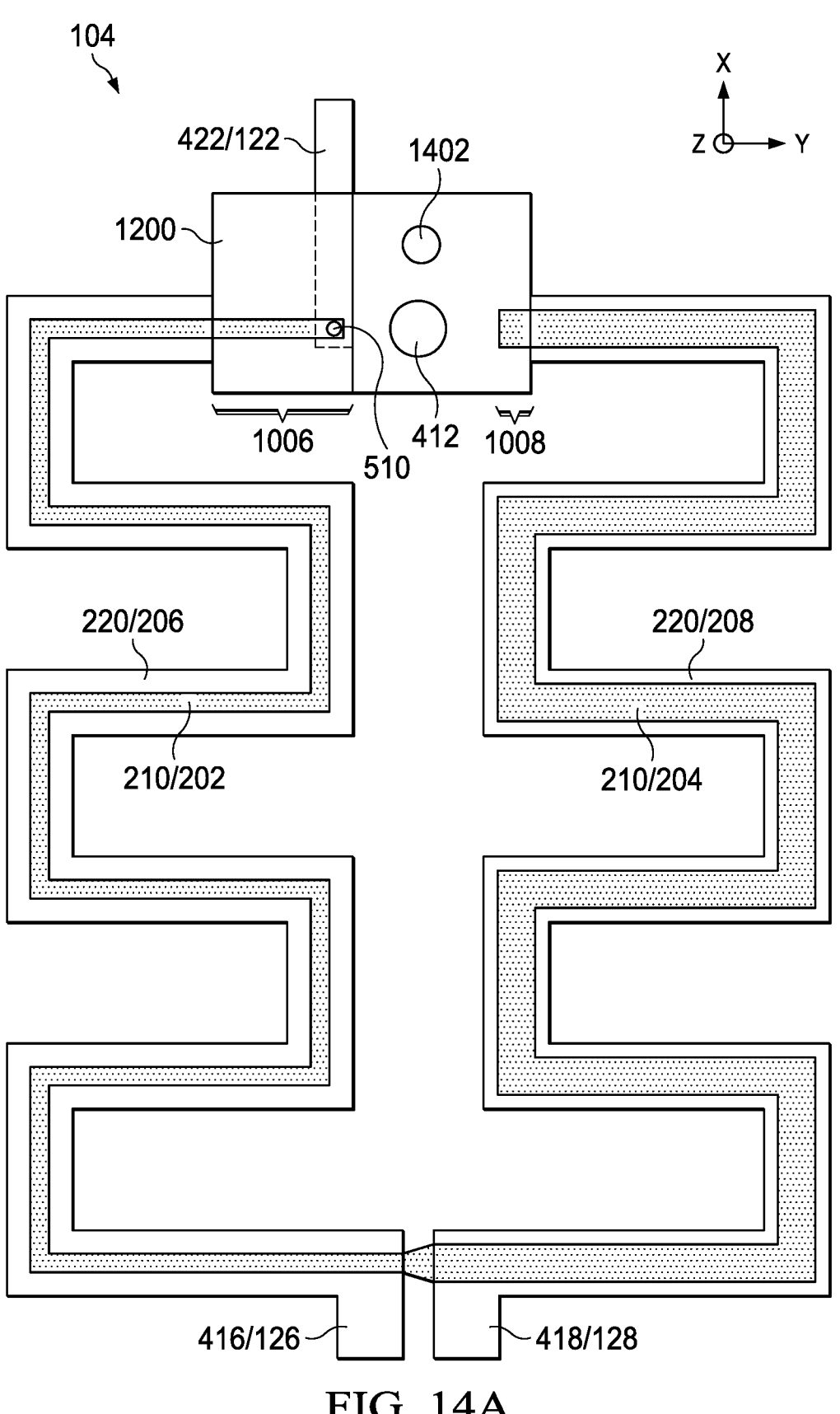
Figure 14B:
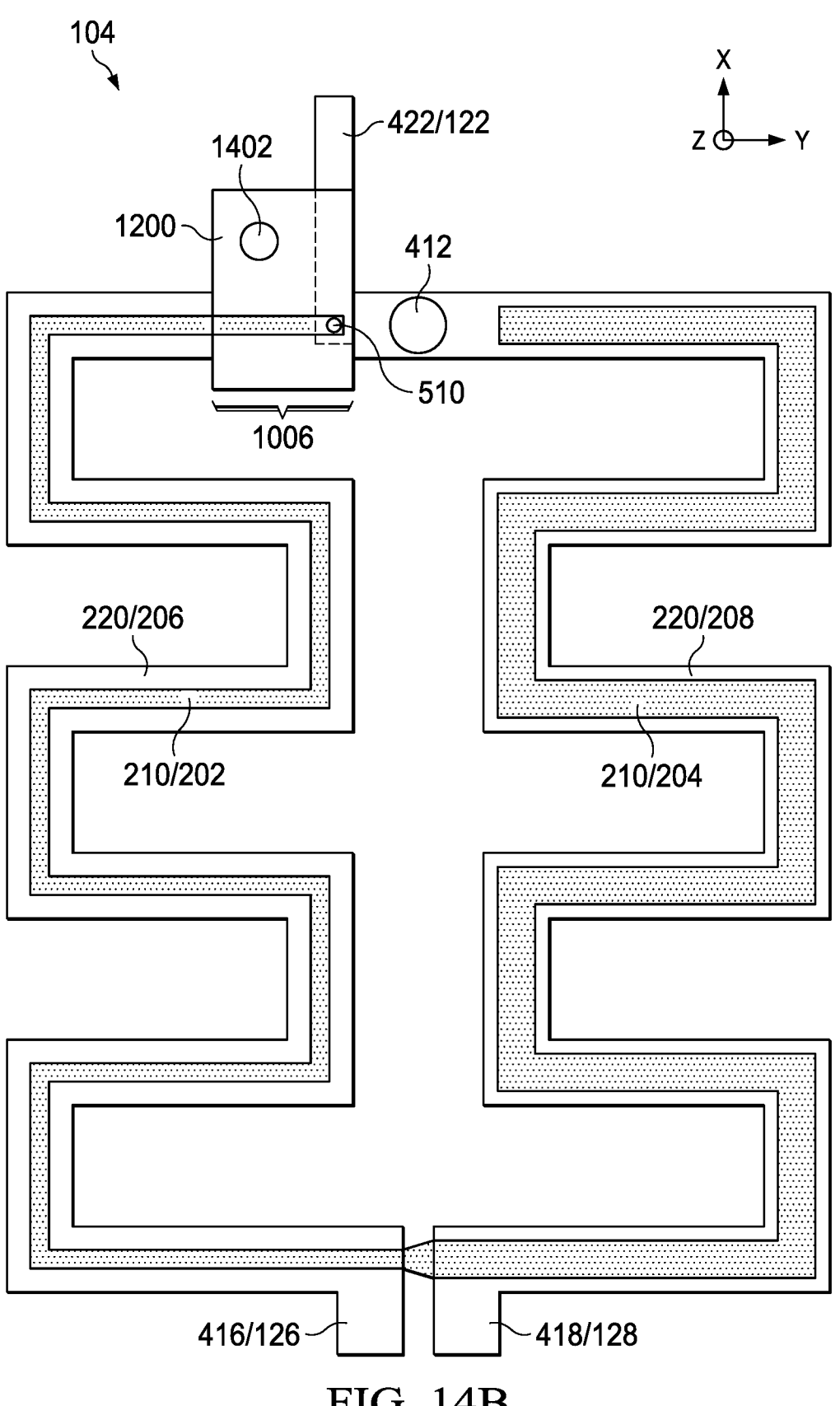

FIG. 14A and FIG. 14B illustrate additional examples of phase adjustment device 1200. In FIG. 14A and FIG. 14B, phase adjustment device 1200 can include a metal strip electrically coupled between second metal layer 220 and a via 1402 external to first metal layer 210 and second metal layer 220. Via 1402 can provide electrical connection to a metal layer above or below second metal layer 220 (not shown in FIG. 14A and FIG. 14B) to provide access to voltage reference 1000. In some examples, via 1402 can be a blind via to provide an electrical connection between two metal layers. Phase adjustment device 1200 can extend from segment 206 over center tap 411 and via 412 to segment 208, as shown in FIG. 14A, or can extend over segment 206 only, as shown in FIG. 14B. In some examples, phase adjustment device 1200 can electrically couple between multiple vias 1402 and second metal layer 220 to improve connection to voltage reference 1000.

Figure 15A:
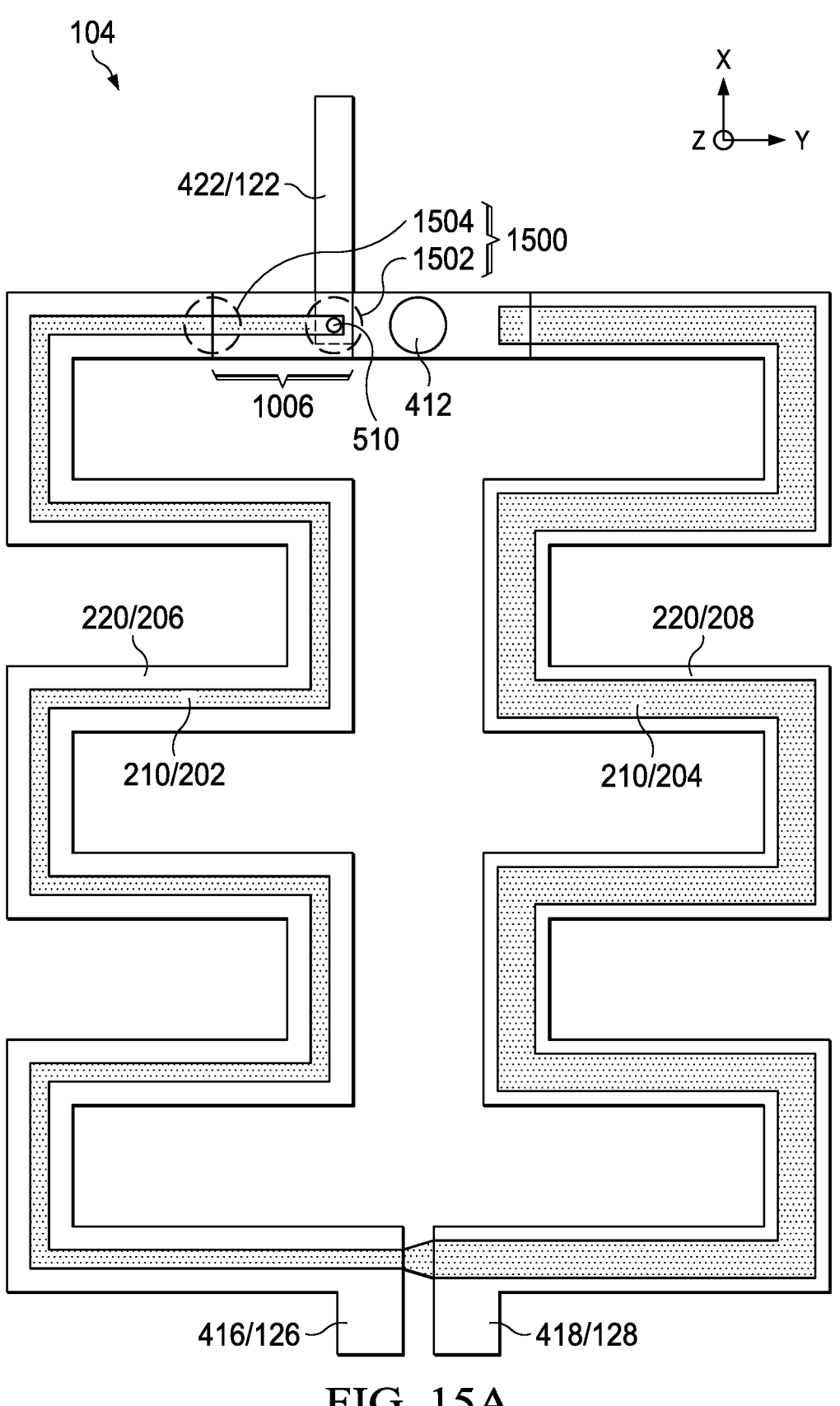
Figure 15B:
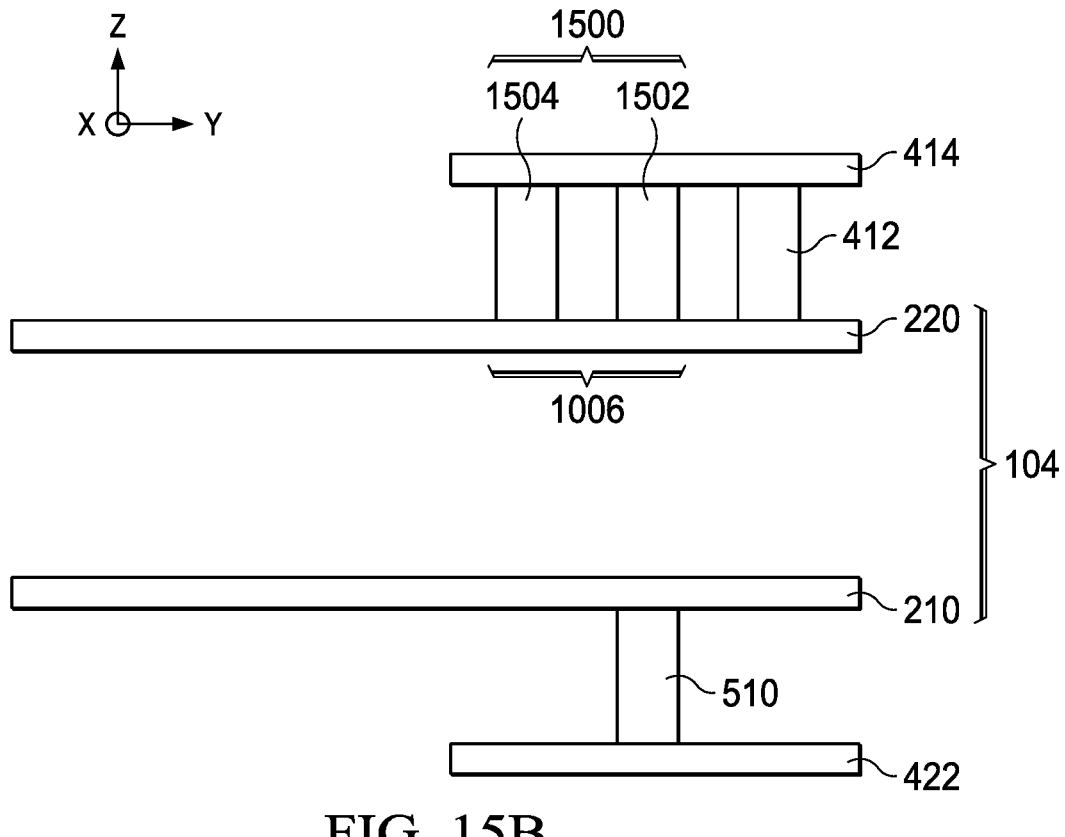

FIG. 15A and FIG. 15B illustrate additional examples of a phase adjustment device 1500. FIG. 15A and FIG. 15B illustrate, respectively, a top view and a side view of balun 104 including phase adjustment device 1500. As shown in FIG. 15A and FIG. 15B, phase adjustment device 1500 can include an array of vias, including vias 1502 and 1504, electrically coupled between part of segment 206 and a metal layer (not shown in FIG. 15A) that provides access to voltage reference 1000. The part of segment 206 that are electrically coupled to vias 1502 and 1504 can be subsegment 1006. In examples where voltage reference 1000 and voltage references 114/134 are the same, that metal layer can be reference layer 414 and/or a shield layer of shield structure 502 (e.g., one of shield layers 504, 505, or 506). Referring to FIG. 15B, vias 1502 and 1504, as well as via 412, can be coupled between reference layer 414 and second metal layer 220. First metal layer 210 (e.g., segment 208) can be electrically coupled to metal segment 422 by via 510 to receive input signal 110, and first metal layer 210, metal segment 422, and via 510 can be below second metal layer 220 and phase adjustment device 1500 along the z-axis.

Phase adjustment devices 1200 and 1500 can also be implemented in examples where first metal layer 210 and second metal layer 220 are in the same metal layer and are arranged sideways on the x-y plane. For example, referring again to FIG. 3, phase adjustment device 1200 can be on an edge 206d of segment 206 not facing segment 202, or on edge 208d of segment 208 not facing segment 204. Moreover, phase adjustment device 1500 can extend vertically (e.g., along the z-axis) from second metal layer 220 to reference layer 414. In both cases, the phase adjustment device can be kept out of first metal layer 210.

The length and width of the example phase adjustment devices of FIGS. 10 through 15B can be determined based on various factors, such as signal frequency, the amount of phase imbalance A, the thickness and width of segments 206/208, the material of segments 206/208, the separation between segments 206/208 and other metal layers, etc. For example, in FIGS. 10 through 15B, if the signal frequency (of signals 110, 140, and 142) is between 6-12 GHz, the phase adjustment device can have a length of 150 micrometers (um) (e.g., along the y direction in FIGS. 12A through 15B). If the signal frequency is between 2-7 GHz, the phase adjustment device can have a length of 900 um. In some examples, the dimensions of the phase adjustment device can be determined using an electromagnetic (EM) simulator, such as Ansys™ High Frequency Structural Simulator (HFSS).

Figure 16A:
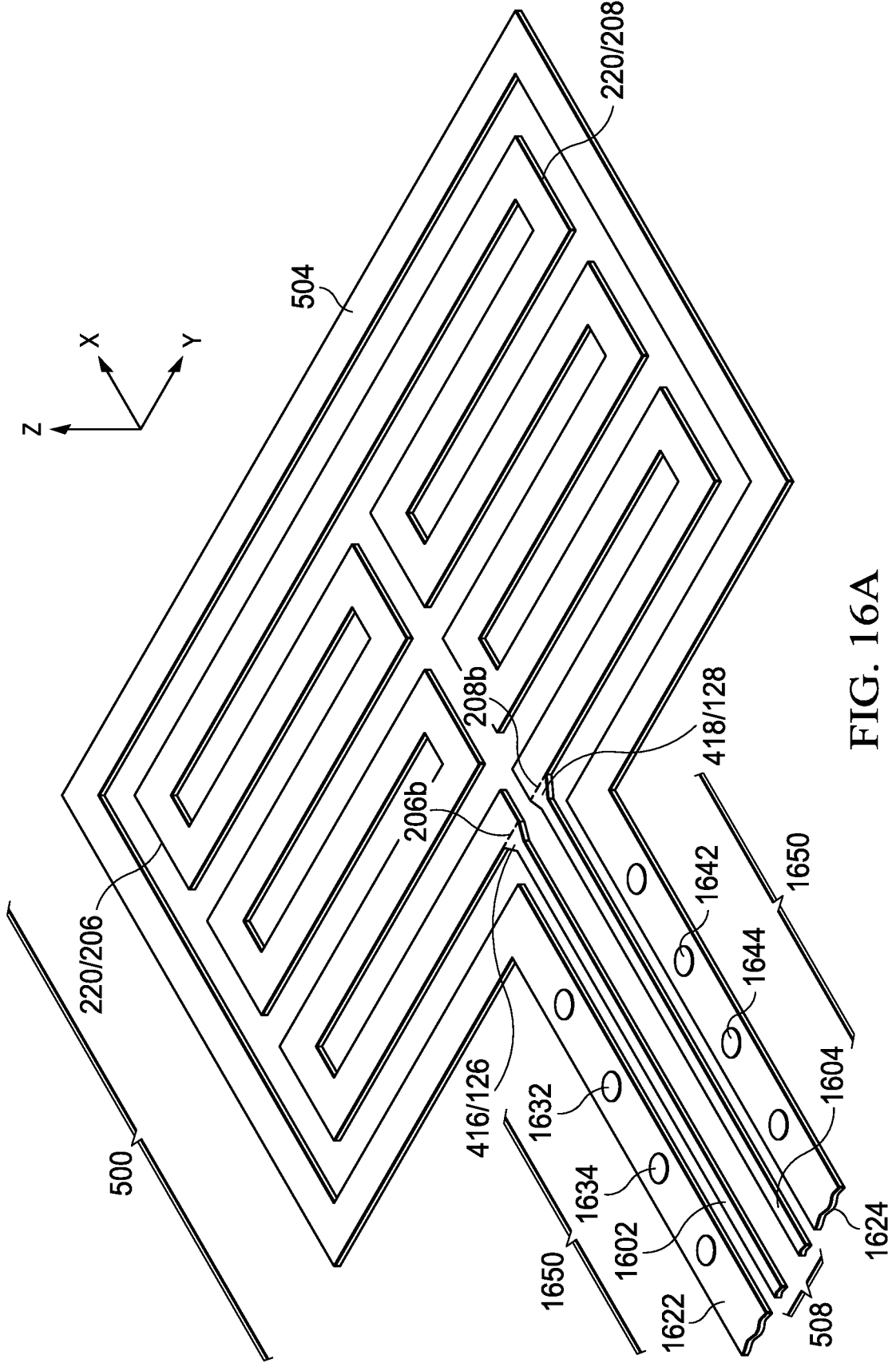
FIGS. 16A through 20 are schematics that illustrate example shield structures to reduce amplitude imbalance of a balun.
Figure 16B:
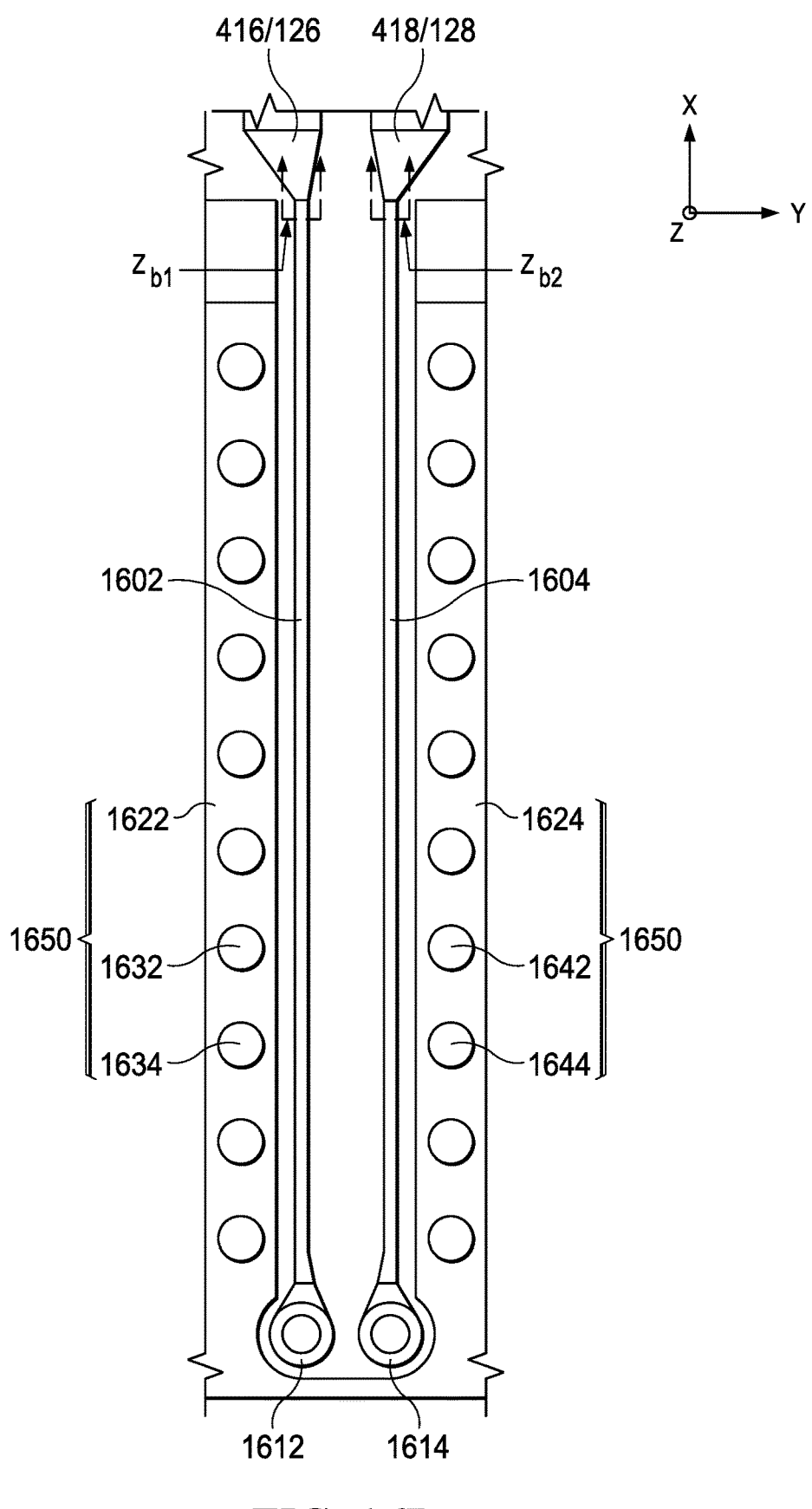

FIGS. 16A through 20 are schematics that illustrate example techniques to reduce amplitude imbalance of a balun. In some examples, the techniques illustrated in FIGS. 16A through 20 can be used to reduce the amplitude imbalance introduced by phase adjustment devices to a low impedance voltage reference, as illustrated in FIGS. 10 through 15B. FIG. 16A and FIG. 16B illustrate example arrangements of wires electrically coupled to signal terminals 126 and 128. FIG. 16A illustrates the perspective view of part of balun module 500 including second metal layer 220, metal shield layer 504 of shield structure 502, and segments 416 and 418. FIG. 16A also shows a pair of metal wires 1602 and 1604 electrically coupled to, respectively, segments 416 and 418. Metal wires 1602 and 1604 can provide connection between balun module 500 and other circuit components of system 602, such as semiconductor die 604. FIG. 16B illustrates a top view of balun module 500 as well as metal wires 1602 and 1604. As shown in FIG. 16A and FIG. 16B, segments 416 and 418, which provide access to the respective signal terminals 126 and 128, can extend from ends 206b and 208b of respective segments 206 and 208 through opening 508 of metal shield layer 504 and electrically couple with the respective metal wires 1602 and 1604. Metal wire 1602 can further extend away from opening 508 and reach bump 1612, and metal wire 1604 can further extend away from open 508 and reach bump 1614. Bumps 1612 and 1614 can be part of bumps 634 electrically coupled to semiconductor die 604 of FIG. 6A and FIG. 6B and can transmit differential signals between semiconductor die 604 and balun 104.

Metal wires 1602 and 1604 can be sandwiched between metal shield layers 1622 and 1624. Metal shield layers 1622 and 1624 can extend from metal shield layer 504 and can be electrically coupled to other metal layers to provide access to a voltage reference (e.g., reference layer 414) by a set of through vias, such as through vias 1632, 1634, 1642, and 1644. Metal shield layers 1622 and 1624 and the through vias can be part of a shield structure 1650, which can be an extension of shield structure 502. Second metal layer 220, segments 416 and 418, metal wires 1602 and 1604, and metal shield layers 504, 1622, and 1624, can be in the same metal layer. The length of metal wire 1602 can be defined by the distance between end 206b and bump 1612, and the length of metal wire 1604 can be defined by the distance between end 208b and bump 1614. Metal wires 1602 and 1604 can be matched in length to improve phase and amplitude imbalance between output signals 140 and 142.

In some examples, to further reduce amplitude imbalance introduced by balun 104, asymmetric impedance loading techniques can be employed to change the characteristic impedances of metal wires 1602 and 1604. With asymmetric impedance loading, metal wires 1602 and 1604 can have different characteristic impedances, which can compensate for the amplitude imbalance caused by mismatches in the impedances $Z_{b1}$ and $Z_{b2}$. For example, if $Z_{b1}$ (at signal terminal 126) is larger than $Z_{b2}$ (at signal terminal 128), the characteristic impedance of metal wire 1602 can be increased to match $Z_{b1}$, and the characteristic impedance of metal wire 1604 can be reduced to match $Z_{b2}$. By matching the impedances of metal wires 1602 and 1604 with the respective output impedances $Z_{b1}$ and $Z_{b2}$, the power transfer between balun 104 and each of segments 416 and 418 can be maximized. Accordingly, the matching of amplitudes of differential signals at bumps 1612 and 1614 and can be improved.

Figure 17:
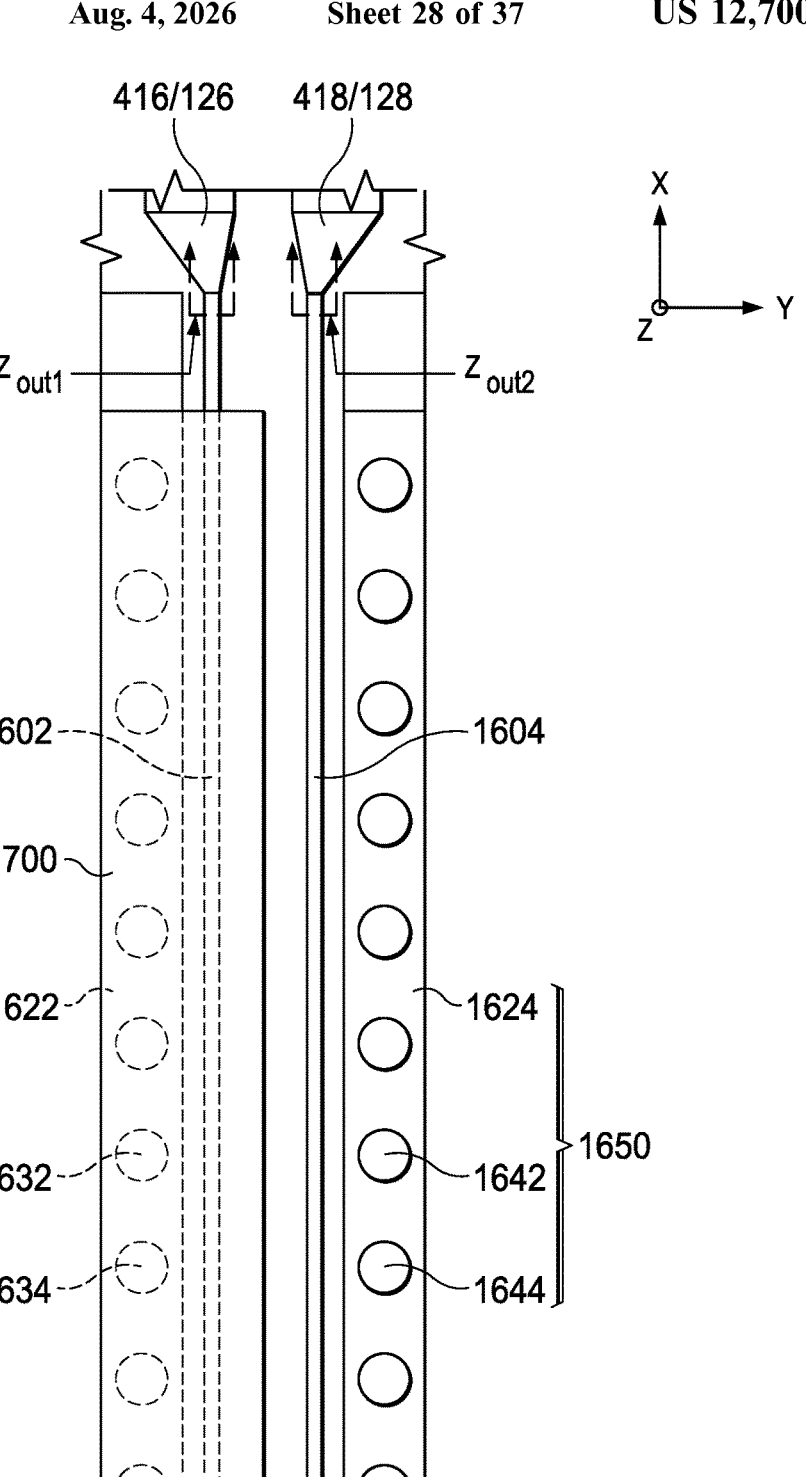

FIG. 17 illustrates an example of asymmetric impedance loading. As shown in FIG. 17, one of metal wires 1602 or 1604 (metal wire 1602 in FIG. 17) can be overlaid with a metal shield layer 1700 that extends along the length of the one of metal wires. In some examples, metal shield layer 1700 can be in the same metal layer as reference layer 414, or in another metal layer different from metal wires 1602 or 1604, and can be electrically coupled to metal shield layer 1622 by a set of through vias including vias 1632 and 1634 and become part of shield structure 1650. Thus, one of metal wires 1602 or 1604 (metal wire 1602 in FIG. 17) can be sandwiched between metal shield layer 1700 and another shield layer of shield structure 1650. Metal shield layer 1700 can increase the capacitance of metal wire 1602, and the characteristic impedance of metal wire 1602 can reduce with respect to metal wire 1604, as described above with respect to Equation 2. However, as metal shield layer 1700 covers the entire area of metal wire 1602, it can substantially increase the capacitance of the metal wire, which can substantially reduce the bandwidth of the metal wire and makes it unsuitable for transmission of high frequency/bandwidth signals.

Figure 18A:
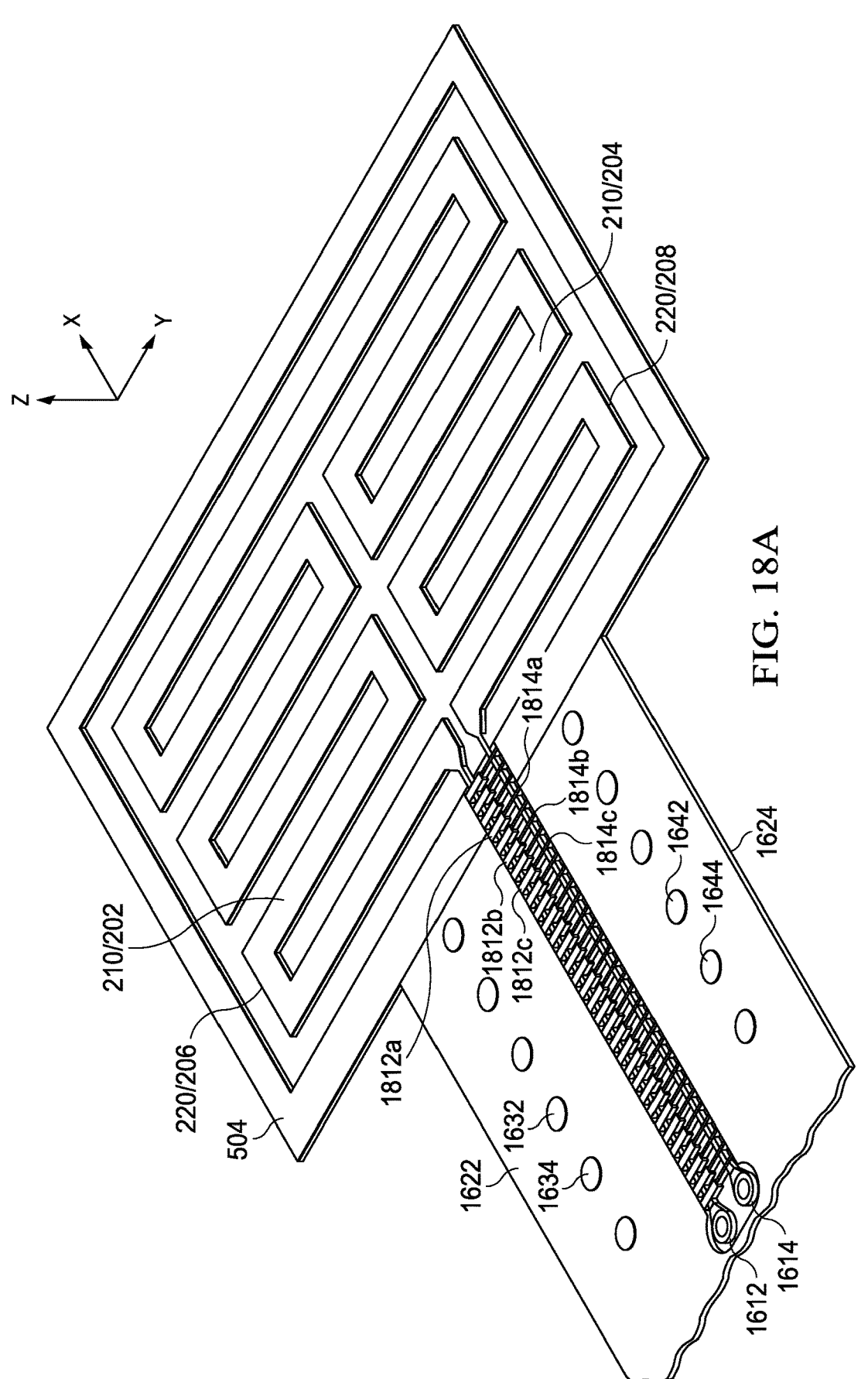
Figure 18B:
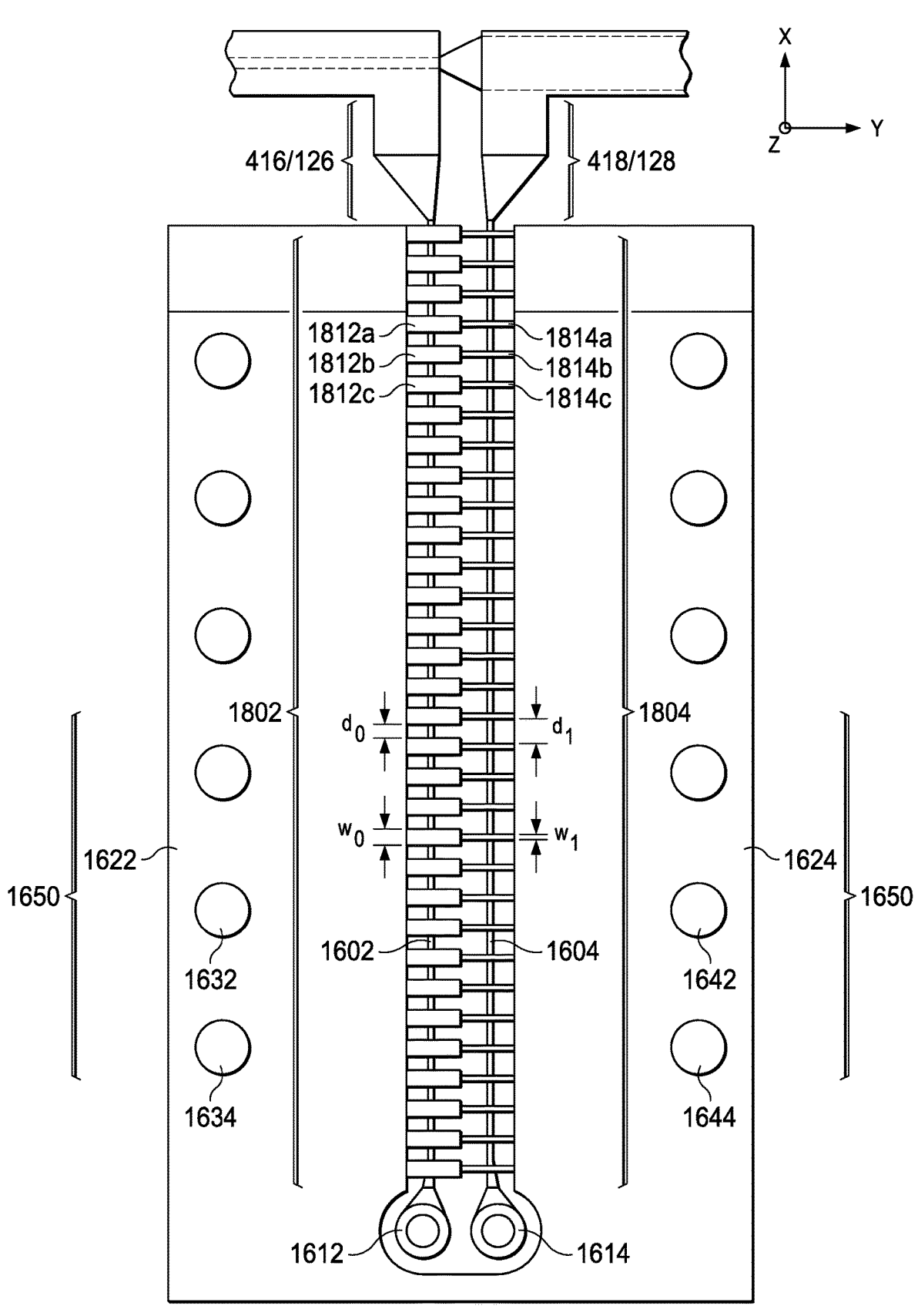

FIG. 18A and FIG. 18B illustrate another example of asymmetric impedance loading. FIG. 18A and FIG. 18B illustrate, respectively, the top view and the perspective view of metal wires 1602 and 1604 overlaid with respective metal shield layers 1802 and 1804. In some examples, metal shield layers 1802 and 1804 can be in the same metal layer as reference layer 414, or in another metal layer different from metal wires 1602 or 1604 (e.g., in the same metal layer as first metal layer 210). In some examples, each of metal shield layers 1802 and 1804 can also be in two metal layers that sandwich the metal layer containing metal wires 1602 and 1604 and metal shield layer 1622. Metal shield layers 1802 and 1804 can be electrically coupled to metal shield layer 1622 by a set of through vias including vias 1632 and 1634 and become part of shield structure 1650.

Each of metal shield layers 1802 and 1804 includes metal teeth that extend from the respective shield layers and are positioned sideways along the respective metal wires 1602 and 1604 (e.g., along the x-axis in FIG. 18). For example, metal shield layer 1802 can include adjacent metal teeth extensions 1812*a*, 1812*b*, and 1812*c* that are positioned sideways along metal wire 1602, and metal shield layer 1804 can include adjacent metal teeth extensions 1814*a*, 1814*b*, and 1814*c* that are positioned sideways along metal wire 1604. Each metal tooth that extends from metal shield layer 1802 can be connected to a corresponding metal tooth that extends from metal shield layer 1804 to form a bridge over metal wires 1602 and 1604. For example, metal tooth 1812*a* is connected to metal tooth 1814*a*, metal tooth 1812*b* is connected to metal tooth 1814*b*, and metal tooth 1812*c* is connected to metal tooth 1814*c*.

Metal shield layers 1802 and 1804 can be configured to provide asymmetric impedance loading for metal wires 1602 and 1604. Specifically, corresponding metal teeth that extends from metal shield layers 1802 and 1804 can have different widths. For example, each metal tooth of metal shield layer 1802 can have a width $w_0$, and each metal tooth of metal shield layer 1804 can have a width $w_1$ smaller than $w_0$. Also, adjacent metal teeth of metal shield layer 1802 can be separated by a different distance compared with adjacent metal teeth of metal shield layer 1804. For example, adjacent metal teeth of metal shield layer 1802 are separated by a distance $d_0$, and adjacent metal teeth of metal shield layer 1804 are separated by a distance $d_1$ longer than $d_0$.

The differences in the widths and separation of metal teeth of metal shield layers 1802 and 1804 can introduce different capacitances and inductances, which can create asymmetric impedance loading. Specifically, as the metal teeth of metal shield layer 1802 have larger width and shorter separation distance than the metal teeth of metal shield layer 1804, the area of metal wire 1602 overlaid with metal shield layer 1802 can be larger than the area of metal wire 1604 overlaid with metal shield layer 1804. Accordingly, metal wire 1602 can have a larger capacitance than metal wire 1604, and the characteristic impedance of metal wire 1602 can reduce with respect to metal wire 1604. Also, compared with the arrangements of FIG. 17, because neither metal wire 1602 nor metal wire 1604 is overlaid completely with the respective metal shield layer, the increase in the capacitances of the metal wires 1602 and 1604 can be reduced. Accordingly, the bandwidth degradation of metal wires 1602 and 1604 can also be reduced, which allows them to transmit high frequency signals.

Figure 19:
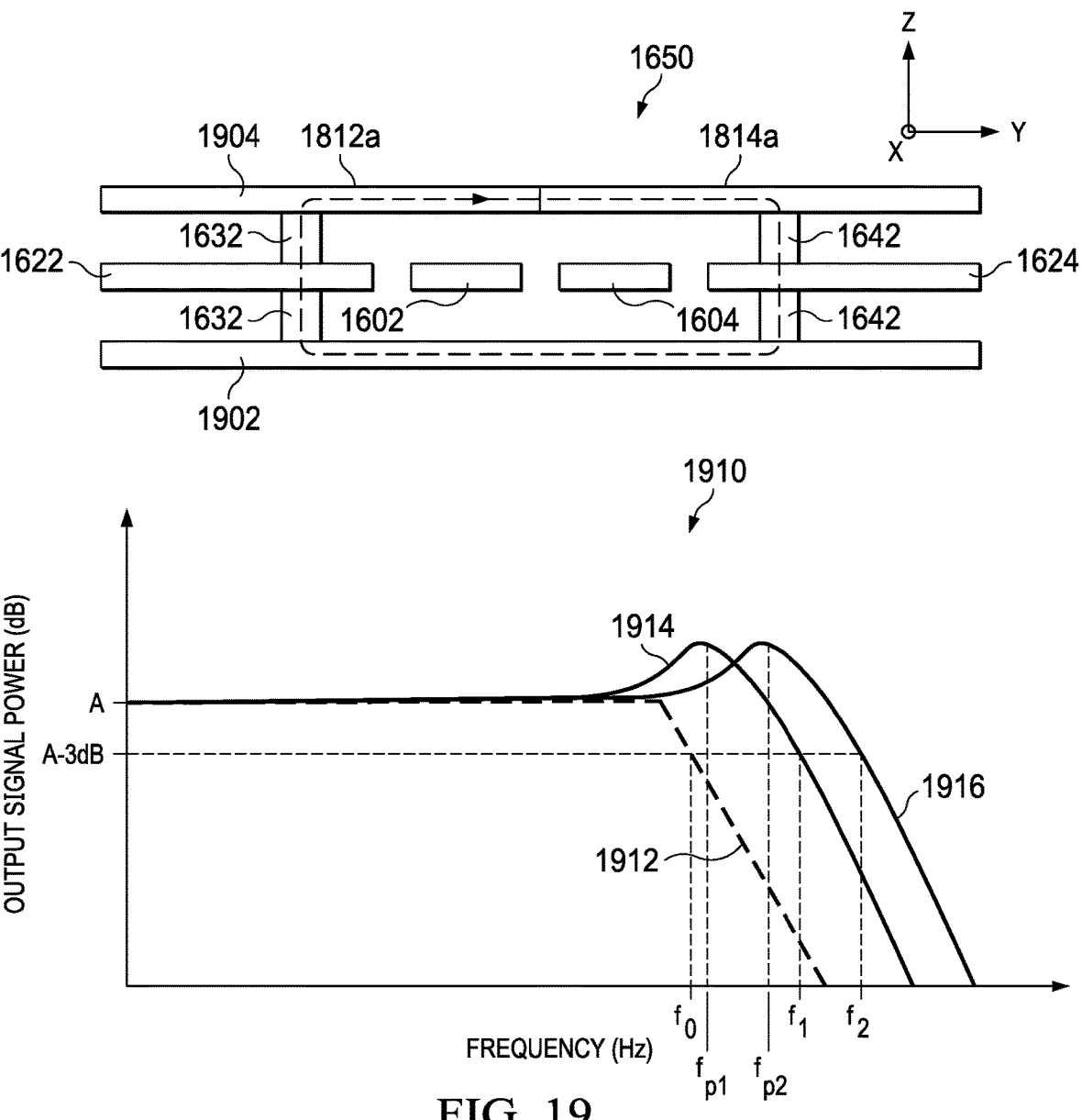

Also, metal shield layers 1802 and 1804 can also introduce different inductances to metal wires 1602 and 1604, which not only improves the bandwidths of metal wires 1602 and 1604 with increased peaking but also create asymmetric impedance loading. FIG. 19 illustrates examples of the peaking effect created by metal shield layers 1802 and 1804. The left of FIG. 19 illustrates a cross-sectional view of shield structure 1650, which includes a metal layer 1902 that can be an extension of metal shield layer 506 that provides connection to a low impedance voltage reference, as well as metal wires 1602 and 1604. As shown in the top of FIG. 19, when differential signals (e.g., 140/142 and 180/182) propagate through the respective metal wires 1602 and 1604, the magnetic field of the signals can induce a current that flows around shield structure 1650 along a pair of coupled metal strips of metal shield layer 1802 and 1804 (e.g., metal strips 1812*a* and 1814*a*), through vias 1632 and 1642, and metal layer 1902, forming a current loop 1904 around metal wires 1602 and 1604. Current loop 1904, as well as the metal teeth that conduct the current, are perpendicular/orthogonal to metal wires 1602 and 1604. Corresponding metal teeth of metal shield layer 1802 and 1804 are connected together and can provide a current loop, and multiple current loops can be formed along metal wires 1602 and 1604.

The current loops can create a first magnetic field that orthogonally cuts metal wire 1602, and a second magnetic field that orthogonally cuts metal wire 1604. The first magnetic field can have a different strength from the second magnetic field due to the metal teeth of metal shield layers 1802 and 1804 having different widths and separation distances. Due to the different magnetic field strengths, metal wire 1602 can have a different inductance from metal wire 1604, which can introduce additional asymmetric loading between the wires.

The bottom of FIG. 19 includes a graph 1910 that illustrates the effects of the asymmetric impedance loading techniques of FIG. 18 on the frequency responses of metal wires 1602. Graph 1910 includes plots 1912, 1914, and 1916. Plot 1912 can represent a base line frequency response of metal wire 1602 without metal shield layer 1802, plot 1914 can represent a frequency response of metal wire 1604 with metal shield layer 1804, and plot 1916 can represent a frequency response of metal wire 1602 with metal shield layer 1802. In graph 1910, the frequency response describes the variation of signal power (e.g., of signals 140 and 142) on the metal wires with respect to signal frequency.

Referring to plot 1912, without the additional inductance introduced by metal shield layers 1802, the 3 dB bandwidth of metal wires 1602/1604, where the output signal power reduces by 3 dB, can be at a frequency $f_0$. Referring to plot 1914, with the inductance added by metal shield layer 1804, peaking occurs at a frequency $f_{p1}$, and the 3 dB bandwidth of metal wire 1604 is extended to frequency $f_1$. Also, referring to plot 1916, with the inductance added by metal shield layer 1802, peaking occurs at a frequency $f_{p2}$, and the 3 dB bandwidth of metal wire 1602 is extended to frequency $f_2$. Due to asymmetric impedance loading, the inductance of metal wire 1602 increases more than the inductance of metal wire 1604, which can push out the peaking frequency as well as the bandwidth of metal wire 1602 with respect to metal wire 1604. The different peaking and 3 dB frequencies between metal wires 1602 and 1604 can also lead to different transmission characteristics between metal wires 1602 and 1604 at a particular signal frequency, which can compensate for the amplitude imbalance between the differential signals introduced by balun 104. For example, because of the asymmetric impedance loading, metal wire 1602 can provide less signal attenuation than metal wire 1604 at signal frequency higher than $f_0$. Such arrangements can compensate for amplitude imbalance between the differential signals, if the signal on metal wire 1602 has a smaller amplitude than the signal on metal wire 1604.

The widths of metal strips of metal shield layers 1802 and 1804, as well as the separation between the metal strips, can be configured based on various factors including the amount of amplitude imbalance to be reduced and a target peaking frequency. In some examples, each metal strip of metal shield layer 1802 can have a width of 50 um, and each adjacent metal strip of metal shield layer 1802 is separated by a distance of 30 um. Also, each metal strip of metal shield layer 1804 can have a width of 15 um, and each adjacent metal strip of metal shield layer 1804 can be separated by a distance of 65 um.

The widths of metal strips of metal shield layers 1802 and 1804, as well as the separation between the metal strips, can be configured based on various factors, such as the amount of amplitude imbalance to be reduced and a target peaking frequency. In some examples, for a signal frequency range of 2-12 GHz, each metal strip of metal shield layer 1802 can have a width of 50 um, and each adjacent metal strip of metal shield layer 1802 can be separated by a distance of 30 um. Also, each metal strip of metal shield layer 1804 can have a width of 15 um, and each adjacent metal strip of metal shield layer 1804 can be separated by a distance of 65 um. In some examples, the widths and separations of the metal strips of metal shield layers 1802 and 1804 can also be determined using an EM simulator, such as Ansys™ HFSS.

Figure 20:
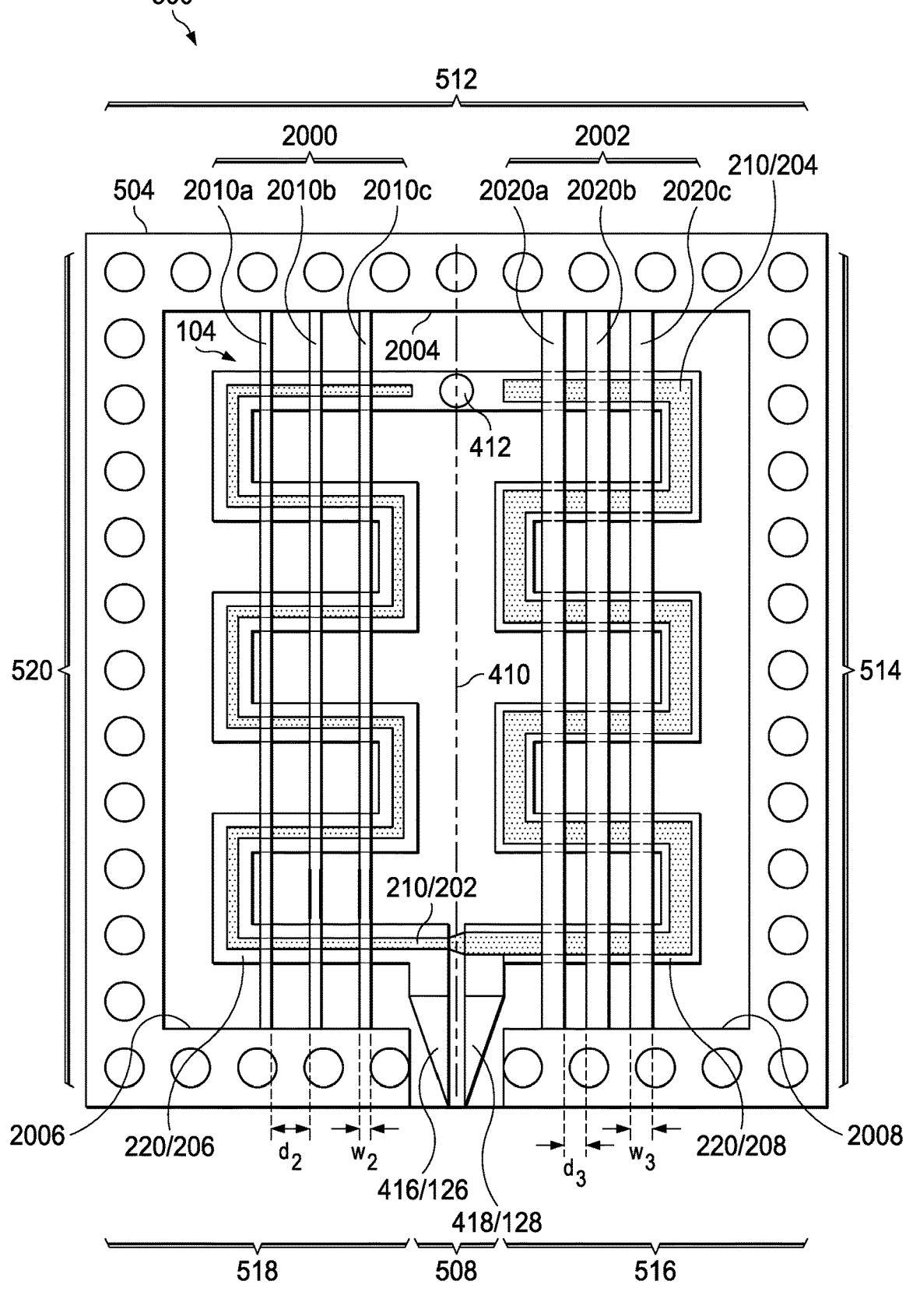

The example asymmetric impedance loading techniques described in FIGS. 18A, 18B, and 19 can be implemented within balun module 500. FIG. 20 is a schematic that illustrates an example balun module 500 having metal shield layers 2000 and 2002 to introduce asymmetric impedance loading. Metal shield layers 2000 and 2002 can be part of shield structure 502 including metal shield layers 504 and through vias groups 512, 514, 516, 518, and 520. Metal shield layers 2000 and 2002 can include multiple metal strips in the same metal layer as metal shield layer 504. Metal shield layer 2000 can extend from a side 2004 of metal shield layer 504 facing opening 508, along axis 410, and reach side 2006 of metal shield layer 504 opposite to side 2004. Also, metal shield layer 2002 can extend from side 2004, along axis 410, and reach side 2008 of metal shield layer 504 opposite to side 2004. In the example of FIG. 20, metal shield layer 2000 can include metal strips 2010a, 2010b, and 2010c that are orthogonal to and overlap with some subsegments of segment 202 (of first metal layer 210) and of segment 206 (of second metal layer 220). Metal shield layer 2002 can include metal strips 2020a, 2020b, and 2020c that overlap with some subsegments of segment 204 (of first metal layer 210) and of segment 208 (of second metal layer 220). Each of strips 2010a-c of metal shield layer 2000 can have a width $w_2$, and adjacent strips is separated by a distance $d_2$. Also, each of strips 2020a-c of metal shield layer 2002 can have a width $w_3$ that is longer than width $w_2$, and adjacent strips is separated by a distance $d_3$ wider than distance $d_2$. With such arrangements, the capacitance introduced by metal shield layer 2000 to segment 206 can be less than the capacitance introduced by metal shield layer 2002 to segment 208, which can create asymmetric impedance loading between signal terminals 126 and 128 as in FIGS. 18A and 18B. Also, each of strips 2010a-c and 2020a-c can create a current loop around the respective segments 206 and 208, which can create inductive peaking and improve the bandwidth of second metal layer 220, as described in FIG. 19. Due to the different width and separation between the metal strips, strips 2010a-c can add a different amount of inductance to segment 206 from the inductance added by strips 2020a-c to segment 208, which can further increase the asymmetric impedance loading between signal terminals 126 and 128.

Figure 21:
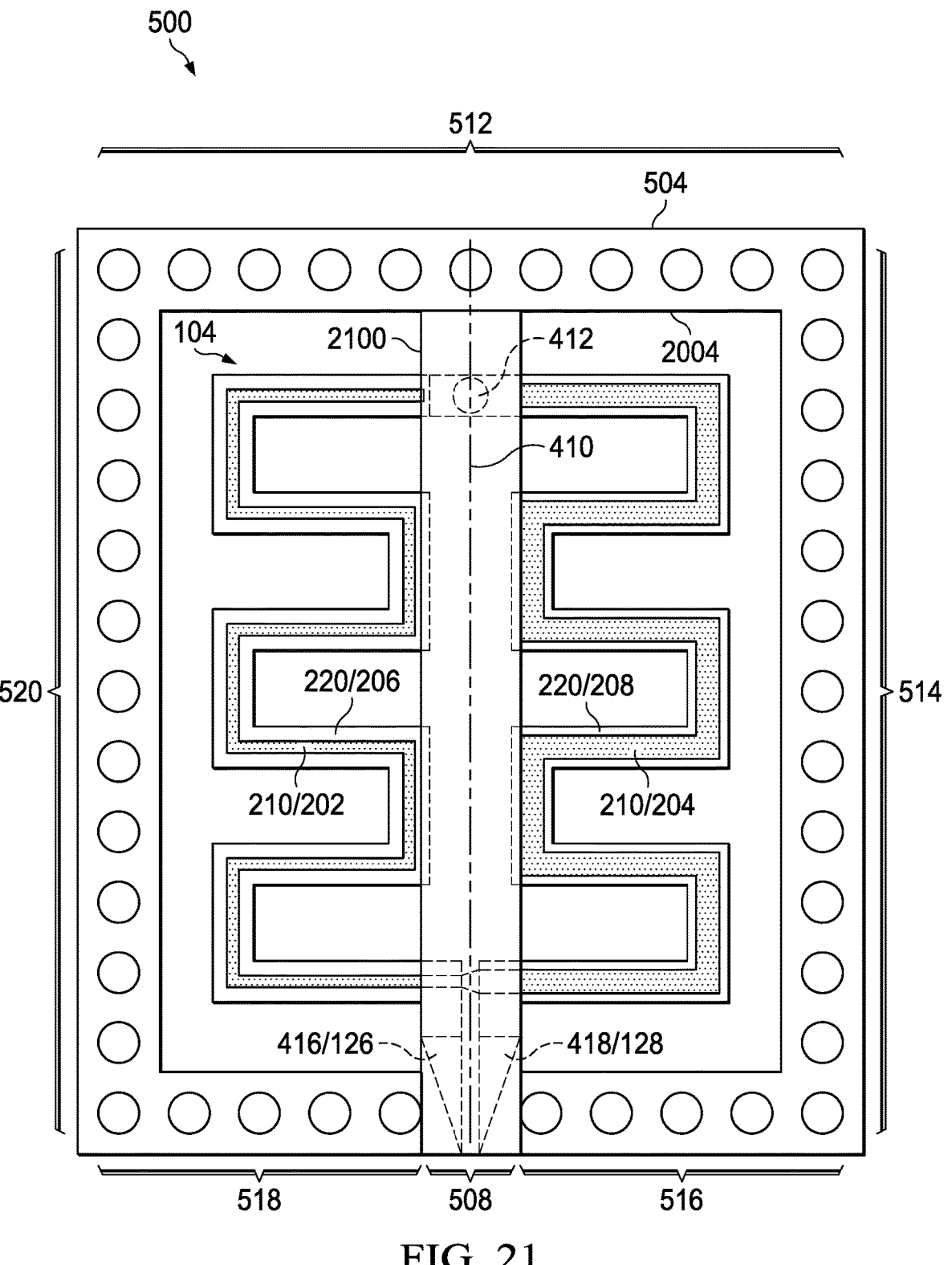
FIGS. 21 through 24 are schematics that illustrate example shield structures to reduce resonance effect.
Figure 22:
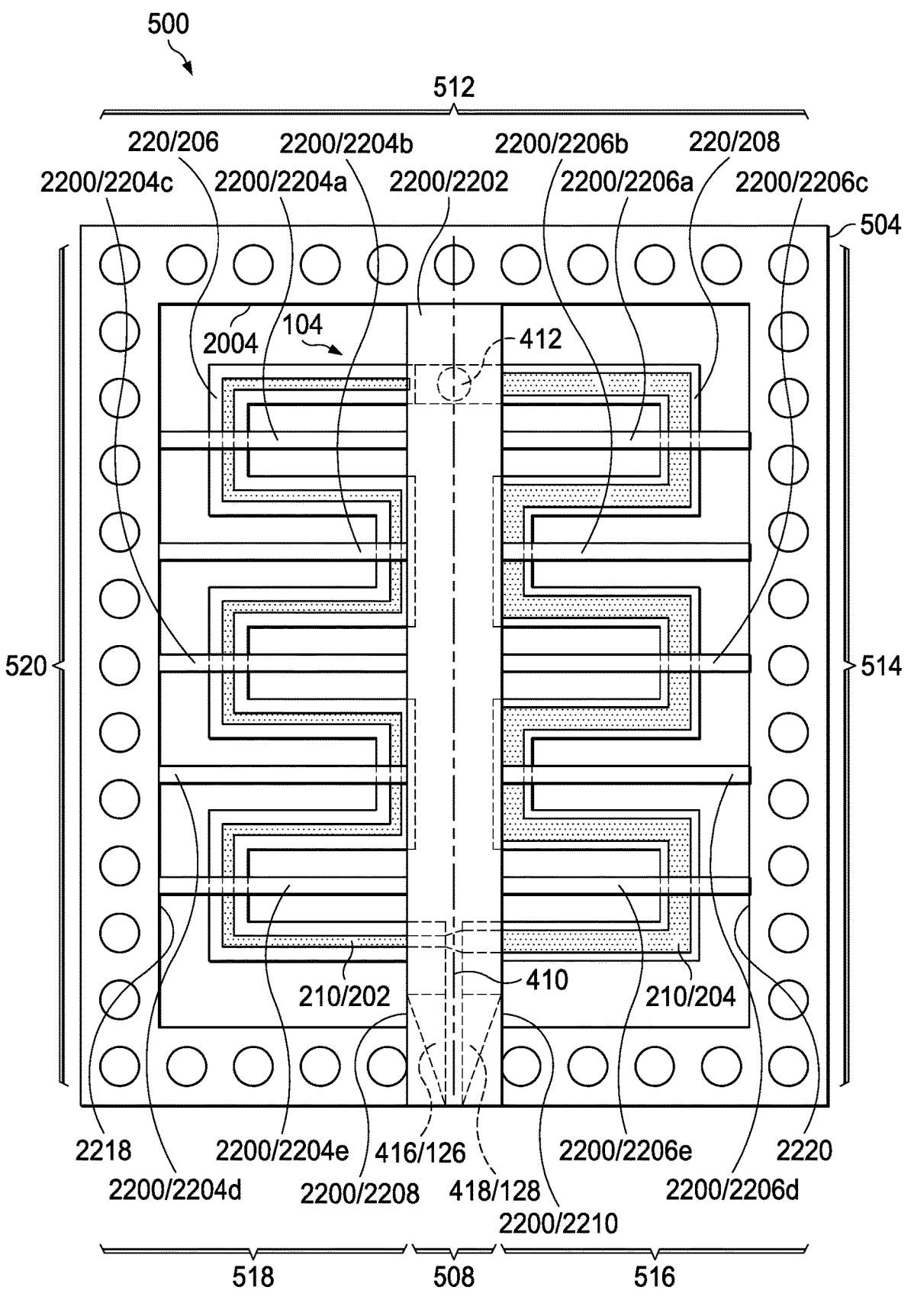
Figure 23:
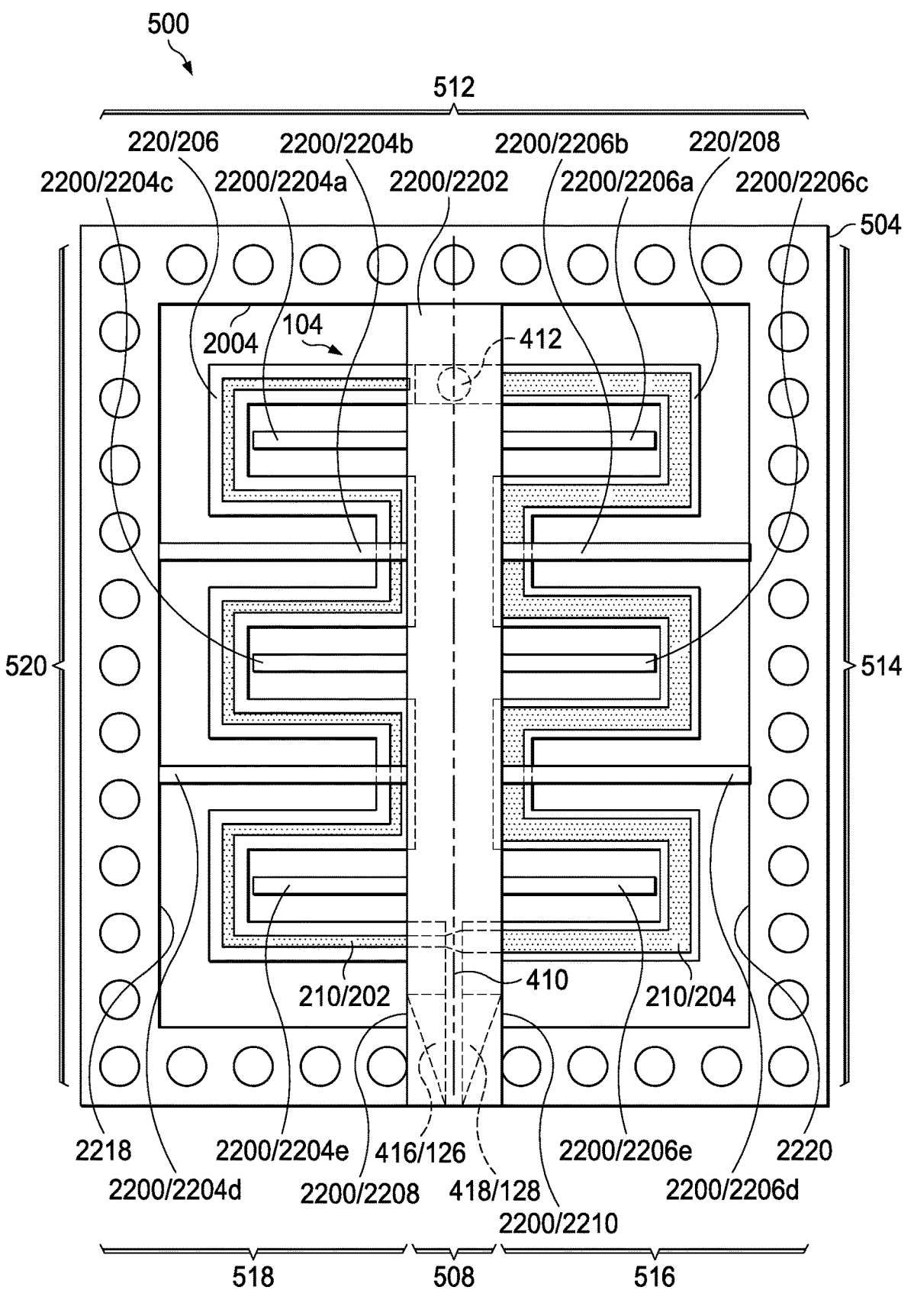

FIGS. 21 through 23 are schematics that illustrate example techniques to reduce the resonance effect caused by a floating layer, such as metal lid 630, over balun 104. As described above, a floating metal layer over balun 104, such as metal lid 630 of FIG. 6, can create a resonance circuit such as circuit model 910. The resonant frequency can be based on the area of second metal layer 220 exposed to the floating metal layer, and if the resonant frequency is within the signal frequency range, the resonance effect can increase phase and/or amplitude imbalance between signals 140 and 142. One way to reduce the resonance effect is by shielding second metal layer 220 completely from the floating metal layer with a metal shield layer that is electrically coupled to a low impedance voltage reference/ground reference. For example, reference layer 414 can be extended to overlap completely over first metal layer 210 and second metal layer 220 of balun 104. Such arrangements, however, can substantially increase the capacitances of first metal layer 210 and second metal layer 220 of balun 104 and reduce their bandwidths. FIGS. 21 through 23 illustrate example metal shield layers that can partially shield balun 104 from the floating metal layer. The partial shielding can reduce the area of balun 104 exposed to the floating metal layer (e.g., metal lid 630) and reduce the floating capacitance $C_F$ of capacitor 902 of circuit model 910. By reducing the floating capacitance $C_F$, the resonant frequency can be shifted out of the signal frequency range. Also, the partial shielding can reduce the areas of first metal layer 210 and second metal layer 220 that overlap with the metal shield layer, which can reduce the additional capacitance introduced to balun 104 and the resulting bandwidth loss.

FIG. 21 illustrates an example balun module 500 having a metal shield layer 2100. Metal shield layer 2100 can be part of shield structure 502 including metal shield layers 504 and through vias 512, 514, 516, 518, and 520. Metal shield layer 2100 can be a metal strip in the same metal layer as metal shield layer 504 and extends from side 2004 of metal shield layer 504 facing opening 508, along axis 410, and over opening 508. Metal shield layer 2100 can overlap with via 412 and the center tap of balun 104 and segments 416 and 418. Metal shield layer 2100 can also partially overlap with some of the subsegments of first metal layer 210 and/or second metal layer 220 that are parallel with metal shield layer 2100, which can reduce the floating capacitance $C_F$.

FIG. 22 and FIG. 23 illustrate additional examples of balun module 500 having a metal shield layer 2200. Metal shield layer 2200 can also be part of shield structure 502 and can be in the same metal layer as metal shield layer 504. Metal shield layer 2200 can have a grill pattern and include a middle portion 2202 and multiple strap portions 2204 and 2206. Middle portion 2202 can be identical to metal shield layer 2100 of FIG. 21. Middle portion 2202 can extend from side 2004 of metal shield layer 504 along axis 410 and over opening 508, and can overlap with via 412 and the center tap of balun 104 and segments 416 and 418. Strap portions 2204 and strap portions 2206 can be on two opposing sides 2208 and 2210 of middle portion 2202. In the example shown in FIG. 22, all of strap portions 2204, including strap portions 2204a-e, can extend from side 2208 to side 2218 of metal shield layer 504 and connect with metal shield layer 504. Also, all of strap portions 2206, including strap portions strap portions 2206a-e, can extend from side 2210 to side 2220 of metal shield layer 504 and connect with metal shield layer 504. In some examples, as shown in FIG. 23, alternating strap portions 2204 and 2206, such as strap portions 2204a, 2204c, and 2204e and strap portions 2206a, 2206c, and 2206e, can be disconnected from metal shield layer 504 and do not overlap with first metal layer 210 and second metal layer 220. The arrangements of FIG. 22 can reduce the area of overlap between metal shield layer 2100 and balun 104 and improve the bandwidth of balun 104.

Figure 24:
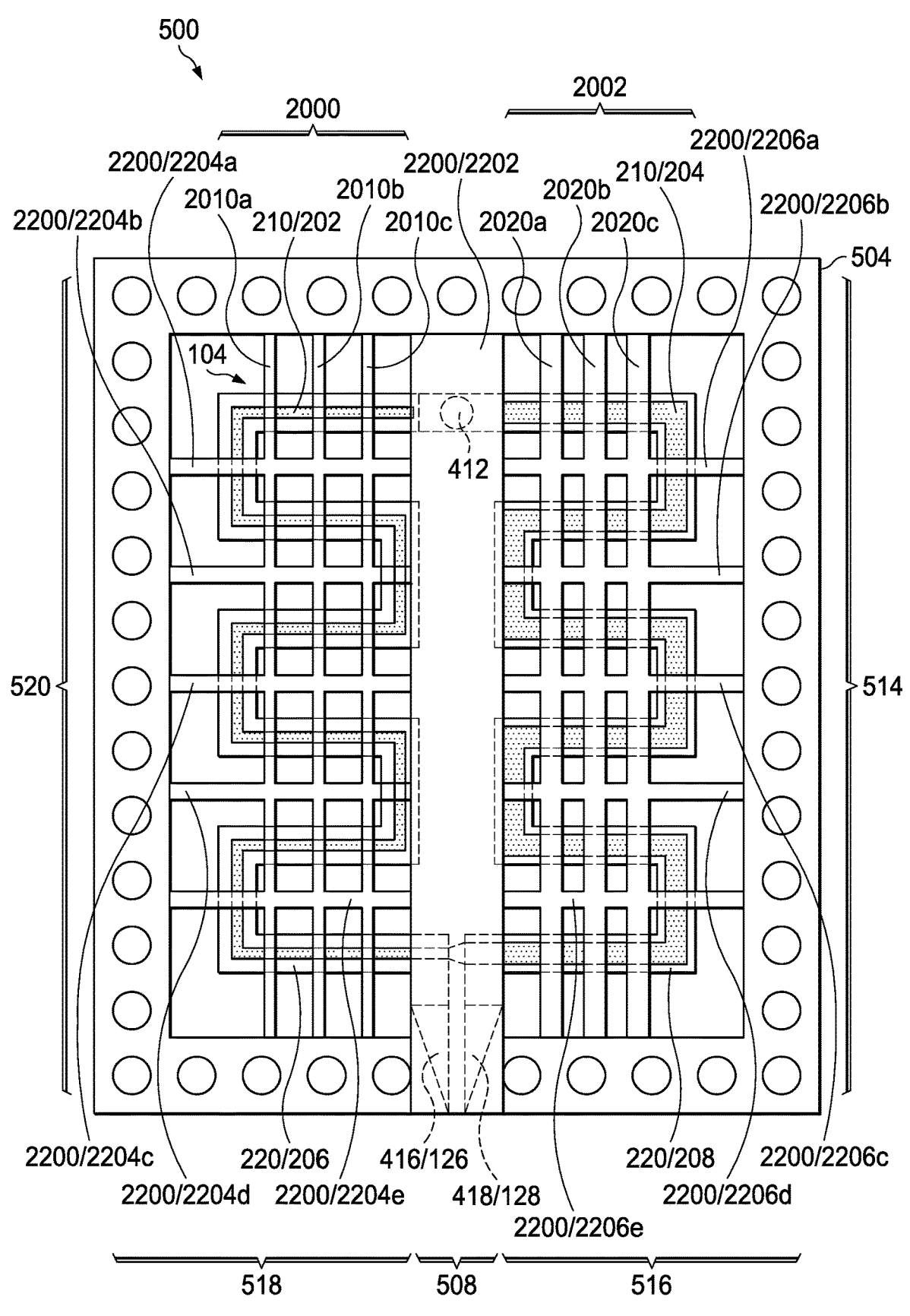

FIG. 24 illustrates an example balun module 500 having both metal shield layers 2000 and 2002 of FIG. 20, and metal shield layer 2200 of FIG. 22. In the example of FIG. 24, metal strips 2010a-c of metal shield layer 2000 can intersect with strap portions 2204a-e of metal shield layer 2200, and metal strips 2020a-c of metal shield layer 2002 can intersect with strap portions 2206a-e of metal shield layer 2200, forming a grid pattern. With the arrangements of FIG. 24, the exposure of first metal layer 210 and second metal layer 220 of balun 104 to floating metal layer (e.g., metal lid 630) can be reduced by metal shield layer 2200, while asymmetric impedance loading can be introduced by metal shield layers 2000 and 2002 to improve amplitude imbalance.

In FIGS. 21 through 24, the dimensions of the metal strips, as well as their separations, can be determined based on a target resonant frequency, such that the resonant frequency moves out of the signal frequency range (e.g., 2-12 GHz). In some examples, the dimensions and separations of the metal strips can also be determined using an electromagnetic (EM) simulator, such as Ansys™ HFSS.

Figure 25:
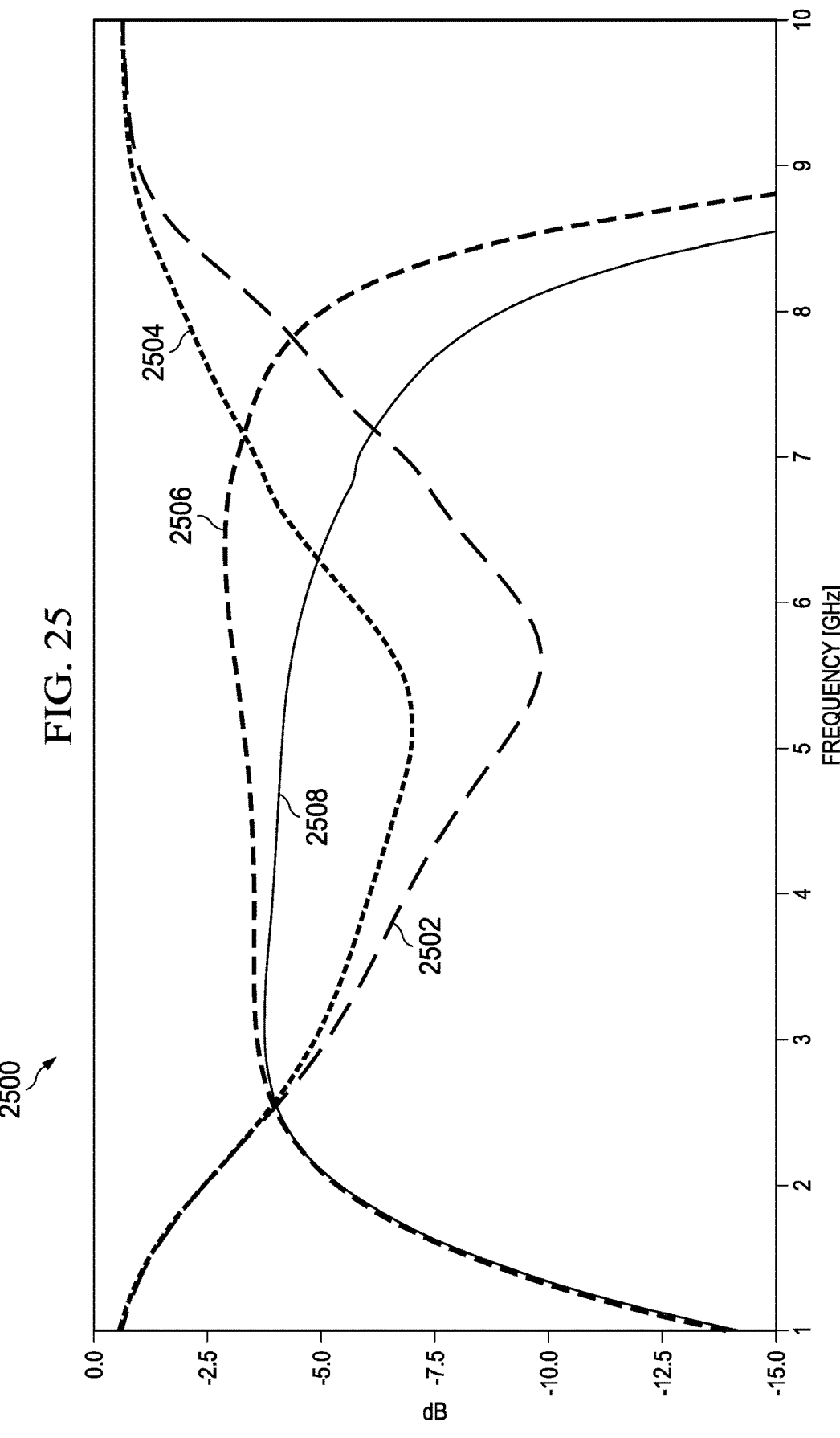
FIG. 25 is a graph that illustrates example results of resonance effect reduction.

FIG. 25 is a graph 2500 that illustrates an example variation of return losses and transmission responses of balun 104 with respect to signal frequency as part of system 602 in FIG. 9A, in a case where balun 104 converts a single-ended signal at signal terminal 122 to differential signals at signal terminals 126 and 128. Balun 104 may include a metal shield layer, such as metal shield layer 2200 of FIG. 23, that changes the resonant frequency of balun 104. In graph 2500, plot 2502 can represent the return loss at signal terminal 126, and plot 2504 can represent the return loss at signal terminal 128. Also, plot 2506 can represent the amplitude of transmission response from signal terminal 122 to terminal 126, and plot 2508 can represent the amplitude of transmission response from signal terminal 122 to signal terminal 128. Compared with graph 920 of FIG. 9B, in graph 2500 the resonant frequency has been moved out of the signal frequency range of 0-10 GHz. The notches 932 and 934 around 5 GHz are absent from graph 920, and the amplitude jumps 946 and 948 around 5 GHz are also absent from graph 920. As the resonant frequency has been moved, in graph 2500 the amplitude imbalance between signals at signal terminals 126 and 128 within the signal frequency range 3-5 GHz can be reduced compared with graph 900.

In this description, the term "couple" may cover connections, communications or signal paths that enable a functional relationship consistent with this description. For example, if device A provides a signal to control device B to perform an action, then: (a) in a first example, device A is directly electrically coupled to device B; or (b) in a second example, device A is indirectly electrically coupled to device B through intervening component C if intervening component C does not substantially alter the functional relationship between device A and device B, so device B is controlled by device A via the control signal provided by device A.

In this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be electrically coupled to those components to form the described circuitry or device. For example, a structure described herein as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be electrically coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor.

Uses of the phrase "ground voltage potential" in this description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described examples, and other examples are possible, within the scope of the claims.

What is claimed is:

1. An apparatus comprising:
   a first metal layer including a first segment and a second segment, in which the first segment is coupled to a first signal terminal, the second segment has a disconnected end;
   a second metal layer including a third segment and a fourth segment, in which the third segment extends along the first segment, the fourth segment extends along the second segment, a first end of the third segment and a first end of the fourth segment are electrically coupled at a center tap, and a second end of the third segment and a second end of the fourth segment are coupled to a second signal terminal and a third signal terminal;
   a via at the center tap and coupled to a first reference terminal; and
   a device extending along at least one of: a first subsegment of the third segment overlapping at least partially with the first signal terminal or a second subsegment of the fourth segment overlapping at least partially with the disconnected end of the second segment, the device coupled to a second reference terminal.

2. The apparatus of claim 1, wherein the device includes a metal strip on a side of the one of the first or second subsegments.

3. The apparatus of claim 2, further comprising a third metal layer enclosing the first, second, third, and fourth segments;
   wherein the third metal layer is electrically coupled to the first or second reference terminal; and
   wherein the device is coupled between the third metal layer and the one of the first or second subsegments.

4. The apparatus of claim 3, wherein the third metal layer is part of a Faraday cage.

5. The apparatus of claim 3, wherein:
   the via is a first via;

the apparatus further includes a second via external to the first and second metal layers, the second via coupled to the first or second reference terminal; and the metal strip extends from one of the first or second subsegments to the second via.

6. The apparatus of claim 3, wherein the metal strip is a first metal strip on a side of the first subsegment; and wherein the apparatus includes a second metal strip on a side of the second subsegment, the second metal strip coupled to the third metal layer.

7. The apparatus of claim 6, wherein the apparatus includes a third metal strip on a side of the via, the third metal strip coupled to the third metal layer.

8. The apparatus of claim 1, wherein:

the via is a first via;

the apparatus further includes a stack of metal layers including the first and second metal layers, and a third metal layer over or below the second metal layer, the third metal layer electrically coupled to the first or second reference terminal; and the device includes second vias coupled between the third metal layer and the one of the first or second subsegments, the second vias positioned along the one of the first or second subsegments.

9. The apparatus of claim 1, further comprising:

a first metal wire coupled between the second end of the third segment and the first signal terminal;

a second metal wire coupled between the second end of the fourth segment and the second signal terminal;

a first metal shield layer over the first metal wire, in which the first metal shield layer includes first metal teeth extending therefrom and having respective first widths; and a second metal shield layer over the second metal wire, in which the second metal shield layer includes second metal teeth extending therefrom and having respective second widths, the second widths are smaller than the first widths, and the second metal teeth are coupled to the first metal teeth over the first and second metal wires.

10. The apparatus of claim 9, wherein adjacent first metal teeth are separated by a first distance;

wherein adjacent second metal teeth are separated by a second distance; and wherein the first distance is shorter than the second distance.

11. The apparatus of claim 9, further comprising:

a third metal layer over the first and second metal layers;

a fourth metal layer below the first and second metal layers; and vias coupled between the third metal layer and the fourth metal layer, wherein the first and second metal shield layers are part of the third metal layer, and the fourth metal layer is coupled to the first or second reference terminal.

12. The apparatus of claim 1, further comprising a third metal layer over the first and second metal layers, in which the third metal layer is coupled to the first or second reference terminal, wherein the third metal layer includes first metal strips that overlap at least partially with the third segment and second metal strips that overlap at least partially with the fourth segment.

13. The apparatus of claim 12, wherein the third metal layer further includes a third metal strip that overlaps at least partially with: the via; the first and second ends of the third segment; and the first and second ends of the fourth segment.

14. The apparatus of claim 13, wherein:

the first metal strips extend from a first side of the third metal strip; and the second metal strips extend from a second side of the third metal strip, the second side being opposite to the first side.

15. The apparatus of claim 14, further comprising fourth metal strips and fifth metal strips, wherein the fourth metal strips extend from the first side and do not overlap with the third segment, and the fifth metal strips extend from the second side and do not overlap with the fourth segment.

16. The apparatus of claim 12, wherein:

the first metal strips have respective first widths, and adjacent first metal strips are separated by a first distance; and the second metal strips have respective second widths different from the first widths, and adjacent second metal strips are separated by a second distance different from the first distance.

17. The apparatus of claim 12, wherein the third metal layer includes a shield layer, the shield layer being part of a shield structure that surrounds the first, second, third, and fourth segments, the shield structure being adapted to be electrically coupled to the first or second reference terminal; and wherein the first and second metal strips are electrically coupled to the shield layer.

18. The apparatus of claim 1, wherein the first and second metal layers form a stack of metal layers.

19. The apparatus of claim 1, wherein the first and second metal layers, the via, and the device are part of a package of an integrated circuit.

20. The apparatus of claim 1, wherein the first and second metal layers, the via, and the device are on a semiconductor substrate of an integrated circuit.

21. The apparatus of claim 1, wherein the first and second metal layers, the via, and the device are part of a printed circuit board (PCB).

22. The apparatus of claim 1, wherein:

the first segment is configurable to transmit a first signal to the second segment;

the second segment is configurable to transmit the first signal to the disconnected end and transmit a second signal from a reflection of the first signal at the disconnected end;

the third segment is configurable to transmit a third signal responsive to the first signal propagating in the first segment and responsive to a magnetic coupling between the first and third segments;

the fourth segment is configurable to transmit a fourth signal responsive to the second signal propagating in the second segment and responsive to a magnetic coupling between the second and fourth segments; and the device is configurable to adjust at least one of: (a) a first phase relationship between the first signal in the first segment and the third signal in the third segment; or (b) a second phase relationship between the second signal in the second segment and the fourth signal in the fourth segment.

23. The apparatus of claim 22, wherein a length of the first subsegment or the second subsegment is based on a frequency of the first signal.

24. The apparatus of claim 1, wherein the first and second metal layers and the via are part of a balun.

25. The apparatus of claim 1, wherein the first signal terminal is a single-ended signal terminal, and the second and third signal terminals are differential signal terminals.

26. The apparatus of claim 1, wherein the first and second reference terminals are coupled together.

27. An apparatus comprising:

a balun including:

a first metal segment coupled between a first signal terminal and a disconnected end; and a second metal segment coupled between a second signal terminal and a third signal terminal, the second metal segment having a center tap coupled to a first reference terminal; and a device overlapping at least partially with the first signal terminal or the disconnected end but not the second and third signal terminals and coupled to a second reference terminal.

28. The apparatus of claim 27, wherein the device includes at least one of: a metal strip, or a set of vias.

\* \* \* \* \*